United States Patent [19]
Ota et al.

[11] Patent Number: 5,689,339
[45] Date of Patent: Nov. 18, 1997

[54] ALIGNMENT APPARATUS

[75] Inventors: Kazuya Ota; Kouichirou Komatsu, both of Tokyo; Hideo Mizutani; Nobutaka Magome, both of Yokohama, all of Japan

[73] Assignee: Nikon Corporation, Tokyo, Japan

[21] Appl. No.: 506,132

[22] Filed: Jul. 24, 1995

Related U.S. Application Data

[63] Continuation of Ser. No. 325,638, Oct. 19, 1994, abandoned, which is a continuation of Ser. No. 148,537, Nov. 8, 1993, abandoned, which is a continuation of Ser. No. 963,399, Oct. 16, 1992, abandoned.

[30] Foreign Application Priority Data

| Oct. 23, 1991 | [JP] | Japan | 3-275273 |
| Nov. 30, 1991 | [JP] | Japan | 3-342439 |
| Dec. 25, 1991 | [JP] | Japan | 3-343258 |
| Dec. 26, 1991 | [JP] | Japan | 3-345195 |

[51] Int. Cl.$^6$ ..................... G01B 11/00
[52] U.S. Cl. ............ 356/401; 250/548; 356/363
[58] Field of Search ............... 356/399, 400, 356/401, 363; 250/548

[56] References Cited

U.S. PATENT DOCUMENTS

| 4,592,625 | 6/1986 | Uehara et al. | 350/415 |
| 4,632,554 | 12/1986 | Pearce | 356/349 |
| 4,636,077 | 1/1987 | Nomura et al. | 356/356 |
| 4,677,301 | 6/1987 | Tanimoto et al. | 250/548 |
| 4,710,026 | 12/1987 | Magome et al. | 356/349 |
| 4,771,180 | 9/1988 | Nomura et al. | 250/548 |
| 4,803,524 | 2/1989 | Ohno et al. | 355/53 |
| 4,880,310 | 11/1989 | Nishi | 356/401 |
| 4,907,886 | 3/1990 | Dandliker | 356/349 |
| 5,000,573 | 3/1991 | Suzuki et al. | 356/349 |
| 5,004,348 | 4/1991 | Magome | 356/401 |
| 5,070,250 | 12/1991 | Komatsu et al. | 250/548 |
| 5,151,750 | 9/1992 | Magome et al. | 356/401 |
| 5,214,489 | 5/1993 | Mizutani et al. | 356/363 |

*Primary Examiner*—Frank G. Font
*Assistant Examiner*—Robert Kim
*Attorney, Agent, or Firm*—Shapiro and Shapiro

[57] ABSTRACT

In an alignment apparatus for aligning a mask and a photosensitive substrate (a semiconductor wafer or glass plate applied with a photoresist), and which is suitably used in a projection exposure apparatus (a stepper or aligner), a proximity exposure apparatus, or the like used in a lithography process in the manufacture of a semiconductor element or a liquid crystal display element, two first beams and two second beams differing from the first beams may be radiated on a diffraction grating-like mask mark and a diffraction grating-like substrate mark, respectively, with the two second beams passing through a transparent region adjacent to the mask mark. By detecting diffracted light components of the two first beams and detecting diffracted light components of the two second beams, a relative position shift between the mask and the substrate can be determined. The alignment apparatus advantageously can reduce mixing of alignment light from a mask and alignment light from a wafer (substrate) to a minimum degree, or can sufficiently separate signals corresponding to these light components in a signal processing stage even when mixing inevitably occurs.

18 Claims, 25 Drawing Sheets

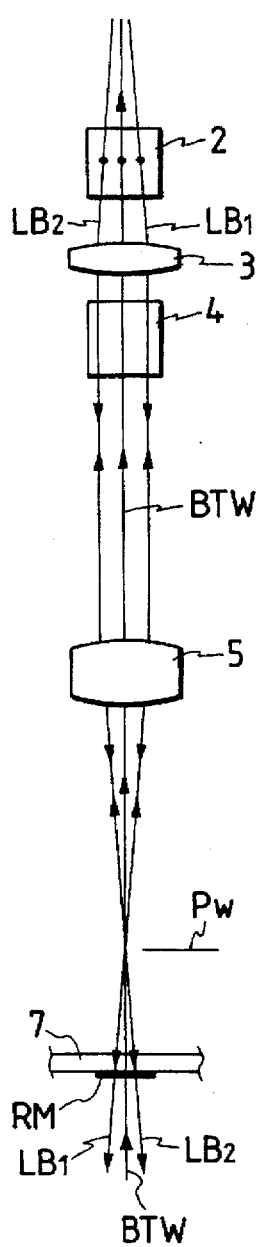
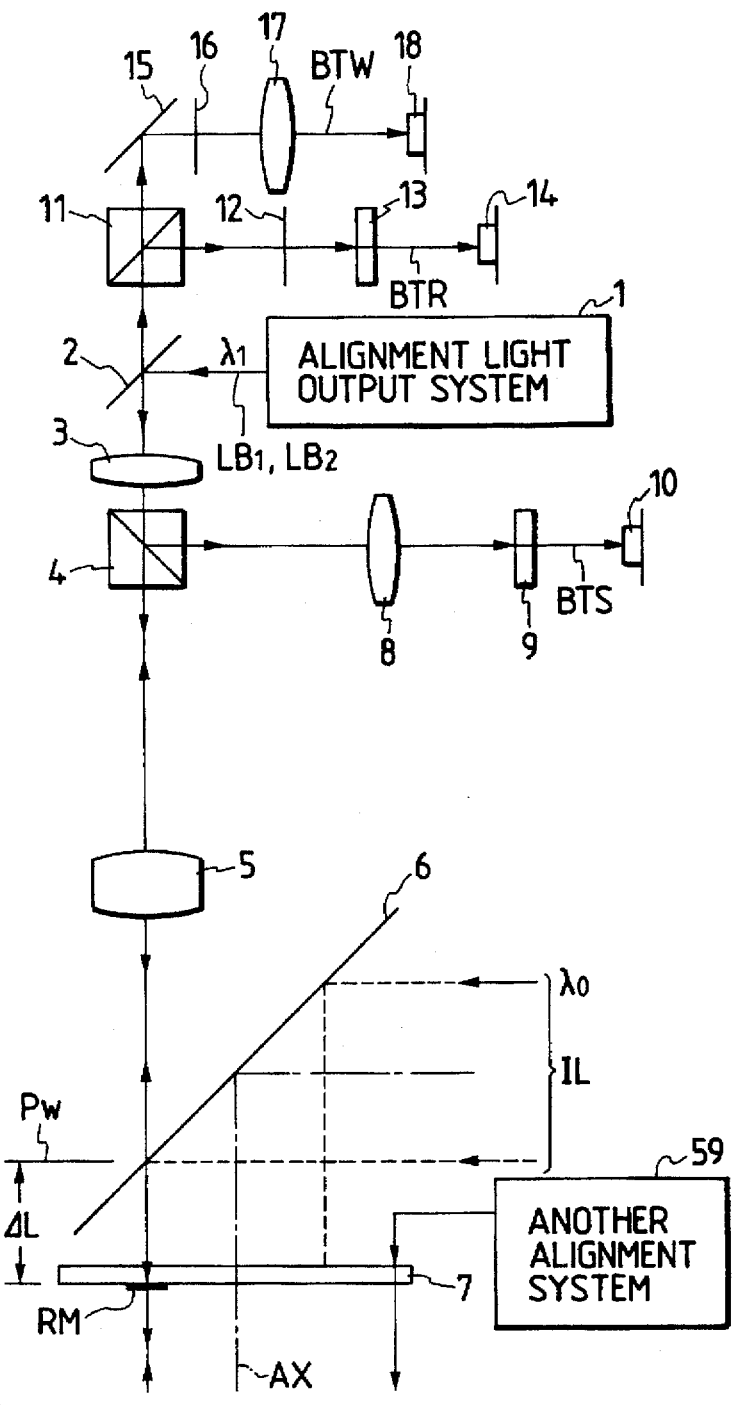
FIG. 1A
FIG. 1B

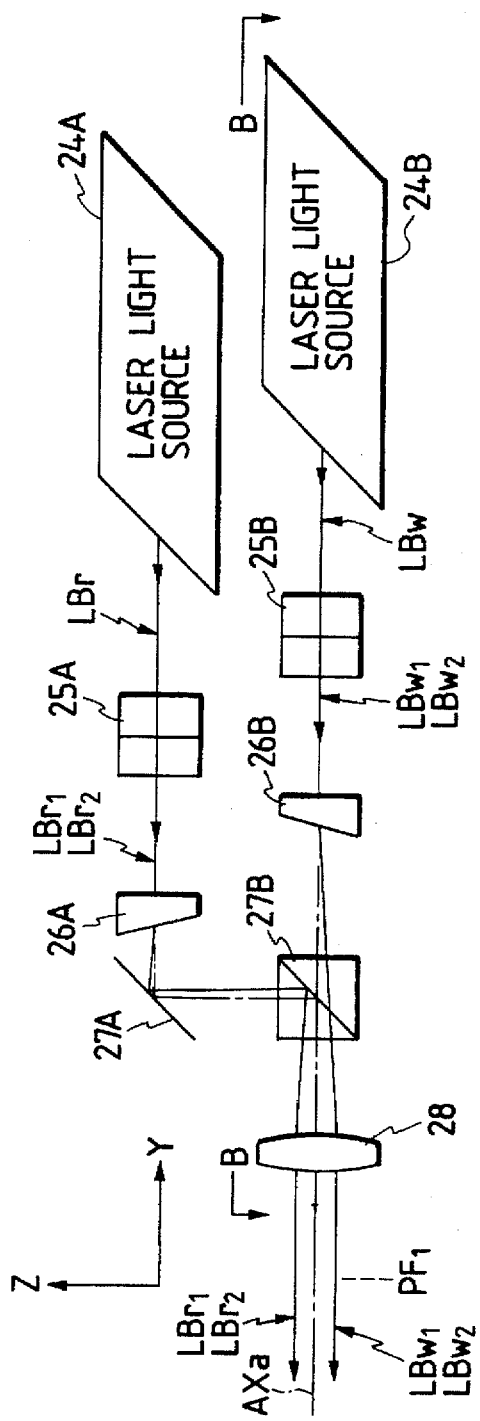
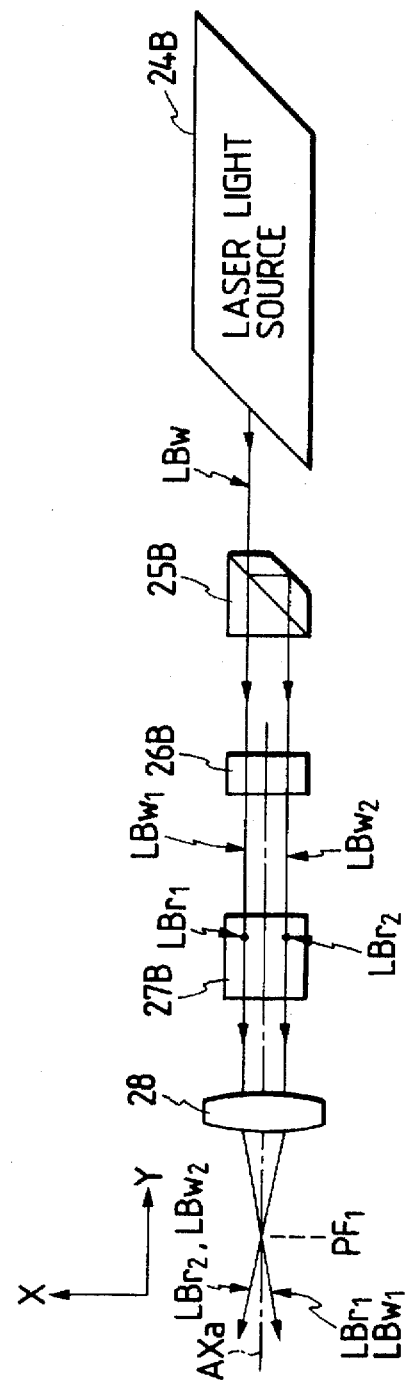
FIG. 11A
FIG. 11B

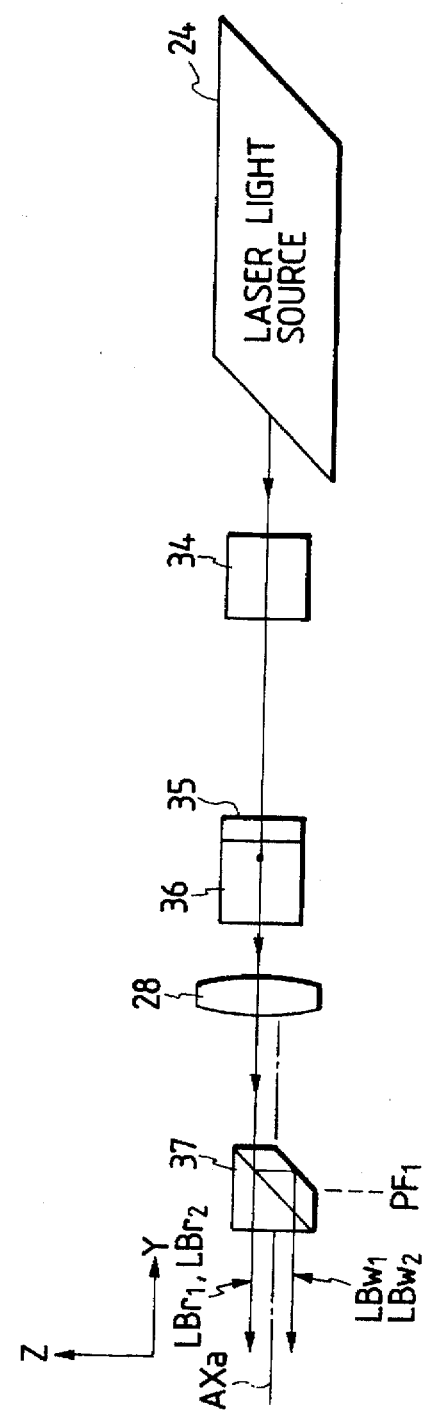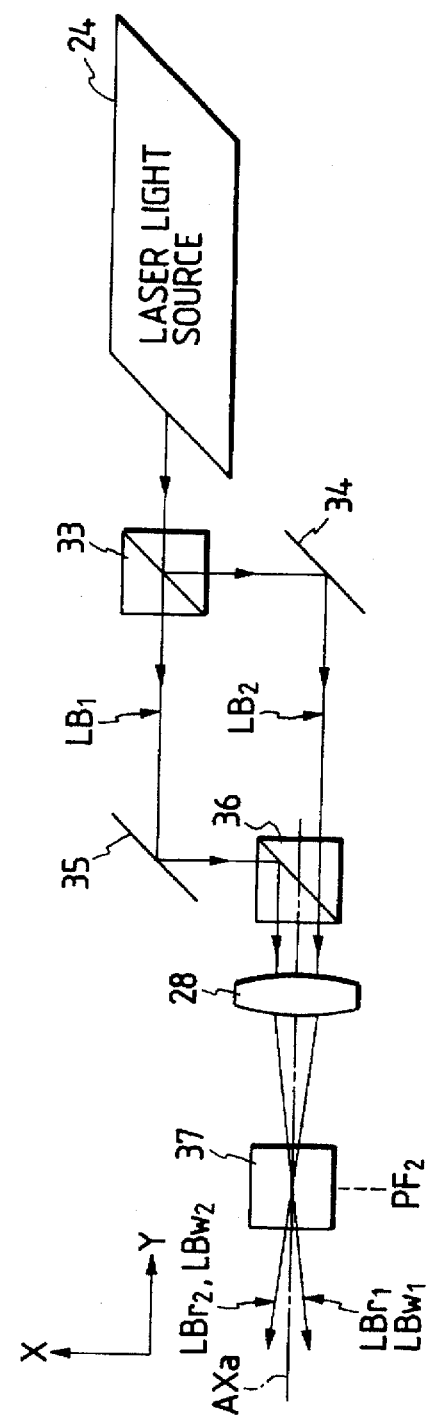
FIG. 12A
FIG. 12B

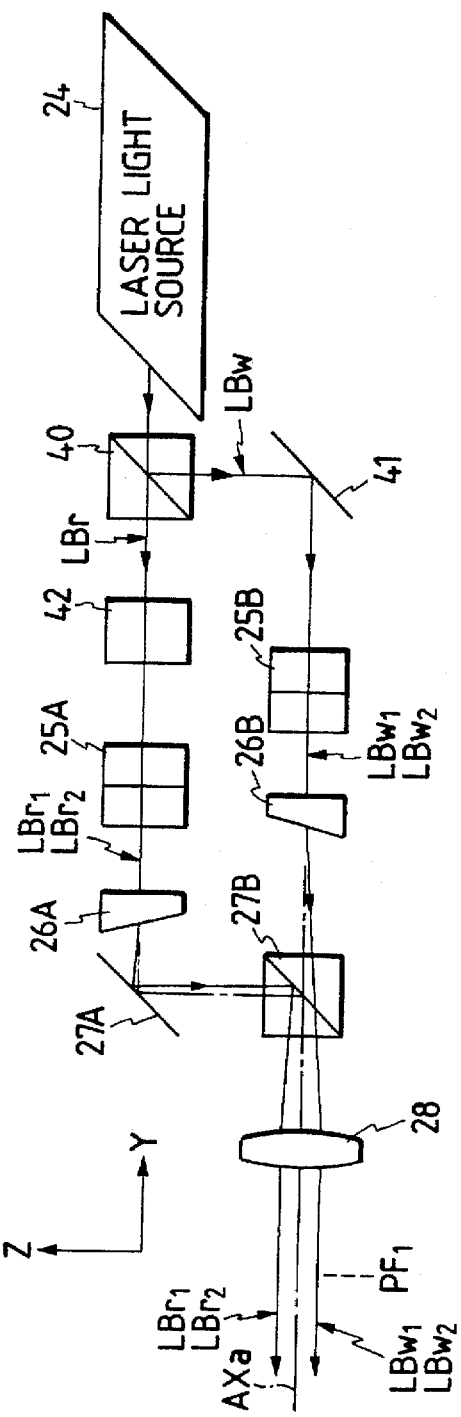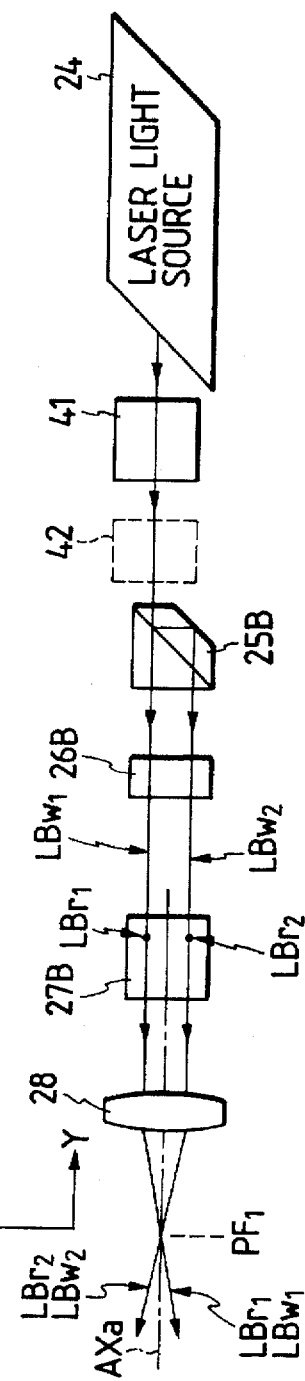
FIG. 14A
FIG. 14B

ALIGNMENT APPARATUS

This is a continuation of application Ser. No. 08/325,638 filed Oct. 19, 1994 now abandoned which is a continuation of application Ser. No. 08/148,537 filed Nov. 8, 1993, now abandoned which is a continuation of application Ser. No. 07/963,399 filed Oct. 16, 1992, all now abandoned.

BACKGROUND OF THE INVENTION

1. Field of the Invention

The present invention relates to an alignment apparatus for aligning a mask and a photosensitive substrate (e.g., a semiconductor wafer coated with a photoresist or a glass plate), which apparatus is suitably used for a projection exposure apparatus (e.g., a stepper or an aligner), a proximity type exposure apparatus, or the like, which is used in a lithography process in the manufacture of a semiconductor element, a liquid crystal display element, or the like.

2. Related Background Art

In a recent lithography process, as an apparatus for transferring a circuit pattern onto a photosensitive substrate with a high resolution, a reduction projection type exposure apparatus (stepper) adopting a step-and-repeat method is popularly used. In a stepper of this type, a system for exposure light of a short wavelength and a high-N.A. projection optical system has been developed. In recent years, the resolution line width on a wafer has reached the sub-micron order (about 0.3 to 0.5 µm).

In order to transfer such a high-resolution pattern, a pattern on a mask or reticle (to be referred to as a reticle hereinafter) and one shot area on a wafer must be aligned with alignment precision (in general, about ⅕ the resolution line width) corresponding to the resolution. As a conventional alignment method for such a stepper, a TTR (Through The Reticle) method for simultaneously detecting an alignment mark formed around a circuit pattern on a reticle and an alignment mark formed around a shot area on a wafer is known.

In an alignment system adopting the TTR method, an alignment mark (reticle mark) on a reticle and an alignment mark (wafer mark) on a wafer are detected with high precision, and a relative position shift amount between these marks is obtained. Then, the reticle or wafer is finely moved to correct the shift amount. In a normal projection exposure apparatus such as a stepper, the chromatic aberration of a projection optical system is satisfactorily corrected for only exposure light (e.g., a g-line, an i-line, excimer laser light, or the like) so as to form a reticle pattern on a wafer with a high resolution. This means that light (alignment light) for illuminating a mark is restricted to have a wavelength equal to or very close to the wavelength of the exposure light in the alignment system of the TTR method.

A resist layer is formed on the surface of a wafer in an exposure process. In an alignment process, the wafer mark is detected through the resist layer. The resist layer may adopt, e.g., a multi-layered resist structure, which has a high absorbency and a low transmittance with respect to exposure light so as to allow formation of a high-resolution pattern. In this case, alignment illumination light is attenuated before it reaches the wafer mark, and light reflected by the mark (regularly reflected light, scattered light, diffracted light, and the like) is also attenuated. For this reason, the wafer mark cannot be recognized with a sufficient light amount by the alignment system, and its detection precision is lowered. Furthermore, when the alignment illumination light is radiated on the wafer mark, the irradiated portion of the resist layer is inevitably exposed. When various processes are performed after development, the mark on the wafer is destroyed, and cannot be used in alignment and exposure processes of the next layer.

In order to solve this problem, U.S. Pat. No. 5,004,348 discloses a method of optically detecting a linear diffraction grating mark formed on a wafer or reticle, and detecting a position on the wafer or reticle with high precision (several to several tens of percent of a pitch) from pitch information of the detected mark on the basis of a double-wavelength alignment system of the TTR method (the wavelength of alignment illumination light is different from that of exposure light) disclosed in, e.g., U.S. Pat. No. 4,880,310. Conventionally, various position detection methods using a diffraction grating mark have been proposed, and put into practical applications. Of these methods, the method disclosed in U.S. Pat. No. 5,004,348 is a method wherein coherent laser beams (parallel light beams) are simultaneously radiated on a diffraction grating mark from two directions so as to form linear interference fringes, and the position of the diffraction grating mark is specified using the interference fringes.

The alignment method using the interference fringes includes a heterodyne method, which gives a predetermined frequency difference to the two laser beams radiated from the two directions, and a homodyne method without such frequency difference. In the homodyne method, still interference fringes are formed to be parallel to the diffraction grating mark, and the diffraction grating mark (object) must be finely moved in its pitch direction in position detection. Thus, the position of the grating mark is obtained with reference to the interference fringes. An alignment system adopting the homodyne method is disclosed in, e.g., U.S. Pat. Nos. 4,636,077 and 4,771,180. In contrast to this, in the heterodyne method, interference fringes move at high speed in its fringe direction (pitch direction) due to the frequency difference (beat frequency) of the two laser beams. Therefore, the position of the grating mark cannot be obtained with reference to the interference fringes, but is obtained with reference to a time factor (phase difference) upon high-speed movement of the interference fringes. An alignment system adopting the heterodyne method is disclosed in, e.g., U.S. Pat. Nos. 4,710,026 and 5,070,250 and Ser. No. 671,109 (Mar. 18, 1991).

FIG. 30 is a schematic perspective view showing an arrangement of a stepper comprising a TTR alignment system. In FIG. 30, alignment illumination light in a wavelength range different from that of exposure light is converted into two laser beams $BM_1$ and $BM_2$ having different frequencies, and including orthogonal linearly polarized light components by a 2-beam frequency shifter (not shown). A dichroic mirror 673 for separating the wavelength of exposure light and that of the two beams $BM_1$ and $BM_2$ is arranged above a reticle 674. A pattern on the reticle 674 is irradiated with exposure light reflected vertically downward by the dichroic mirror 673, and the exposure light reflected by the pattern forms an image on a wafer 675 by a two-side telecentric projection optical system 670.

The chromatic aberration of the projection optical system 670 is corrected for the exposure wavelength, and the projection optical system 670 is arranged, so that the reticle 674 and the wafer 675 are conjugate with each other with respect to the wavelength. A window (transparent portion) RST is formed in a light-shielding band surrounding a pattern area 676 of the reticle 674, and a reticle mark RG is formed on about a half portion of the window RST. On the other hand, a wafer mark WG is formed at a corresponding position in a street line around a shot area SA on the wafer 675.

An objective lens 671 is prepared by integrating a bi-focal element obtained by adhering a plano-convex lens formed of a birefringence material (quartz, calcite, or the like) and a glass plano-concave lens, and a telecentric objective lens. The objective lens 671 gives different powers according to polarized light components (e.g., a polarized light component parallel to the crystallographic axis of the bi-focal element is defined as a p-polarized light component, and a polarized light component perpendicular to the crystallographic axis of the bi-focal element is defined as an s-polarized light component) of the beams $BM_1$ and BM2. Therefore, the beams $BM_1$ and $BM_2$ emerging from the objective lens 671 are reflected by a mirror 672, and, for example, p-polarized light components included in the beams $BM_1$ and $BM_2$ form an image (cross) on the reticle mark RG. On the other hand, after s-polarized beams cross on a focal plane (wafer conjugate plane) above the reticle 674, they form an image (cross) on the wafer mark WG through the window RST and the projection optical system 670 (a pupil plane 670a).

The interval between the focal plane and the lower surface (pattern surface) of the reticle 674 corresponds to the axial chromatic aberration amount of the projection optical system 670 at the reticle side at the wavelength of the two alignment beams. For example, if the exposure wavelength is 248 nm and the alignment wavelength is 633 nm, the axial chromatic aberration amount is as large as about 500 mm although it depends on the optical characteristics of the projection optical system 670.

From the reticle mark RG and the wafer mark WG, ±1st-order diffracted light components are generated. The principal rays of these diffracted light components return coaxially with an optical axis $AX_C$ of the alignment system, and are separated and received by a photoelectric detector through a spatial filter, a field stop, and the like. The photoelectric detector outputs a photoelectric signal of interference light on the reticle side, and a photoelectric signal of interference light on the wafer side (which signals are beat frequencies), and a phase difference on two signal waveforms is obtained with reference to beat signals of reference interference light separately formed from the two output beams. The reticle 674 and the wafer 675 are moved relative to each other, so that the phase difference becomes zero. In this manner, the projection image of the reticle pattern can be caused to precisely coincide with the shot area SA.

However, in the above-mentioned technique, when the chip size (i.e., an illumination field) of a semiconductor element is changed, or when the position of a reticle mark is changed according to another wafer mark, the objective lens 671 and the mirror 672 after the lens 671 must be integrally moved at afocal positions within a plane parallel to the reticle 674 (along the optical axis $AX_C$ in FIG. 30), as disclosed in, e.g., U.S. Pat. No. 4,592,625. For this reason, the apparatus may become unstable due to some cause upon movement of, e.g., the objective lens 671, and the optical axis $AX_C$ of the alignment system may be inclined in the pitch direction (measurement direction) of the reticle mark RG.

A case will be examined below with reference to FIG. 31 wherein the alignment system is inclined. FIG. 31 illustrates in an exaggerated fashion a state wherein the optical axis $AX_C$ is inclined in the pitch direction (X-direction) by $\in$ to have a point $W_O$ in a focal plane (wafer conjugate plane) W' as a center.

As shown in FIG. 31, as for principal rays $L_{1s}$ and $L_{2s}$ of two s-polarized beams for radiating the wafer mark WG, since the optical axis $AX_C$ is merely inclined to have the point $W_O$ as the center, the crossing position of the principal rays $L_{1s}$ and $L_{2s}$ on the wafer will not be shifted in the pitch direction upon inclination. However, as for principal rays $L_{1p}$ and $L_{2p}$ of p-polarized beams for radiating the reticle mark RG, the crossing position of the principal rays $L_{1p}$ and $L_{2p}$ on the reticle 674 is shifted by $\Delta DL_1$ in the X-direction. In other words, the crossing position of the principal rays $L_{1s}$ and $L_{2s}$ and the crossing position of the principal rays $L_{1p}$ and $L_{2p}$ are shifted by $\Delta DL_1$ in the pitch direction. For this reason, detection precision of a relative shift amount between the reticle and wafer is impaired according to the shift amount $\Delta DL_1$, and alignment precision is undesirably lowered accordingly.

When the axial chromatic aberration amount of the projection optical system on the reticle side at the wavelength of the alignment illumination light is represented by $\Delta L$, the shift amount $\Delta DL_1$ is expressed by $\Delta DL_1 = \Delta L \cdot \tan \in$. Therefore, assuming that the axial chromatic aberration amount $\Delta L$ is 500 mm and an allowable value (maximum value) of the shift amount $\Delta DL_1$ is assumed to be 0.05 μm in association with the alignment precision, an allowable angular error (allowable inclination amount) $\in$ in the alignment system is as small as $\in = 0.02"$ from the above equation. This means that the inclination amount of the entire alignment system must be suppressed within 0.02".

However, in consideration of stability of a movable alignment system, an inclination of about 1 to 2" inevitably occurs even when a vibration or a thermal variation is minimized. Therefore, the crossing position of the principal rays $L_{1p}$ and $L_{2p}$ is shifted by at least 2.5 μm on the reticle, i.e., by about 0.5 μm on the wafer (when the projection magnification of a projection lens is ×⅕). For this reason, even a high-resolution alignment system having a practical measurement resolution of about 0.01 μm even under the influence of, e.g., noise loses its significance in a practical application. A decrease in alignment precision can be caused not only by inclination due to a vibration of the alignment system, but also, e.g., drifts of the beams $BM_1$ and $BM_2$ due to a change in position of a pair of resonance mirrors arranged in a laser light source.

For example, when the objective lens 671 (only the telecentric objective lens) is decentered from the optical axis $AX_C$ (or an optical axis AX') of the alignment system, the crossing position of the principal rays $L_{1s}$ and $L_{2s}$ on the wafer (conjugate plane W') and the crossing position of the principal rays $L_{1p}$ and $L_{2p}$ on the reticle are shifted by $\Delta DL_2$ in the X-direction (pitch direction), as shown in FIG. 32, and this shift amount $\Delta DL_2$ directly appears as an alignment error. Therefore, in the alignment system using illumination light in a wavelength range different from the exposure wavelength, when the alignment beams are inclined in the measurement direction (pitch direction) of the alignment mark due to inclination of the optical system, decentering of an optical member, and the like, the alignment precision is considerably lowered by the axial chromatic aberration amount $\Delta L$.

As an alignment apparatus which can prevent a decrease in alignment precision due to instability (inclination, decentering of an optical member, and the like) of an alignment system, an apparatus having an arrangement shown in, e.g., FIGS. 1A and 1B is proposed, and has already been filed in Ser. No. 687,944 (Apr. 19, 1991). FIGS. 1A and 1B show a schematic arrangement of a TTR alignment system of a projection exposure apparatus. In FIGS. 1A and 1B, a projection optical system below a reticle 7, a wafer, and the like are not shown. FIG. 1B illustrates only an optical axis AX of the projection optical system.

As shown in FIG. 1B, a dichroic mirror 6 inclined at 45° is arranged above the reticle 7. Exposure illumination light IL (wavelength $\lambda_0$) is incident on the dichroic mirror 6 from the horizontal direction, is perpendicularly reflected by the mirror 6 in the vertical direction, and is radiated on only a pattern area of the reticle 7. The dichroic mirror 6 has a reflectance of 90% or more for the wavelength $\lambda_0$ of the exposure light IL, and has a transmittance of 50% or more for alignment illumination light having a wavelength $\lambda_1$ sufficiently longer than the wavelength $\lambda_1$. As the exposure light IL, a g-line ($\lambda_0$=436 nm) or an i-line ($\lambda_0$=365 nm) of a mercury lamp, KrF excimer laser light ($\lambda_0$=248 nm), or the like is used. On the other hand, as the alignment illumination light, He—Ne laser light ($\lambda_1$=633 nm), or the like is used in consideration of non-photosensitive characteristics and low absorbency with respect to a resist on a wafer.

A light output system 1 for outputting the alignment illumination light generates two laser beams $LB_1$ and $LB_2$, which are split at substantially the same intensity. The two beams $LB_1$ and $LB_2$ are reflected by a beam splitter 2, and then reach a mark area RM on the reticle 7 via a lens system 3, a beam splitter 4, an objective lens 5, and the dichroic mirror 6. In FIG. 1B, the two beams $LB_1$ and $LB_2$ are located in a direction perpendicular to the plane of drawing, and the state of these beams is illustrated in FIG. 1A.

FIG. 1A is a view when the arrangement shown in FIG. 1B is viewed from the left side in the plane of drawing. The beams $LB_1$ and $LB_2$ reflected by the beam splitter 2 and transmitted through the lens system 3 propagate parallel to each other and are symmetrical about the optical axis of the objective lens 5. The two beams $LB_1$ and $LB_2$ emerging from the objective lens 5 cross on a plane $P_w$ in a space above the reticle 7, and thereafter, are radiated on the mark area RM of the reticle 7 while diverging again.

In FIG. 1A, the two beams $LB_1$ and $LB_2$ are illustrated as solid lines. However, in a pupil space (Fourier transform area) between the lens system 3 and the objective lens 5, the two beams $LB_1$ and $LB_2$ are convergent scattering beams, and in an image space (inverse Fourier transform area) between the objective lens 5 and the projection optical system, the two beams are collimated beams. As shown in FIG. 1B, the optical axis of the objective lens 5 is parallel to the optical axis AX of the projection optical system at the position of the reticle 7.

The two beams $LB_1$ and $LB_2$ are set to cross on the plane $P_w$. This is to cope with an axial chromatic aberration (vertical chromatic aberration) amount $\Delta L$ of the projection optical system. Therefore, at the wavelength $\lambda_1$ (e.g., 633 nm) of the alignment illumination light, the plane $P_w$ and the wafer surface are conjugate with each other with respect to the projection optical system. For this reason, the two beams $LB_1$ and $LB_2$ passing through a transparent portion (window) of the mark area RM of the reticle 7 converge to beam waists near a pupil plane (Fourier transform plane) in the projection optical system, and thereafter, become two collimated beams crossing on the wafer.

FIG. 2 is a plan view of the mark area RM. In FIG. 2, the two beams $LB_1$ and $LB_2$ are separated in a mark position measurement direction (arrow MD) on the reticle 7, and diffraction grating marks $RM_a$ and $RM_b$ having a pitch in the measurement direction are provided in the radiation areas of the two beams. A light-shielding area formed of, e.g., chromium is present around the marks $RM_a$ and $RM_b$, and a window RW for allowing the beams $LB_1$ and $LB_2$ to partially pass therethrough toward the wafer side is formed in the light-shielding area in a direction perpendicular to the pitch direction of the marks. A diffraction grating mark WM formed on a wafer is located immediately below the light-shielding area between the window RM and the marks $RM_a$ and $RM_b$, as shown in FIG. 2, in a state wherein the reticle and the wafer are aligned with each other. Therefore, even when an exposure process is executed in this state, the mark WM on the wafer is protected without being irradiated with the exposure light IL passing through the window RW.

Meanwhile, the projection optical system has an amount $\Delta\beta$ of chromatic aberration of magnification (horizontal chromatic aberration) with respect to the wavelength $\lambda_1$ of the two alignment beams $LB_1$ and $LB_2$. For this reason, the beams $LB_1$ and $LB_2$ passing through the window RW radiate the mark WM so as to cross on the wafer. The pitch direction of the mark WM coincides with the measurement direction MD. When the two beams $LB_1$ and $LB_2$ symmetrically inclined in the pitch direction simultaneously radiate an area Am including the mark WM, interference light (interference beam) BTW of ±1st-order diffracted light is generated from the mark WM in the vertical direction. The interference beam BTW converges to form a spot at the center (a point along the optical axis AX) of the pupil plane of the projection optical system, and thereafter, returns as a substantially collimated beam to the central portion in the window RW of the reticle 7.

As shown in FIGS. 1A and 1B, the interference beam BTW from the mark WM propagates parallel to the optical axis of the objective lens 5 of the alignment system, and reaches an aperture (or a slit) 16 via the beam splitter 4, the lens system 3, the beam splitter 2, a beam splitter 11, and a mirror 15. The aperture 16 is arranged to be conjugate with the reticle 7 (mark area RM) in association with a composite system of the objective lens 5 and the lens system 3, and allows only the interference beam BTW (collimated beam at this position) to pass therethrough. The interference beam BTW is focused by a lens system 17, and is received by a photoelectric detector 18.

On the other hand, 1st-order diffracted light propagating in a direction opposite to the direction of the beam $LB_1$ is generated from the mark $RM_a$ of the reticle 7 upon radiation of the beam $LB_1$, and 1st-order diffracted light propagating in a direction opposite to the direction of the beam $LB_2$ is generated from the mark $RM_b$ upon radiation of the beam $LB_2$. These 1st-order diffracted light components reach the beam splitter 11 via the objective lens 5, the beam splitter 4, the lens system 3, and the beam splitter 2, are reflected by the beam splitter 11, and then reach an aperture (or a slit) 12. The aperture 12 is arranged to be conjugate with the reticle 7 (mark area RM) in association with a composite system of the objective lens 5 and the lens system 3, and has an opening portion for allowing only the 1st-order diffracted light components from the marks $RM_a$ and $RM_b$ to pass therethrough. The two 1st-order diffracted light components passing through the aperture 12 cross on a monitor grating plate 13 arranged to be conjugate with the plane $P_w$. A transmission type diffraction grating is formed on the monitor grating plate 13. Of diffracted light components re-diffracted by the diffraction grating, diffracted light components of specific two orders interfere with each other as coaxial light components, and are received by a photoelectric detector 14 as an interference beam BTR. When the pitch of the marks $RM_a$ and $RM_b$ on the reticle 7 is represented by $P_{gr}$, the pitch of the mark WM of the wafer is represented by $P_{gw}$, and the magnification of the projection optical system is represented by m (m=5 for a ×⅕ reduction projection optical system), the relationship between the pitches is determined as follows:

$P_{gr}=m\cdot P_{gw}/2$

More specifically, the reticle and the wafer have a double-pitch relationship therebetween. When the incident angle of the two beams $LB_1$ and $LB_2$ on the marks $RM_a$ and $RM_b$ is represented by $\theta_r$, an incident angle $\theta_w$ on the wafer mark WM is expressed by $\theta_w=m\cdot\theta_r$. Therefore, when the pitch $P_{gw}$ is set to generate the interference beam BTW of ±1st-order diffracted light components from the wafer mark WM in the vertical direction, the 1st-order diffracted light components from the marks $RM_a$ and $RM_b$ of the reticle spontaneously propagate in the opposite direction along the optical paths of the beams $LB_1$ and $LB_2$.

Assuming that the two beams $LB_1$ and $LB_2$ from the light output system 1 are coherent beams (in the same polarized state), interference fringes at a predetermined pitch ($P_{gw}/2$ in practice) appear on the wafer mark WM upon crossing of the two beams $LB_1$ and $LB_2$. When a wafer stage (not shown) is finely moved at an equal speed to move the wafer mark WM in the pitch direction with respect to the interference fringes, a photoelectric signal $S_w$ having a sine waveform (FIG. 3) is obtained from the photoelectric detector 18. One period of the signal $S_w$ corresponds to a moving amount of the mark WM by one pitch of the interference fringes, i.e., $P_{gw}/2$.

In FIG. 3, the moving position of the mark WM is plotted along the abscissa, and the intensity of the photoelectric signal is plotted along the ordinate. In alignment, the mark WM (wafer stage) is preliminarily scanned to obtain peak and bottom values of the signal $S_w$, and a slice level $V_s$ is set at an intermediate value between the peak and bottom values. Thus, crossing point positions (zero-crossing points) between the slice level $V_s$ and the signal $S_w$ may be obtained, or the wafer stage may be aligned, so that the signal $S_w$ coincides with the slice level $V_s$. For this purpose, a laser interference type length meter may be provided to the wafer stage, and the level of the signal $S_w$ may be fetched in a memory by digital sampling in response to up-down pulses (at, e.g., every 0.01 µm) from the length meter. In this case, if data corresponding to half a period of the signal $S_w$ is used in alignment, the coordinate position of the wafer mark WM must be obtained in advance within a range of $\pm P_{gw}/4$.

For this purpose, as shown in FIG. 1B, another alignment system 59 for observing the mark WM on the wafer via the reticle 7 and the projection optical system is arranged. After the position of the mark WM is detected within the range of $\pm P_{gw}/4$ by the alignment system 59, precision alignment using the signal $S_w$ is started in the TTR alignment system via the objective lens 5. Note that the alignment system 59 may adopt a method of detecting a wafer mark via only the projection optical system (U.S. Pat. No. 4,677,301) or a method of solely detecting a mark by an off-axis system arranged in addition to the projection optical system.

Alignment of the reticle 7 is performed in a similar manner. More specifically, when the reticle 7 is finely moved to move the marks $RM_a$ and $RM_b$ of the reticle in the pitch direction, the same signal $S_m$ as that in FIG. 3 is output from the photoelectric detector 14. As for the reticle side, interference fringes are formed not on the marks $RM_a$ and $RM_b$ but on the monitor grating plate 13 upon interference of ±1st-order diffracted light components from the marks, and the interference fringes move in the pitch direction upon fine movement of the reticle 7. Therefore, reticle alignment can be attained by aligning a reticle stage (not shown), so that the signal $S_m$ from the photoelectric detector 14 has a predetermined level (e.g., $V_s$).

The above-mentioned TTR alignment system adopts the so-called homodyne method of two-beam interference type alignment methods. As another method, the heterodyne method in which the two beams $LB_1$ and $LB_2$ output from the light output system 1 have a predetermined frequency difference Δf therebetween may be adopted. Since the arrangement adopting the heterodyne method is described in, e.g., U.S. Pat. No. 4,710,026, Ser. No. 892,700 (May 29, 1992), Ser. No. 505,504 (Apr. 6, 1990), and the like in addition to Ser. No. 687,944 (Apr. 19, 1991), a detailed description of the arrangement will be omitted here.

The frequency difference Δf between the two beams $LB_1$ and $LB_2$ is set to be a value that the photoelectric detectors 14 and 18 can satisfactorily respond to a sinusoidal change in light intensity, e.g., 100 kHz or less. In the heterodyne method, as shown in FIG. 1B, the beams $LB_1$ and $LB_2$ from the light output system 1 are partially split at the position of the beam splitter 4 in the optical path of the alignment system, and are guided toward a lens system (inverse Fourier transform) 8. Furthermore, the lens system 8 causes the two beams to cross on a transmitting reference grating plate 9, and an interference beam BTS of ±1st-order diffracted light components generated from the reference grating plate 9 is received by a photoelectric detector 10.

The photoelectric detector 10 outputs a reference signal $S_R$ for the frequency difference Δf.

When the heterodyne method is adopted, as described above, the intensities of the interference beam BTW obtained from the wafer mark WM, the interference beam BTR generated by the reticle marks $RM_a$ and $RM_b$ and the monitor grating plate 13, and the interference beam BTS from the reference grating plate 9 sinusoidally change to have the frequency difference Δf even when the corresponding marks stand still. For this reason, as shown in FIG. 4, a phase difference $\Delta\phi_M$ between the signal $S_m$ (broken curve) from the photoelectric detector 14 and the reference signal $S_R$, and a phase difference $\Delta\phi_W$ between the signal $S_w$ from the photoelectric detector 18 and the reference signal $S_R$ are obtained, and a difference ($\Delta\phi_M/2-\Delta\phi_W$) between these phase differences is calculated, thereby obtaining the position shift amount between the reticle and the wafer in the measurement direction MD. In this case, the phase differences $\Delta\phi_M$ and $\Delta\phi_W$ are measured within a range of ±180°, and this range corresponds to the range of ±¼ of the pitch of the wafer mark WM or the reticle marks $RM_a$ and $RM_b$. Therefore, if the pitch $P_{gw}$ of the wafer mark WM is 4 µm, and a phase measurement resolution with stable reproducibility is 0.5°, the detection resolution of the position shift amount is as high as 0.0028 µm (2.8 nm).

However, in the above-mentioned alignment system, each of the two beams $LB_1$ and $LB_2$ has a relatively large spot size so as to radiate the corresponding marks $RM_a$ and $RM_b$ on the reticle 7, and to cause them to partially pass through the window RW. For this reason, even when it is tried to extract only necessary return light by the apertures 12 and 16 of the light-receiving system, it is difficult to completely separate and receive the beams. In addition, some light components of the interference beam BTW from the wafer mark WM, which beam passes through the window RW, are diffracted by the edge portion of the window RW, or portions of the reticle marks $RM_a$ and $RM_b$, and leak to the light-receiving system (the photoelectric detector 14, the monitor grating plate 13, and the like) on the reticle side.

When a new mark is formed adjacent to the mark WM on the wafer in the mark arrangement shown in FIG. 2, the new mark to be formed is located on the reticle within the radiation area of the beam $LB_1$ or $LB_2$ in FIG. 2 and at a position neighboring the mark WM in the measurement direction MD. At this time, diffracted light is generated as stray light from the new mark on the reticle. This stray light is mixed in the light-receiving system (12, 13, 14) on the reticle side, and the light-receiving system (16, 17, 18) on the wafer side, and may cause a detection error in alignment (position shift detection).

When the axial chromatic aberration amount and the amount of chromatic aberration of magnification are large at the alignment wavelength, the window RW of the reticle serves as an aperture stop for the two beams, and has a function of focusing the beams. More specifically, the two beams are radiated on the wafer mark not as collimated beams but as convergent beams, and are radiated on a portion other than the wafer mark. In order to prevent a decrease in alignment precision due to mixing of light from the portion other than the mark, the size of the wafer mark must be increased in correspondence with the convergence of the beams. However, the wafer mark is formed on a cutting margin portion (so-called scribe line) used when a chip is cut from the wafer. Therefore, the number of chips per wafer can be increased as the width of the scribe line is decreased as much as possible. For this reason, the width of the scribe line is required to be decreased, and it is difficult to increase the size of the wafer mark in correspondence with the convergence of the beams.

SUMMARY OF THE INVENTION

The present invention has been made in consideration of the above situation, and has as its first object to provide an alignment apparatus, which can substantially prevent mixing of alignment light from a mask and alignment light from a wafer (substrate), or can satisfactorily separate signals corresponding to these alignment light components in signal processing even when mixing inevitably occurs. It is the second object of the present invention to provide an alignment apparatus, which can prevent a decrease in alignment precision due to instability (inclination, decentering of an optical member, or the like) of an alignment system.

In order to achieve the above objects, according to a first aspect of the invention, an area (RW) capable of transmitting an alignment beam therethrough is provided to the mask (reticle) side at a position near grating marks ($RM_a$, $RM_b$) of the mask side, and as alignment beam radiation means, a first beam output system (19A; 25A, 26A, 27A, 27B; 37; 40, 42, 25A, 26A, 27A, 27B; 40, 33R–36R, 38R, 39R, 26A, 27A) for forming two first beams ($LB_{r1}$, $LB_{r2}$) for radiating mask marks at a predetermined crossing angle, and a second beam output system (19A; 25B, 26B, 27B; 37; 40, 41, 25B, 26B, 27B; 40, 33W–26W, 38W, 39W, 26B, 27B) for forming two second beams ($LB_{w1}$, $LB_{w2}$) for radiating a substrate mark (WM) at a predetermined crossing angle through the transparent area (RW) of the mask are arranged. Furthermore, an objective optical system (3–5) for outputting the four beams toward the mask, so that the radiation areas of the two first beams ($LB_{r1}$, $LB_{r2}$) and the two second beams ($LB_{w1}$, $LB_{w2}$) on the mask are separated in a direction perpendicular to the grating pitch direction of the mark, is arranged.

In the first aspect described above, the radiation positions, on the mask, of the two first beams for radiating the mask marks ($RM_a$ and $RM_b$) are separated from the transmission positions, on the mask, of the two second beams for radiating the substrate mark (WM). For this reason, the influence of mixing, mutual interference, and the like between the mask-side beams and the substrate-side beams can be remarkably eliminated as compared to the conventional apparatus. The two first beams and the two second beams are output from the single objective optical system. For this reason, even when the objective optical system moves, the behaviors of the beams coincide with each other, and a position shift caused by the beam movements can be canceled. In this respect, a merit equivalent to that obtained when the beams are not separated can be obtained.

According to a second aspect of the invention, an objective optical system (505–507) for outputting two beams, so that the two beams cross on a substrate mark, and are separated on mask marks, is provided, and a first reference mark (513) is arranged in a plane substantially conjugate with the substrate mark.

Furthermore, first means (511, 512, 517–520) for photoelectrically detecting interference light of diffracted light components generated from the substrate mark in substantially the same direction, second means (511–516) for radiating diffracted light components of the two beams by the mask marks onto the first reference mark through the objective optical system to cause the diffracted light components to interfere with each other, and photoelectrically detecting the interference light, and third means (508–510) for radiating some light components of the two beams, split by a beam splitter (506), onto a second reference mark (509) to cause diffracted light components generated from the mark to interfere with each other, and photoelectrically detecting the interference light are provided. In addition, the first reference mark (513) and the second reference mark (509) are integrally held by a holding member (PT).

In the second aspect described above, the first and second reference marks, which directly influence the measurement precision, are integrally fixed to the holding member. For this reason, a decrease in alignment precision caused by, e.g., a position shift due to a vibration, a thermal variation, and the like, can be prevented.

Furthermore, according to a third aspect of the invention, an objective optical system (507) for outputting two beams, so that the two beams cross on a substrate mark, and are separated on mask marks, is provided, and a reference mark (513) is arranged in a plane substantially conjugate with the substrate mark. A first aperture member (517) is arranged in a plane substantially conjugate with the substrate mark, and a second aperture member (512) is arranged in a plane substantially conjugate with the mask marks. Furthermore, first means (518–520) for photoelectrically detecting interference light of diffracted light components generated from the substrate mark in substantially the same direction through the objective optical system and the first and second aperture members, and second means (514–516) for radiating diffracted light components of the two beams by the mask marks onto the reference mark (513) through the objective optical system and the second aperture member, causing the diffracted light components generated from the marks in substantially the same direction to interfere with each other, and photoelectrically detecting the interference light are provided.

In the third aspect of the invention described above, since the first aperture member is arranged in the plane substantially conjugate with the substrate mark, and the second aperture member is arranged in the plane substantially conjugate with the mask mark, only diffracted light components generated by the substrate mark become incident on the first means, and only diffracted light components generated by the mask marks become incident on the second means, i.e., are radiated on the reference mark. For this reason, the two beams are separately radiated on the mask marks. In this case, light (noise components) which may be generated from a portion other than the mask marks due to the convergence of the beams can be prevented from being mixed in the first and second means, and the alignment precision between the mask and the substrate can be improved.

BRIEF DESCRIPTION OF THE DRAWINGS

FIGS. 1A and 1B are schematic charts showing an arrangement of a conventional two-beam interference type alignment system;

FIGS. 11A and 11B are charts showing an arrangement of a beam output system according to the second embodiment of the present invention;

FIGS. 12A and 12B are charts showing an arrangement of a beam output system according to the third embodiment of the present invention;

FIGS. 14A and 14B are charts showing an arrangement of a beam output system according to the fifth embodiment of the present invention;

DESCRIPTION OF THE PREFERRED EMBODIMENTS

Figure 5:
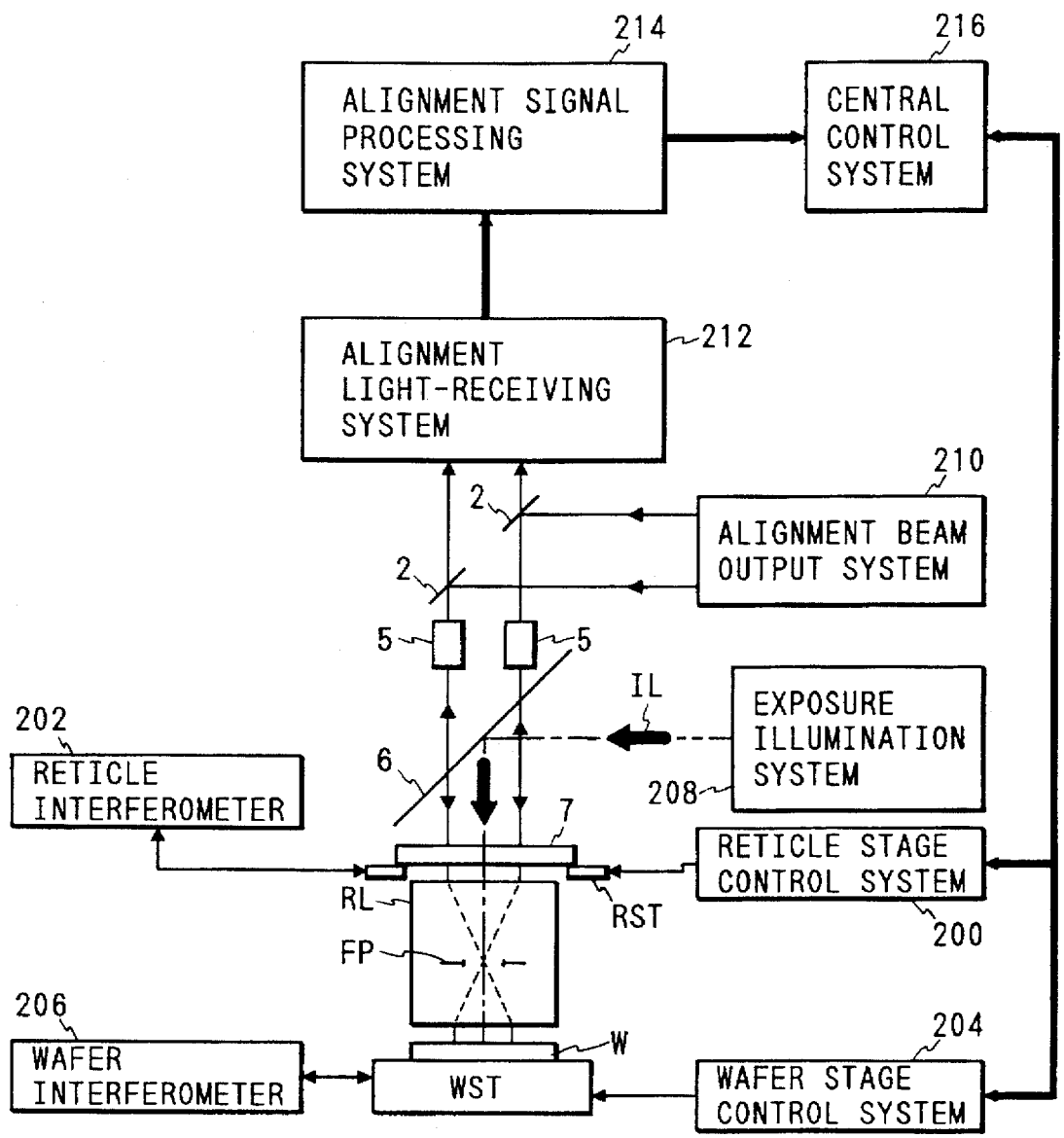
FIG. 5 is a diagram showing the arrangement of the overall projection exposure apparatus which adopts the first embodiment of the present invention.

The arrangement of the overall projection exposure apparatus adopting the present invention will be described below with reference to FIG. 5. Referring to FIG. 5, a reticle 7 having a circuit pattern and alignment marks is held on a reticle stage RST, which is two-dimensionally movable in the X- and Y-directions, and the θ direction. The reticle stage RST is driven by a reticle stage control system 200 including a motor, and the like so as to position the reticle 7 in the apparatus, and to perform alignment between the reticle 7 and a wafer W. A reticle interferometer 202 is arranged to detect the moving position of the reticle stage RST in the X-Y plane (a plane perpendicular to an optical axis AX of a projection optical system). The reticle interferometer 202 measures the moving position in the X- and Y-directions, and a displacement amount in the θ direction (a rotation amount in the X-Y plane).

On the other hand, the wafer W is held on a two-dimensionally movable wafer stage WST, and is moved in the X-Y plane perpendicular to the optical axis AX of a reduction projection optical system PL as a projection optical system. The driving operation of the wafer stage WST is controlled by a wafer stage control system 204 including a motor, and the like, and the position of the wafer stage WST is measured by a wafer interferometer 206. Note that the projection optical system PL is a two-side telecentric system (a system in which both the exit and entrance pupils are located at substantially infinity positions), in which a chromatic aberration is satisfactorily corrected with respect to a wavelength $\lambda_0$ of illumination light IL from an exposure illumination system 208. For this reason, a principal ray passing the central point (a point along the optical axis AX) on a pupil plane (Fourier transform plane) FP of the projection optical system PL becomes almost parallel to the optical axis AX on the reticle 7 side and on the wafer W side. Under the exposure wavelength $\lambda_0$, the pattern surface of the reticle 7 and the surface of the wafer W are conjugate with each other in association with the projection optical system PL.

As for an alignment system, a plurality of sets (two sets in FIG. 5) of alignment optical systems each including an objective lens 5, a beam splitter 2, and the like are arranged above a dichroic mirror 6 so as to guide alignment beams from an alignment beam output system 210 toward the objective lenses 5 of the alignment optical systems. An alignment light-receiving system 212 is a system for photoelectrically detecting diffracted light (interference light) from reticle marks or a wafer mark through the objective lenses 5, and includes a monitor grating plate, a photoelectric conversion element, and the like. An alignment signal processing system 214 processes various photoelectrically detected signals, calculates the positions of the reticle marks and the wafer mark or a position shift amount between these marks, and outputs the calculation result to a central control system 216. The central control system 216 has a microcomputer or a mini computer, and systematically controls communications, sequences, parameter setting processing, error processing, and the like with various control systems.

Figure 6A:
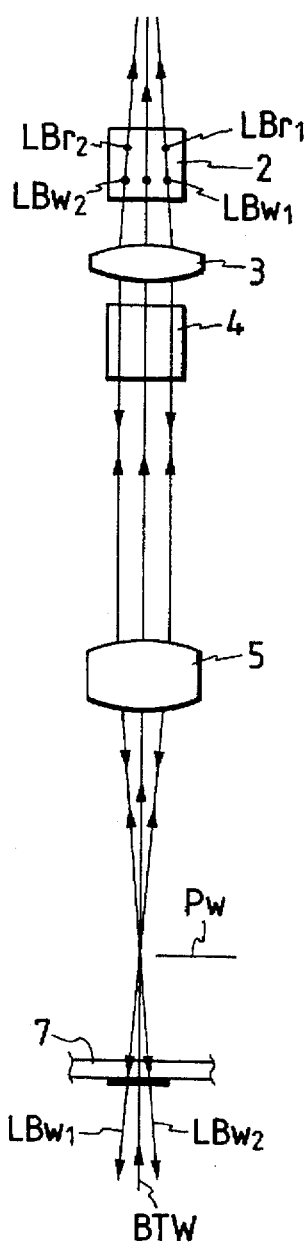
FIGS. 6A and 6B are diagrams showing the arrangement of the overall alignment system according to the first embodiment.

The arrangement of the alignment system according to the first embodiment of the present invention will be described below with reference to FIGS. 6A and 6B, and FIGS. 7 and 8. In the first embodiment, two beams for respectively radiating reticle marks $RM_a$ and $RM_b$, and two beams for radiating a wafer mark WM through a window RW are separated from each other in an image space on the basis of the mark arrangement on the reticle shown in FIG. 2. For this purpose, in FIG. 6A, the alignment beam output system 210 outputs two beams $LB_{r1}$ and $LB_{r2}$ for the reticle marks, and two beams $LB_{w1}$ and $LB_{w2}$ for the wafer mark. As shown in FIG. 6A, the two beams $LB_{r1}$ and $LB_{r2}$ are reflected by the upper half portion of the beam splitter 2, cross once on a plane $P_w$ via a lens system 3, a beam splitter 4, and the objective lens 5, and thereafter, radiate the reticle marks $RM_a$ and $RM_b$ on the reticle 7.

Figure 6B:
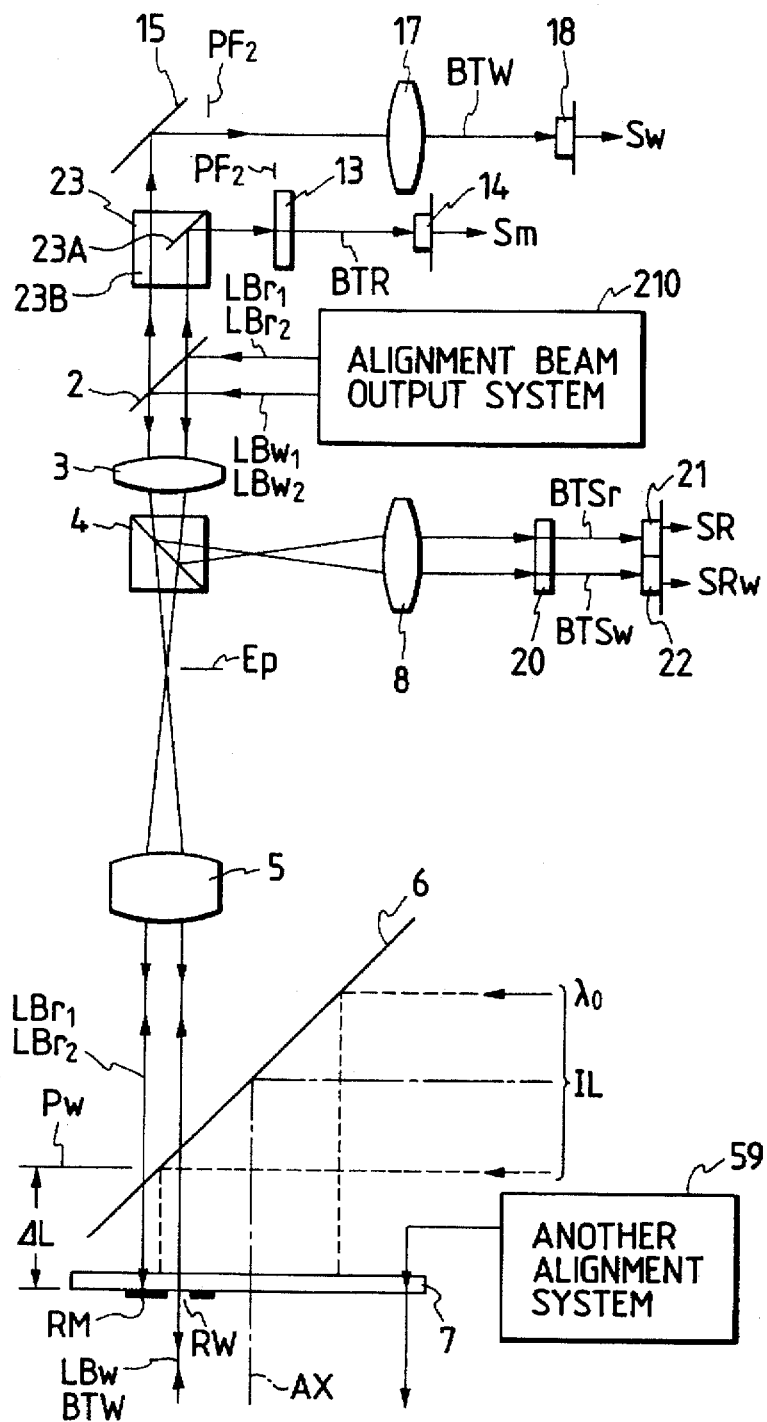

As shown in FIG. 6B, the two beams $LB_{r1}$ and $LB_{r2}$ are set to propagate along inclined optical paths at the position of a front-side focal plane (a plane conjugate with the pupil plane FP of the projection optical system PL) Ep, and to have central lines (equally two-dividing lines of the two beams $LB_{r1}$ and $LB_{r2}$) parallel to the optical axis of the objective lens 5 at positions decentered from the optical axis when the beams $LB_{r1}$ and $LB_{r2}$ emerge from the objective lens 53. On the other hand, as shown in FIG. 6A, the two beams $LB_{w1}$ and $LB_{w2}$ from the beam output system 210 are reflected by the lower half portion of the beam splitter 2, similarly cross once on the plane $P_w$ via the lens system 3, the beam splitter 4, and the objective lens 5, and thereafter, reach the mark WM through the window RW on the reticle. The two beams $LB_{w1}$ and $LB_{w2}$ obliquely pass through the focal plane Ep when viewed from the direction of FIG. 6B, and propagate parallel to each other to be separated from the two beams $LB_{r1}$ and $LB_{r2}$ at a predetermined interval when they emerge from the objective lens 5.

Figure 7:
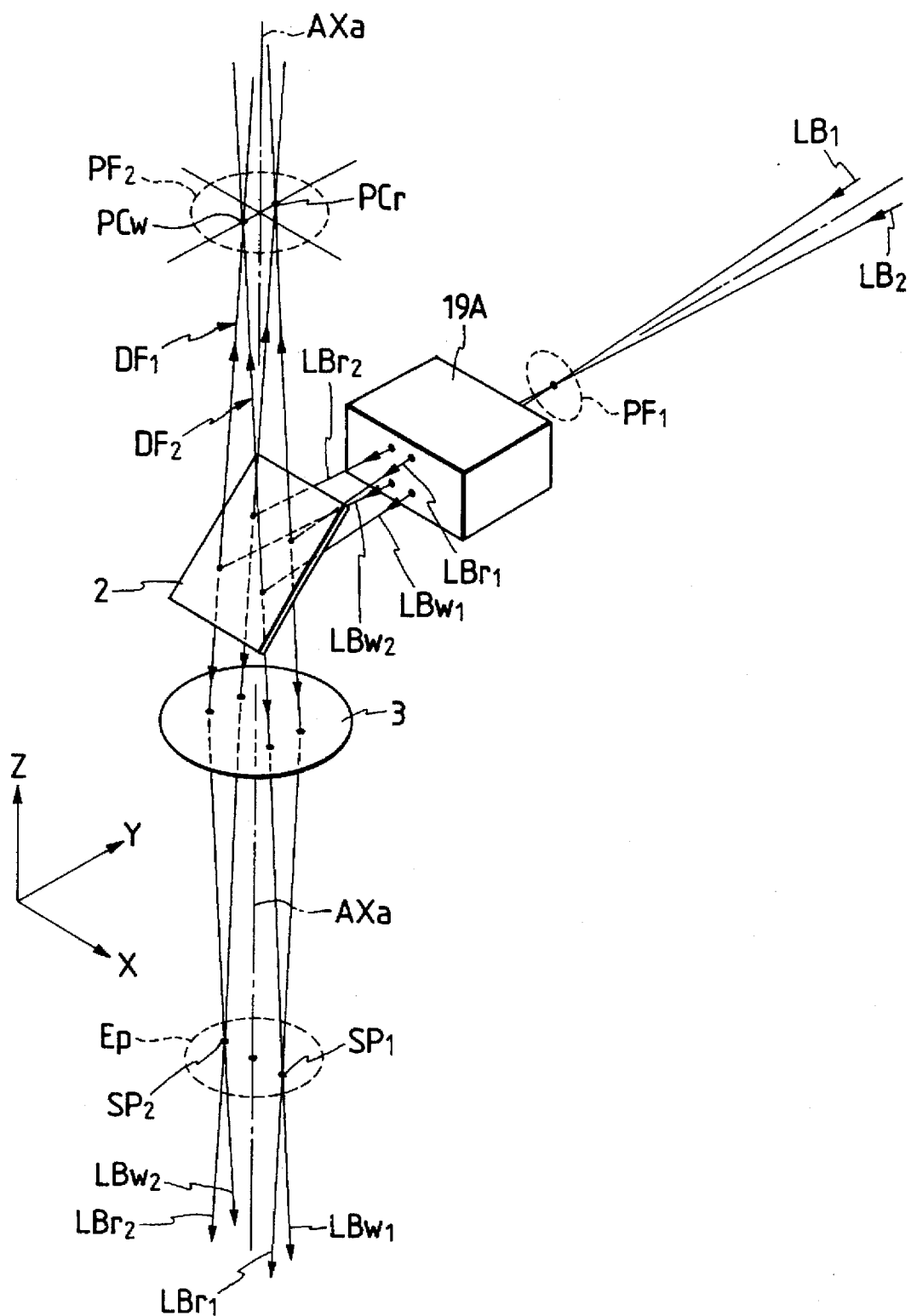
FIG. 7 is a perspective view showing a beam output state near a beam splitter 2 in FIG. 6B.

The geometrical optical arrangement of the beams about the beam splitter 2 will be described in detail below with reference to FIG. 7. In FIG. 7, a splitter 19A is arranged in the beam output system 210, and receives two coherent beams $LB_1$ and $LB_2$ which are symmetrically inclined with respect to an optical axis $AX_a$ of an alignment optical system (objective lens 5). The two beams $LB_1$ and $LB_2$ are the same as the beams $LB_1$ and $LB_2$ shown in FIGS. 1A and 1B, and a wavelength $\lambda_1$ of these beams is assumed to be 633 nm of an He—Ne laser. The beams $LB_1$ and $LB_2$ cross on a plane $PF_1$ in a state of collimated beams, and thereafter, become incident on the splitter 19A. The two beams $LB_{r1}$ and $LB_{w1}$ are formed from the beam $LB_1$, and the two beams $LB_{r2}$ and $LB_{w2}$ are formed from the beam $LB_2$. The inclination state between the reticle beams $LB_{r1}$ and $LB_{r2}$ and the inclination state between the wafer beams $LB_{w1}$ and $LB_{w2}$ are equal to each other, and these states preserve the inclination state between the original beams $LB_1$ and $LB_2$. The four beams are Fourier-transformed by the lens system 3 into two spots $SP_1$ and $SP_2$ symmetrical about the optical axis $AX_a$ in the X-direction (measurement direction) on the focal plane Ep. The spot $SP_1$ is generated when the beams $LB_{r1}$ and $LB_{w1}$ cross at their beam waist positions, and the spot $SP_2$ is generated when the beams $LB_{r2}$ and $LB_{w2}$ cross at their beam waist positions. Note that the plane $PF_1$ where the two original beams $LB_1$ and $LB_2$ cross is conjugate with the plane $P_w$ in FIG. 6 and the wafer surface.

Figure 8:
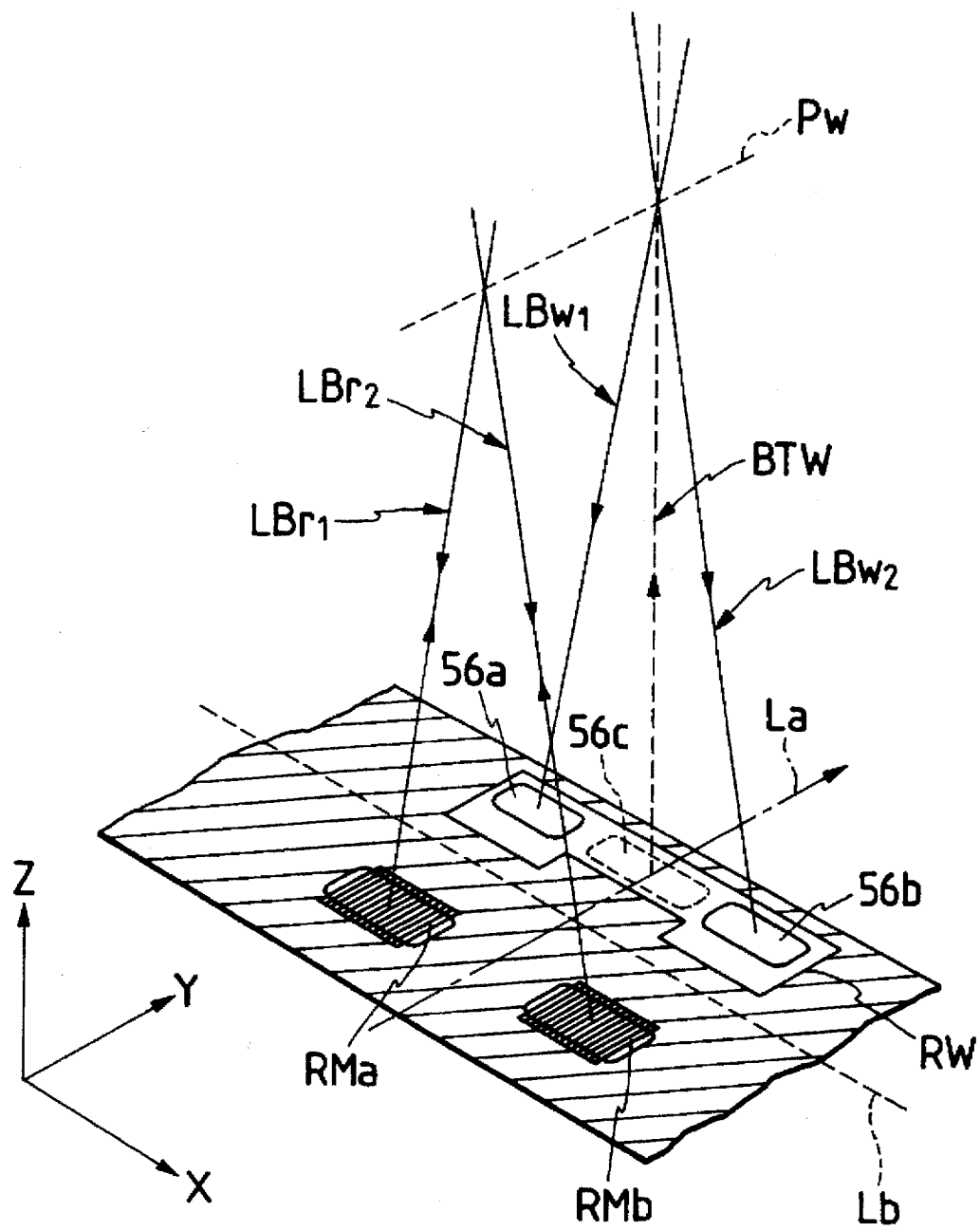
FIG. 8 is a perspective view showing an arrangement of marks and a window on a reticle adopted in the first embodiment of the present invention.

The four beams emerging from the objective lens 5 are radiated on the reticle, as shown in FIG. 8. Note that in FIG. 8, the reticle marks $RM_a$ and $RM_b$, and the window RW are the same as those in FIG. 2, and the measurement direction is the X-direction. The reticle beams $LB_{r1}$ and $LB_{r2}$ are radiated as collimated beams each having a section (rectangular shape) large enough to cover only the corresponding one of the reticle marks $RM_a$ and $RM_b$. On the other hand, the wafer beams $LB_{w1}$ and $LB_{w2}$ are radiated as collimated beams each having a section (rectangular shape) large enough to pass through only the window RW. In this embodiment, when the sectional shapes (rectangular shapes) of the two original beams $LB_1$ and $LB_2$ are set to have the same dimensions, sectional shapes 56a and 56b of the four beams on the reticle have the same dimensions.

The two wafer beams $LB_{w1}$ and $LB_{w2}$ are set not to radiate the edge portion of the window RW as much as possible. The two beams $LB_{w1}$ and $LB_{w2}$ cross on the wafer mark WM of the wafer W through the projection optical system PL so as to form interference fringes. The mark WM is arranged to utilize the chromatic aberration of magnification, as in FIG. 2 described earlier. An interference beam (interference light of ±1st-order diffracted light components) BTW vertically generated from the mark WM passes through the central portion of the window RW of the reticle 7 through the projection optical system PL as a collimated beam having almost a rectangular section shape 56c. The dimensions of the section shape 56c are determined by the dimensions and shape of an overlapping area between the shapes of radiation areas of the two beams $LB_{w1}$ and $LB_{w2}$ on the wafer and the outer shape of the wafer mark WM.

Note that a straight line La in FIG. 8 represents the central line between the reticle marks $RM_a$ and $RM_b$ and the window RW in the measurement direction (X-direction), and the reticle marks and the window are arranged, so that an arrow of this straight line La is directed toward substantially the center of a circuit pattern. A broken line Lb extending in the X-direction between the window RW and the reticle marks $RM_a$ and $RM_b$ represents an edge image of an image formation type reticle blind (illumination field stop) arranged in the exposure illumination system 208, and prevents the reticle marks $RM_a$ and $RM_b$ from being irradiated with exposure light. Note that a hatched area in FIG. 8 is a light-shielding band formed of, e.g., a chromium layer.

The interference beam BTW from the wafer mark WM passes through the central point (a point along the optical axis $AX_a$) in the focal plane Ep in FIG. 7 through the objective lens 5, and then passes through a point $PC_w$ in a plane $PF_2$ as a collimated beam via the lens system 3 and the beam splitter 2. The plane $PF_2$ is located at a position conjugate with the plane $P_w$ in association with a composite system of the lens system 3 and the objective lens 5. Since the two wafer beams $LB_{w1}$ and $LB_{w2}$ radiate the wafer mark WM at symmetrical incident angles, 0th-order diffracted light components $DF_1$ and $DF_2$ of the beams propagate along the optical paths of the two beams $LB_{w1}$ and $LB_{w2}$ in the opposite direction. The two 0th-order diffracted light components $DF_1$ and $DF_2$ are transmitted through the beam splitter 2, and become collimated beams crossing at the point $PC_w$ in the plane $PF_2$.

First-order diffracted light components generated from the reticle marks $RM_a$ and $RM_b$ propagate along the optical paths of the output beams $LB_{r1}$ and $LB_{r2}$ in the opposite direction, as has been described above with reference to FIGS. 1A and 1B, and FIG. 2, and cross as collimated beams at a point $PC_r$ in the plane $PF_2$ via the objective lens 5, the positions of the spots $SP_1$ and $SP_2$ in the focal plane Ep, the lens system 3, and the beam splitter 2 in FIG. 7. Since the interference beam BTW and the 0th-order diffracted light components $DF_1$ and $DF_2$ cross each other in the plane $PF_2$, the sectional shape of the crossing portion in the plane $PF_2$ is similar to the sectional shape of the output beams $LB_{w1}$ and $LB_{w2}$. Similarly, the sectional shape of the crossing portion of the 1st-order diffracted light components from the reticle marks $RM_a$ and $RM_b$ in the plane $PF_2$ is substantially similar to the outer shape of the marks $RM_a$ and $RM_b$. Furthermore, the interval between the reticle marks $RM_a$ and $RM_b$ and the window RW in the Y-direction (non-measurement direction) in FIG. 7 is widened, so that the interference beam BTW and the 0th-order diffracted light components $DF_1$ and $DF_2$ from the wafer mark WM, and two 1st-order diffracted light components from the reticle marks $RM_a$ and $RM_b$ are sufficiently separated from each other in the Y-direction in or near the plane $PF_2$.

The interference beam BTW and the 0th-order diffracted light components $DF_1$ and $DF_2$ from the wafer mark WM obtained in this manner are received by a photoelectric detector 18 via a transparent portion 23B of a partial reflection mirror 23, a mirror 15, and a lens system (Fourier transform lens) 17, as shown in FIG. 6B. The light-receiving surface of the photoelectric detector 18 is present on a Fourier transform plane conjugate with the focal plane Ep. The two 1st-order diffracted light components from the reticle marks $RM_a$ and $RM_b$ are reflected by a total reflection portion 23A of the partial reflection mirror 23, and cross on a monitor grating plate 13 arranged on the plane $PF_2$, thus forming interference fringes there. Furthermore, ±1st-order diffracted light components re-diffracted by the monitor grating plate 13 propagate coaxially, and are received by a photoelectric detector 14 as an interference beam BTR.

In this embodiment, since the partial reflection mirror 23 is arranged to be conjugate with the pattern surface of the reticle 7 (the reticle lower surface where the marks $RM_a$ and $RM_b$ are formed) with respect to light at the wavelength $\lambda_1$, the reticle beams $LB_{r1}$ and $LB_{r2}$ and the wafer beams $LB_{w1}$ and $LB_{w2}$ are separated from each other on the reticle 7, and therefore, return light components from the marks are separated from each other on the partial reflection mirror 23. Thus, the return light components can be easily split.

Figure 3:
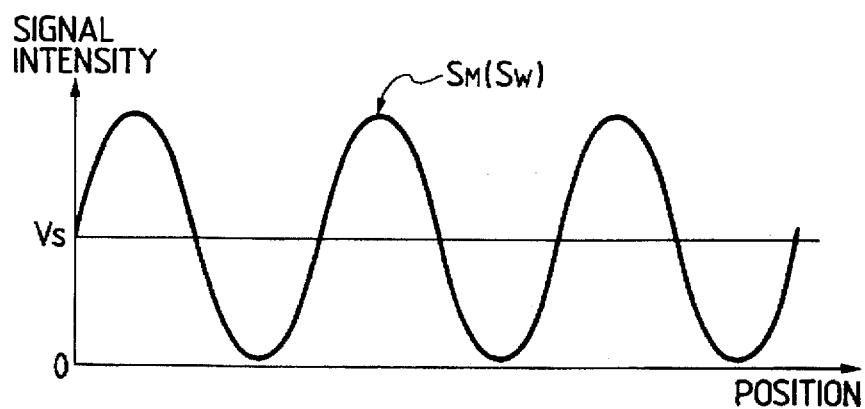
FIG. 3 is a waveform chart showing a signal waveform obtained by photoelectrically detecting a wafer or reticle mark.

In the above-mentioned arrangement, when the reticle 7 is finely moved in the X-direction, interference fringes formed on the monitor grating plate 13 by the 1st-order diffracted light components from the reticle marks $RM_a$ and $RM_b$ move in the pitch direction (X-direction), and the phase relationship between the monitor grating and the interference fringes changes. As a result, the above-mentioned signal $S_m$ shown in FIG. 3 is obtained from the photoelectric detector 14. Similarly, when the wafer W is finely moved in the X-direction, the intensity of the interference beam BTW vertically generated from the wafer mark WM changes sinusoidally, and the signal $S_w$ shown in FIG. 3 is obtained.

Therefore, the alignment signal processing system 214 shown in FIG. 5 detects the positions of the reticle 7 and the wafer W where the levels of the signals $S_w$ and $S_m$ reach a predetermined value using the reticle interferometer 202 and the wafer interferometer 206, and controls the reticle stage control system 200 and the wafer stage control system 204 to obtain a desired relative positional relationship between the reticle 7 and the wafer W. Thereafter, the illumination light IL is output from the exposure illumination system 208 to print an image of the circuit pattern area on the reticle 7 at the predetermined position on the wafer W.

As described above, in this embodiment, the two beams $LB_{r1}$ and $LB_{r2}$ radiated on the marks $RM_a$ and $RM_b$ on the reticle 7, and the two beams $L_{w1}$ and $LB_{w2}$ radiated on the mark WM on the wafer W are separated from each other so as not to mix with each other on the reticle 7. Therefore, the waveforms of the photoelectric signals $S_m$ and $S_w$ as the detection signals of the marks can be approximate to an ideal sine waveform, and distortion of the waveforms and noise components due to mixing of stray light can be eliminated, thus improving the mark position measurement precision based on the levels of the signals $S_m$ and $S_w$. When the reticle 7 and the wafer W are scanned by the homodyne method so as to generate the signals $S_m$ and $S_w$, the reticle stage RST and the wafer stage WST are simultaneously scanned, so that the reticle marks $RM_a$ and $RM_b$ and the wafer mark WM pass their alignment end predicted positions at as the same time as possible. Thus, an error caused by, e.g., a vibration of the objective lens 5 can be canceled, and stable position detection can be realized.

Figure 2:
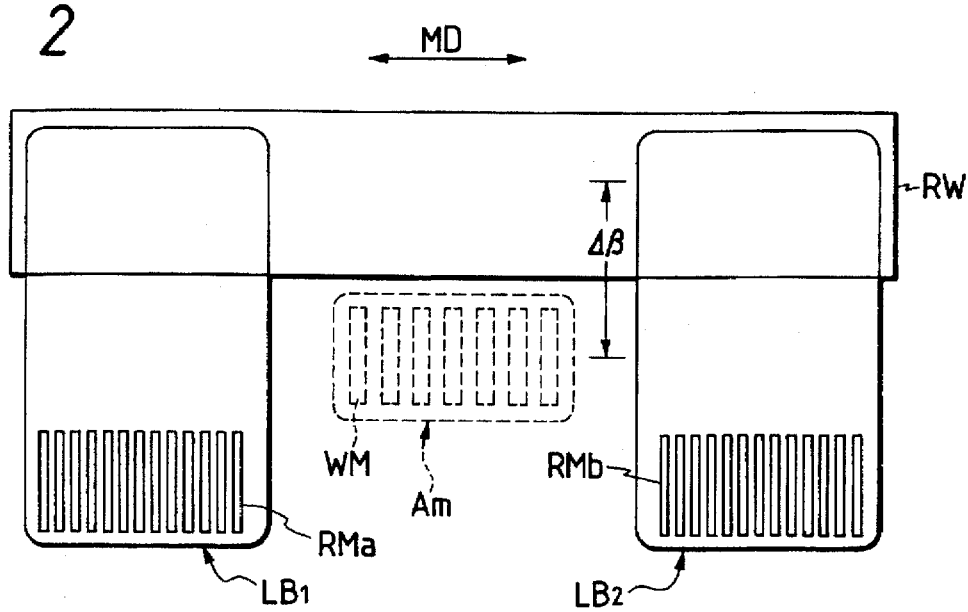
FIG. 2 is a plan view showing the relationship between a reticle mark arrangement and two beam radiation areas in the conventional system.
Figure 9:
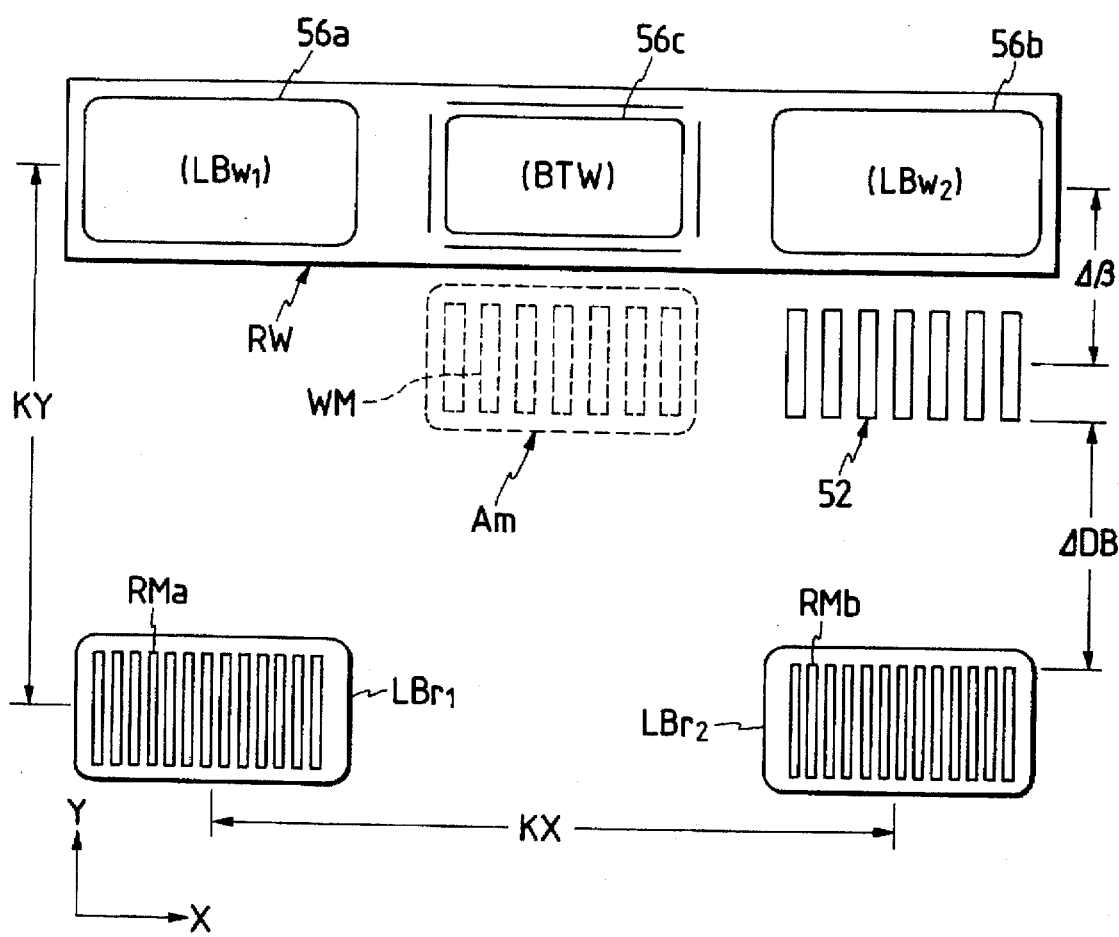
FIG. 9 is an enlarged plan view for explaining the arrangement of the marks, the window, and beam radiation areas in FIG. 8.

The beam arrangement on the reticle will be described again with reference to FIG. 9. The arrangement shown in FIG. 9 is basically the same as that shown in FIG. 8. In FIG. 9, a mark pattern 52 for forming a new wafer pattern WM is provided. In FIG. 9, an interval KY between the window RM and the reticle marks $RM_a$ and $RM_b$ in the Y-direction can be widened as compared to the mark arrangement shown in FIG. 2. More specifically, when the interval KY is widened with a beam sectional shape which can simultaneously cover the reticle marks $RM_a$ and $RM_b$ and the window RM, as shown in FIG. 2, the beam sectional shape becomes considerably large. Furthermore, since the mark 52 undesirably falls within the beam radiation area, diffracted light generated from the mark 52 may be mixed in the light-receiving system as stray light. However, in this embodiment, as shown in FIG. 9, when the beams are separated into four beams on the reticle, the above-mentioned problems can be solved. The mark 52 is formed to be separated from the window RW by $\Delta\beta$ in the Y-direction. In this case, the interval $\Delta\beta$ corresponds to the amount of chromatic aberration of magnification of the projection optical system PL on the reticle side. A light-shielding band is entirely formed on a portion corresponding to an interval $\Delta DB$ between the mark 52 and the reticle mark RM, and the edge image Lb of the reticle blind is located there, as shown in FIG. 8. For this reason, the interval $\Delta DB$ is determined by the setting precision of the edge of a variable blade of the reticle blind, and the fine movement range of the reticle 7 in the Y-direction in alignment.

When the interval between the centers of the two beams $LB_{r1}$ and $LB_{r2}$ (or $LB_{w1}$ and $LB_{w2}$) in the X-direction is represented by KX, the pitch of the reticle marks $RM_a$ and $RM_b$ is represented by $P_{gr}$, and the wavelength of the beams is represented by $\lambda_1$, the incident angle of the two beams $LB_{r1}$ and $LB_{r2}$ on the reticle (the inclination angle from the optical axis $AX_a$ of the alignment system) $\theta_r$ is expressed by the following relations under a condition that the 1st-order diffracted light components from the marks $RM_a$ and $RM_b$ propagate along the output beams in the opposite direction (the 1st-order diffraction angle=$2\theta_r$):

$\tan\theta_r = KX/2 \cdot \Delta L$ and $\sin 2\theta_r = \lambda/P_{gr}$

For example, assuming that the pitch $P_{gr}$ is 10 µm, the wavelength λ is 633 nm, and the axial chromatic aberration amount ΔL is 20 mm, the incident angle $\theta_r$ is about 1.81°, and the interval KX is about 1.27 mm. If the number of gratings of each of the reticle marks $RM_a$ and $RM_b$ is 20, the length of each mark in the X-direction is about 200 µm (0.2 mm), and is sufficiently smaller than the interval KX. From these data, the length of the window RW in the X-direction under the above-mentioned condition is preferably set to be slightly larger than the sum of the interval KX and the length of the mark RM in the X-direction, i.e., about 1.6 mm.

In general, a beam emitted from a coherent laser light source often has a circular section. With this beam, the rectangular sectional shape shown in FIG. 9 cannot be obtained. For this reason, an aperture plate having a rectangular opening is provided to the plane $PF_1$ (FIG. 7) where the two beams $LB_1$ and $LB_2$ cross, thereby shaping the sectional shapes of the four beams $LB_{r1}$, $LB_{r2}$, $LB_{w1}$, and $LB_{w2}$.

In actual alignment, a reference mark (diffraction grating-like mark) FM fixed on the wafer stage WST is detected by an observation microscope 59 (FIG. 6B) via the projection optical system PL and the reticle 7. At this time, the coordinate value of the reference mark FM with reference to marks (the window RW may be used instead) on the reticle 7 is detected and stored by the wafer interferometer 206. Note that the microscope 59 detects the marks under illumination light having the same wavelength as that of the exposure light IL. Thereafter, the wafer stage WST is moved, so that the reference mark FM is located immediately below a radiation area Am of the two beams $LB_{w1}$ and $LB_{w2}$, and the coordinate value of the wafer stage WST when the signal $S_w$ from the photoelectric detector 18 reaches a predetermined level is stored. Thus, from the relationship with the previously stored coordinate value, the coordinate position of a predetermined phase point of the interference fringes by the two beams $LB_{w1}$ and $LB_{w2}$ is obtained with reference to the projection point at the center of the reticle 7. This coordinate position measurement is so-called base-line measurement, and must be executed every time a wafer is exchanged or for each lot prior to step-and-repeat exposure of a wafer in a method of detecting the position of the wafer mark with reference to static interference fringes generated on the wafer like in this embodiment.

Figure 10:
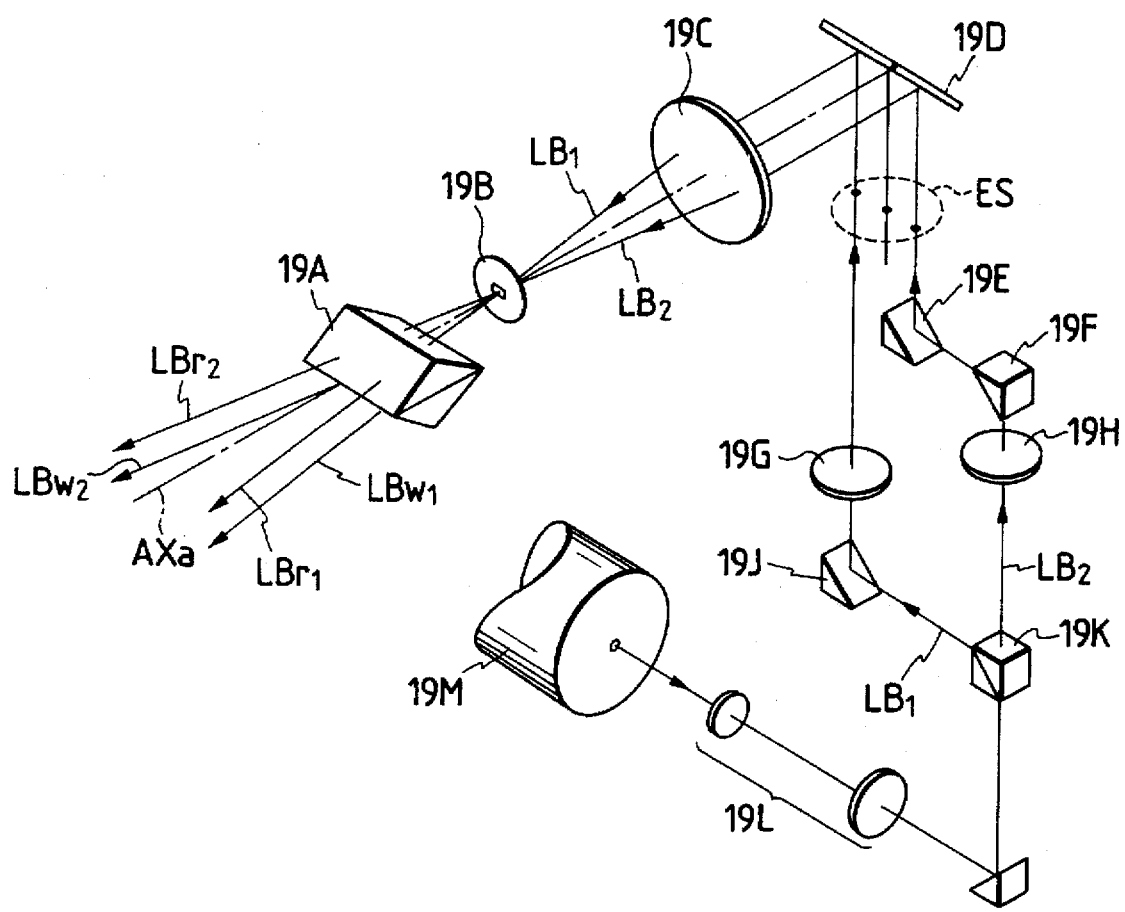
FIG. 10 is a perspective view showing the details of a beam output system shown in FIGS. 6A and 6B.

As the detailed arrangement of the beam output system 210 of the first embodiment, an arrangement shown in FIG. 10 is suitable. A collimated beam emitted from an He—Ne laser tube 19M for emitting a laser beam having a wavelength of 633 nm passes through a beam expander 19L for enlarging the beam spot size, and is then split into two beams by a beam splitter 19K. One split beam $LB_1$ is reflected by a mirror 19J, is focused on a plane ES by a lens 19G, and thereafter, diverges. The other split beam $LB_2$ is focused on the plane ES via a lens 19H and mirrors 19F and 19E, and thereafter, diverges. The plane ES is located at a position conjugate with the focal plane Ep in FIG. 7, and the central lines of the two beams $LB_1$ and $LB_2$ passing the plane ES are parallel to each other, and have a predetermined interval therebetween. The two beams $LB_1$ and $LB_2$ are incident on a lens system (inverse Fourier transform lens) 19C via a mirror 19D, and emerge from the lens system 19C as two collimated beams, which cross at a rear-side focal point position. An aperture plate 19B for shaping a beam section is arranged on a rear-side focal plane of the lens system 19C, i.e., on the plane $PF_1$ in FIG. 7, and the two beams $LB_1$ and $LB_2$ passing through the aperture plate 19B are incident on the splitter 19A. The splitter 19A is prepared by adhering triangular prisms back to back, and the junction surface serves as a beam splitter (half mirror). The splitter 19A may comprise a normal rectangular parallelopiped beam splitter. In this embodiment, the optical axis $AX_a$ of the alignment system is set to coincide with the junction surface of the splitter 19A, and the two beams $LB_1$ and $LB_2$ are set to become incident on the inclined surface decentered from the junction surface. Thus, the splitter 19A outputs four beams $LB_{r1}$, $LB_{r2}$, $LB_{w1}$, and $LB_{w2}$, which are separated from each other.

In the above-mentioned arrangement, the aperture plate 19B also has a function of obtaining a uniform intensity distribution in a beam section. Normally, since an He—Ne laser beam has an intensity with a Gaussian distribution in its section, when the enlargement factor of the expander 19L is set so that the area of the rectangular opening of the aperture plate 19B is located near the center (peak) of the Gaussian distribution, unnecessary two sides of the Gaussian distribution can be cut.

The arrangement of a beam output system according to the second embodiment of the present invention will be described below with reference to FIGS. 11A and 11B. This embodiment employs the same arrangement as that of the first embodiment, except for the beam output system. A difference between this embodiment and the first embodiment (FIG. 10) is that two reticle beams and two wafer beams can be generated from different laser light sources.

FIGS. 11A and 11B show a method of forming four beams $LB_{r1}$, $LB_{r2}$, $LB_{w1}$, and $LB_{w2}$ to be incident on the beam splitter 2 shown in FIG. 7, and the X-Y-Z coordinate system is the same as that in FIG. 7. FIG. 11B is a sectional view taken along a line B—B of FIG. 11A. A beam $LB_r$ emitted from a laser light source (e.g., an He—Ne laser) 24A is split into two parallel beams $LB_{r1}$ and $LB_{r2}$ by a beam splitter 25A. The beams $LB_{r1}$ and $LB_{r2}$ are juxtaposed in a direction perpendicular to the plane of drawing in FIG. 11A, are deflected by a D prism (wedge-shaped prism) 26A by a predetermined amount with respect to an optical axis $AX_a$, are reflected by a mirror 27A, and then become incident on a synthesizing prism 27B. The beams $LB_{r1}$ and $LB_{r2}$ reflected by the synthesizing prism 27B are converted into collimated beams crossing on a plane $PF_1$ by a lens system 28, as shown in FIG. 11B. In this state, as shown in FIG. 11A, the two beams $LB_{r1}$ and $LB_{r2}$ are decentered from the optical axis $AX_a$ by the predetermined amount when viewed in the Y-Z plane.

A beam $LB_w$ emitted from a laser light source 24B is split into two beams $LB_{w1}$ and $LB_{w2}$ by a beam splitter 25B having the same structure as the beam splitter 25A. The two beams are simultaneously deflected by a D prism 26B, and are incident on the synthesizing prism 27B. Thereafter, the beams are converted by the lens system 28 into beams crossing on the plane $PF_1$ in the X-Y plane.

In FIGS. 11A and 11B, the positions of the beam deflection points by the D prisms 26A and 26B almost coincide with the front-side focal plane of the lens system 28. Since the four beams emerging from the lens system 28 are collimated beams, lens systems are respectively inserted between the D prisms 26A and 26B and the laser light sources 24A and 24B to form beam waists at the positions of the D prisms (the front-side focal plane of the lens system 28). Furthermore, the aperture plate 19B shown in FIG. 10 is arranged at the position of the plane $PF_1$. Since the positions of the crossing area of the beams $LB_{w1}$ and $LB_{w2}$ and the crossing area of the beams $LB_{w1}$ and $LB_{w2}$ on the plane $PF_1$ are separated in the Z-direction to sandwich the optical axis $AX_a$ therebetween, two rectangular openings (illumination field stops) corresponding to these crossing areas are formed on the aperture plate 19B. For this reason, the sectional shapes and dimensions of the two reticle beams $LB_{r1}$ and $LB_{r2}$ on the reticle, and those of the two wafer beams $LB_{w1}$ and $LB_{w2}$ on the reticle can be independently adjusted.

In this embodiment, the two reticle beams and the two wafer beams are generated from different laser light sources. For this reason, if the two light sources comprise the same He—Ne laser sources (wavelength=633 nm), beams emitted therefrom will not interfere with each other. Therefore, of stray light components incident on a light-receiving system, an undesirable phase distortion on a signal waveform caused upon mutual interference between stray light components generated by the reticle and wafer beams can be eliminated. Of course, the beams emitted from the two laser light sources 24A and 24B may have different polarization states, and signal light components from the marks may be polarized and split in a light-receiving system. The beams from the two laser light sources 24A and 24B may have slightly different wavelengths (e.g., 1% or less). When the axial chromatic aberration amount and the amount of chromatic aberration of magnification of the projection optical system PL also differ due to the slight difference between the wavelengths, the states of the beams on the plane $PF_1$ in FIGS. 11A and 11B can be changed in correspondence with the differences.

A beam output system according to the third embodiment of the present invention will be described below with reference to FIGS. 12A and 12B. The system shown in FIGS. 12A and 12B is equivalent to the system described above with reference to FIGS. 1A and 1B. A beam emitted from a laser light source 24 is split by a beam splitter 33 into two beams. One split beam $LB_1$ is reflected by a mirror 35, and is incident on a synthesizing prism 36. The other split beam $LB_2$ is reflected by a mirror 34, and is incident on the synthesizing prism 36. A lens system 28 causes the two beams $LB_1$ and $LB_2$ synthesized to be parallel to each other by the synthesizing prism 36 to cross on a plane $PF_2$. In this embodiment, a beam splitter 37 (of the same type as the splitters 25A and 25B in FIG. 11A) is arranged at the position of the plane $PF_2$, and splits the input beams into two reticle beams $LB_{r1}$ and $LB_{r2}$, and two wafer beams $LB_{w1}$ and $LB_{w2}$. The beam splitter 37 corresponds to the splitter 19A in FIG. 10.

Figure 13A:
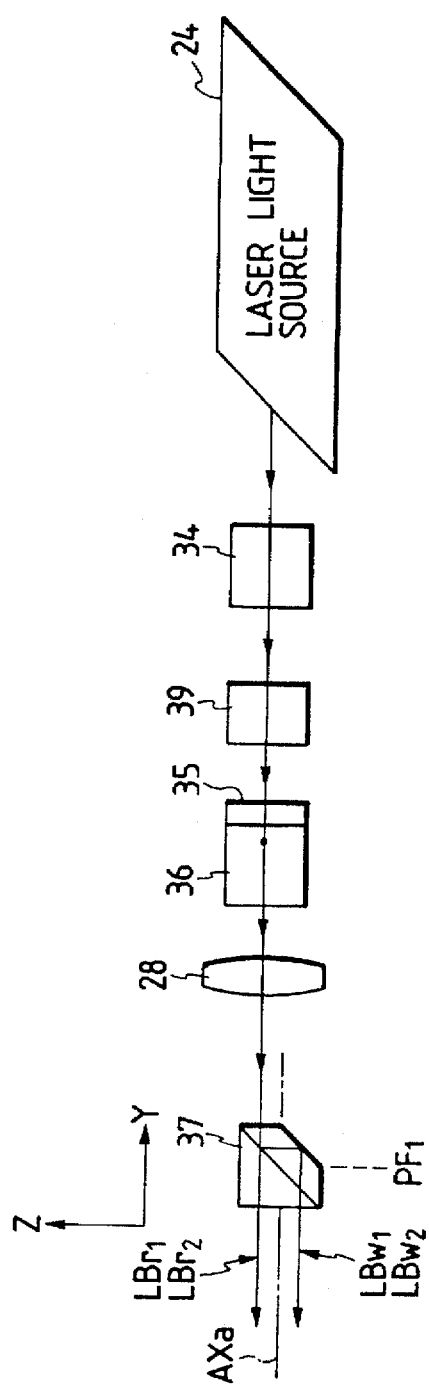
FIGS. 13A and 13B are charts showing an arrangement of a beam output system according to the fourth embodiment of the present invention.
Figure 13B:
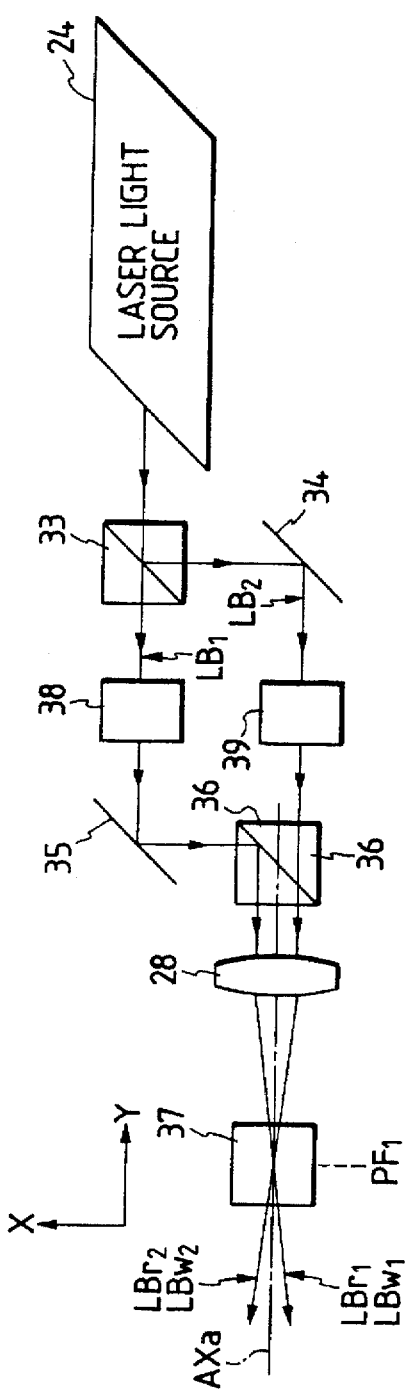

A beam output system according to the fourth embodiment of the present invention will be described below with reference to FIGS. 13A and 13B, and FIGS. 6A and 6B presented previously. This embodiment employs the heterodyne method in contrast to the homodyne method employed in the first to third embodiments. The system shown in FIGS. 13A and 13B is substantially the same as the system shown in FIGS. 12A and 12B, except that heterodyne frequency shifters 38 and 39 are respectively provided in correspondence with two split beams $LB_1$ and $LB_2$. Each of the frequency shifters 38 and 39 is constituted by an acoustooptic modulator (AOM) driven by a predetermined high-frequency signal, a slit for extracting only 1st-order diffracted light modulated by the AOM, and the like. The frequency shifter 38 is driven at a frequency $F_1$, and outputs 1st-order diffracted light of a frequency $f_1$, which is shifted by $f_0 + F_1$ from a frequency $f_0$ of the input beam $LB_1$ as an output beam. Similarly, the frequency shifter 38 is driven at a frequency $F_2$, and outputs 1st-order diffracted light of a frequency $f_2$, which is shifted by $f_0 + F_2$ from the frequency $f_0$ of the input beam $LB_2$ as an output beam. Therefore, beams $LB_{r1}$ and $LB_{w1}$ emerging from a beam splitter 37 have the frequency $f_1$, and beams $LB_{r2}$ and $LB_{w2}$ have the frequency $f_2$.

Figure 4:
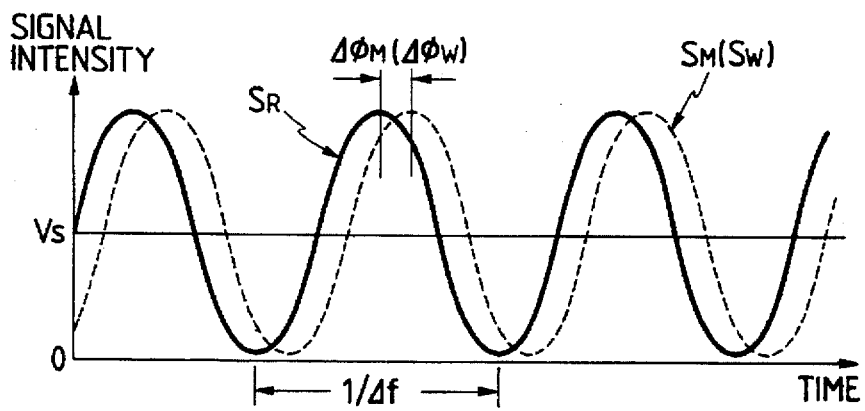
FIG. 4 is a waveform chart showing waveforms of a reference signal and a mark signal obtained by the heterodyne method.

Since the heterodyne method requires a reference signal, the four beams are partially split at the position of the beam splitter 4 in the optical path of the alignment system shown in FIG. 6B, and split beams are incident on the lens system 8. Thus, the two beams $LB_{r1}$ and $LB_{r2}$ are converted into collimated beams, and cross on a grating formed on the upper half portion of a reference grating plate 20. Also, the two beams $LB_{w1}$ and $LB_{w2}$ are converted into collimated beams, and cross on a grating formed on the lower half portion of the reference grating plate 20. An interference beam $BTS_r$ formed from the two reticle beams and an interference beam $BTS_w$ formed from the two wafer beams are separately generated from the reference grating plate 20, and are independently received by photoelectric detectors 21 and 22. In heterodyne measurement, a phase difference $\Delta\phi_m$ between a reference signal $SR_m$ obtained from the photoelectric detector 21 and a signal $S_m$ obtained from a photoelectric detector 14 is calculated, as has been described above with reference to FIG. 4, and a phase difference $\Delta\phi_w$ between a reference signal $SR_w$ obtained from the photoelectric detector 22 and a signal $S_w$ obtained from a photoelectric detector 18 is calculated. These signals $S_m$, $S_w$, $SR_m$, and $SR_w$ are beat frequencies having a frequency $\Delta f$ ($=f_1-f_2$). The calculated phase difference $\Delta\phi_m$ changes by $2\pi$ (one period) with respect to a ½ position shift of the pitch $P_{gr}$ of the reticle marks $RM_a$ and $RM_b$, and the phase difference $\Delta\phi_w$ also changes by $2\pi$ with respect to a ½ position shift of the pitch $P_{gw}$ of the wafer mark WM.

The alignment sequence of this embodiment will be briefly described below. The reticle 7 and the mark FM of the reference plate on the wafer stage WST are simultaneously observed by the microscope 59 (FIG. 6B) using illumination light having the same wavelength $\lambda_0$ as that of exposure light, and one or both of the reticle stage RST and the wafer stage WST are driven so as to eliminate a relative position shift between the mark on the reticle 7 and the reference mark FM. At this time, the same grating mark as the wafer mark WM is also provided on the reference plate, and is arranged to be located immediately below the window RW of the reticle 7. When the reticle 7 is aligned with the reference mark FM by the microscope 59, a phase difference $\Delta\phi_{m0}$ between the measurement signal $S_m$ and the reference signal $SR_m$ and a phase difference $\Delta\phi_{w0}$ between the measurement signal $S_w$ (obtained by detecting the grating of the reference mark) and the reference signal $SR_w$ are calculated and stored.

Thereafter, when the wafer W is actually aligned, after the wafer stage WST is aligned with the target position, the reticle stage RST or the wafer stage WST is controlled, so that the phase difference $\Delta\phi_m$ obtained upon detection of the reticle marks $RM_a$ and $RM_b$, and the phase difference $\Delta\phi_w$ obtained upon detection of the wafer mark WM respectively become equal to the pre-stored values $\Delta\phi_{m0}$ and $\Delta\phi_{w0}$. Alternatively, since the phase difference change amount uniquely corresponds to the stage position change amount, one or both of the reticle stage and the wafer stage may be controlled so as to satisfy a relation $(\Delta\phi_m - \Delta\phi_{m0})/2 = \Delta\phi_w - \Delta\phi_{w0}$ under a condition that the reticle and wafer marks have a double-pitch relationship therebetween. In this embodiment, phase difference measurement is performed after the reticle marks RM and the wafer mark WM are aligned within the ranges of ±¼ of their grating pitches using the reticle interferometer 202 and the wafer interferometer 206, as a matter of course.

A beam output system according to the fifth embodiment of the present invention will be described below with reference to FIGS. 14A and 14B. The system shown in FIGS. 14A and 14B is similar to the above-mentioned system shown in FIGS. 11A and 11B. In this embodiment, however, a single laser light source 24 is used, and reticle beams and wafer beams have a predetermined frequency difference therebetween, thereby eliminating interference between stray light from the reticle side and stray light from the wafer side.

FIG. 14A shows an arrangement in the Z-Y plane, and FIG. 14B shows an arrangement in the X-Y plane when viewed from the lower side of FIG. 14A. In FIGS. 14A and 14B, the same reference numerals denote the same parts as in FIGS. 11A and 11B. A beam emitted from the laser light source 24 is split into a reticle beam $LB_r$ and a wafer beam $LB_w$ by a beam splitter 40. Of these beams, the beam $LB_w$ is reflected by a mirror 41, and is split into two beams $LB_{w1}$ and $LB_{w2}$ by a prism 25B. Thereafter, the beams $LB_{w1}$ and $LB_{w2}$ cross on a plane $PF_1$ via a D prism 26B, a synthesizing prism 27A, and a lens system 28. On the other hand, the beam $LB_r$ transmitted through the beam splitter 40 is incident on a frequency shifter 42 to form a beam of 1st-order diffracted light whose is frequency-shifted by a predetermined frequency. Furthermore, the beam is split into two beams $LB_{r1}$ and $LB_{r2}$ by a beam splitter 25A. The two beams cross on the plane $PF_1$ via a D prism 26A, a mirror 27A, the synthesizing prism 27A, and the lens system 28.

In this embodiment, the frequency shifter 42 is inserted in the optical path of the reticle beam $LB_r$. Instead, the frequency shifter may be inserted in the optical path of the wafer beam $LB_w$. The frequency shifter 42 can be driven by a proper high-frequency signal with respect to an AOM, and its frequency Fd may have an arbitrary value.

As described above, in this embodiment, although the two reticle beams $LB_{r1}$ and $LB_{r2}$ and the two wafer beams $LB_{w1}$ and $LB_{w2}$ are given with a frequency difference Fd, the frequency difference between two beams crossing each other in an image space is zero. For this reason, this embodiment is an application of the homodyne method like in the first to third embodiments. Therefore, in alignment, the reticle marks RM and the wafer mark WM must be scanned in the pitch direction.

A beam output system according to the sixth embodiment of the present invention will be described below with reference to FIGS. 15A and 15B. The system shown in FIGS. 15A and 15B aims at a heterodyne system by combining the systems shown in FIGS. 13A and 13B, and FIGS. 14A and 14B. FIG. 15B is a view when the arrangement of FIG. 15A is viewed from the lower side.

Figures 15A, 15B:
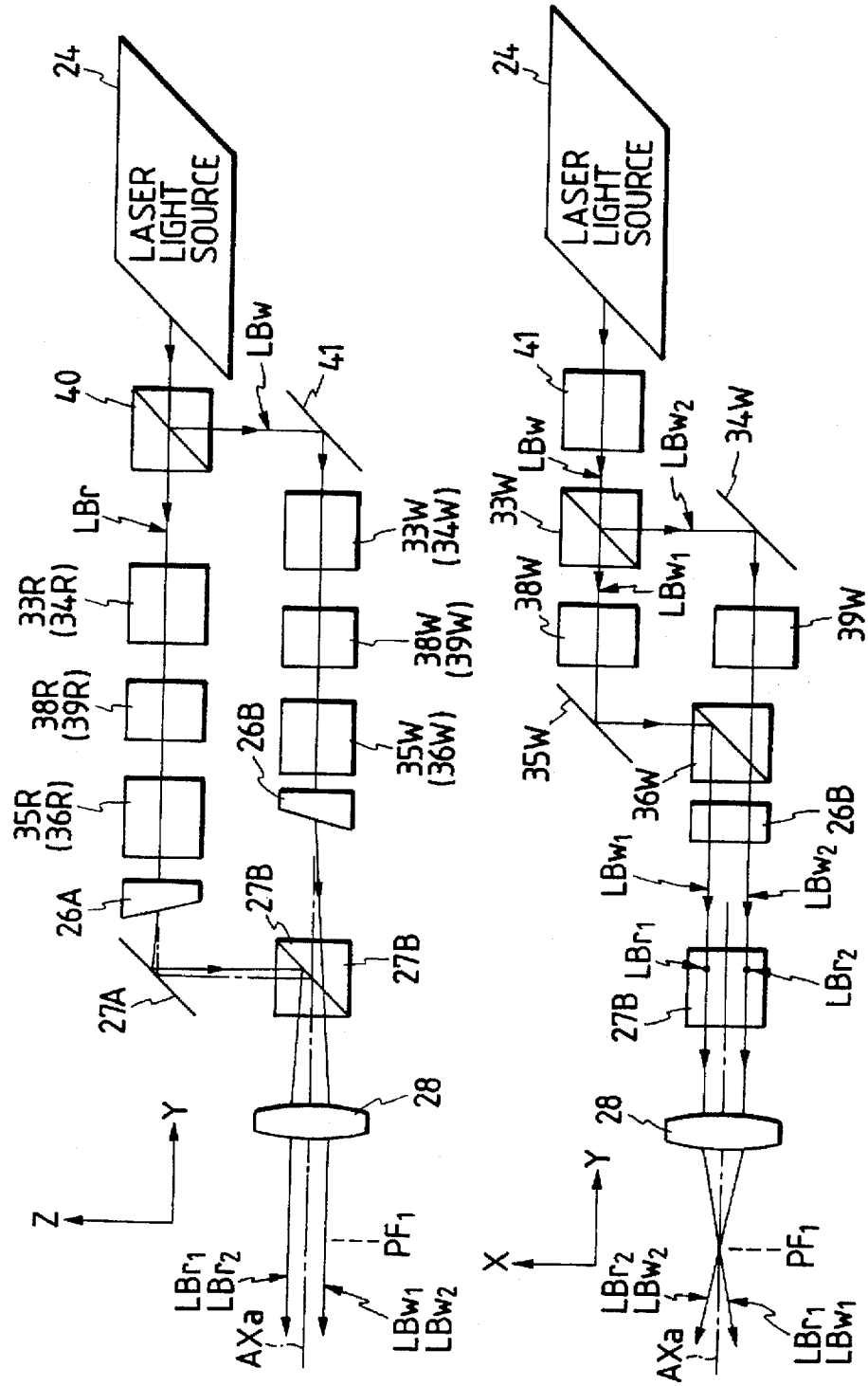
FIGS. 15A and 15B are charts showing an arrangement of a beam output system according to the sixth embodiment of the present invention.

As shown in FIG. 15A, a beam from a laser light source 24 is split into a reticle beam $LB_r$ and a wafer beam $LB_w$ by a beam splitter 40. The wafer beam $LB_w$ is reflected by a mirror 41, is incident on a beam splitter 33W, and is split into two beams $LB_{w1}$ and $LB_{w2}$, as shown in FIG. 15B. Of these beams, the beam $LB_{w1}$ is incident on a decentering synthesizing prism 36W via a frequency shifter 38W and a mirror 35W. The other beam $LB_{w2}$ is reflected by a mirror 34W, and is incident on the decentering synthesizing prism 36W via a frequency shifter 39W. The two beams $LB_{w1}$ and $LB_{w2}$ from the prism 36W are deflected in one direction by a D prism 26B, and cross on a plane $PF_1$ via a synthesizing prism 27B and a lens system 28.

On the other hand, the reticle beam $LB_r$ is converted into two beams $LB_{r1}$ and $LB_{r2}$ via the same arrangement as in FIG. 15B, i.e., a beam splitter 33R, a mirror 34R, frequency shifters 38R and 39R, and a decentering synthesizing prism 36R. Furthermore, the two beams $LB_{r1}$ and $LB_{r2}$ are simultaneously deflected by a predetermined amount by a D prism 26A, are incident on the synthesizing prism 27B via a mirror 27A, and cross on the plane $PF_1$.

As described above, in this embodiment, the two reticle beams $LB_{r1}$ and $LB_{r2}$ are given with a predetermined frequency difference Δfr therebetween using the two frequency shifters 38R and 39R driven by a high-frequency drive circuit. Furthermore, the two wafer beams $LB_{w1}$ and $LB_{w2}$ are given with a predetermined frequency difference Δfw therebetween using the two frequency shifters 38W and 39W. When the drive frequencies of the four frequency shifters 38R, 39R, 38W, and 39W are respectively represented by $Fr_1$, $Fr_2$, $Fw_1$, and $Fw_2$, and the original frequency of the beam emitted from the laser light source 24 is represented by $f_0$, the following relationships are established:

$$\Delta fr = (Fr_1 + f_0) - (Fr_2 + f_0) = Fr_1 - Fr_2$$

$$\Delta fw = (Fw_1 + f_0) - (Fw_2 + f_0) = Fw_1 - Fw_2$$

When the frequencies of the drive signals are properly determined, the frequency differences Δfr and Δfw can be set to be different from each other. As a result, the beat frequency (Δfr) of an interference beam BTR obtained from the reticle marks RM and the beat frequency (Δfw) of an interference beam BTW obtained from the wafer mark WM can be sufficiently separated from each other. Even when these beams are mixed with each other, the corresponding signals can be discriminated by a signal processing circuit. Of course, according to the arrangement shown in FIGS. 6A and 6B, the frequencies of reference signals $SR_r$ and $SR_w$ change accordingly.

The frequency differences Δfr and Δfw are determined within a range of response characteristics of the photoelectric detectors 14, 18, 21, and 22, and the ratio Δfr/Δfw is preferably set neither to be 1 nor to attain a harmonic relationship (1:2, 1:3, or the like). Furthermore, a difference Afc between a center frequency Frc [$(Fr_1+Fr_2)/2$] between the frequencies $Fr_1$ and $Fr_2$ of the two drive signals for the reticle beams, and a center frequency Fwc between the frequencies $Fw_1$ and $Fw_2$ of the two drive signals for the wafer beams is preferably set at a frequency sufficiently higher than the response characteristics of the photoelectric detectors 14, 18, 21, and 22, i.e., to be too high a value to respond. For example, the frequencies $Fw_1$ and $Fw_2$ are set to be on the order of 80 MHz, and the frequencies $Fr_1$ and $Fr_2$ are set to be on the order of 90 MHz (or 70 MHz). More specifically, these frequencies are:

$Fw_1=80.000$ MHz, $Fw_2=80.020$ MHz (Δfw=20 kHz)

$Fr_1=90.000$ MHz, $Fr_2=90.050$ MHz (Δfr=50 kHz)

In this case, the ratio Δfr/Δfw is 2.5. Since the period defining the frequency Δfr (50 kHz) is 20 μsec., and the period defining the frequency Δfw (20 kHz) is 50 μsec., a common multiple of these periods is 100·N (μsec.; N is an integer equal to or larger than 1).

Thus, in a signal processing system, the digital sampling times of the signals $S_m$, $S_w$, $SR_m$, and $SR_w$ for measuring the phase differences can be set to be 100·N (μsec.). Since this is associated with a signal processing method, the processing method will be described below.

Figure 16:
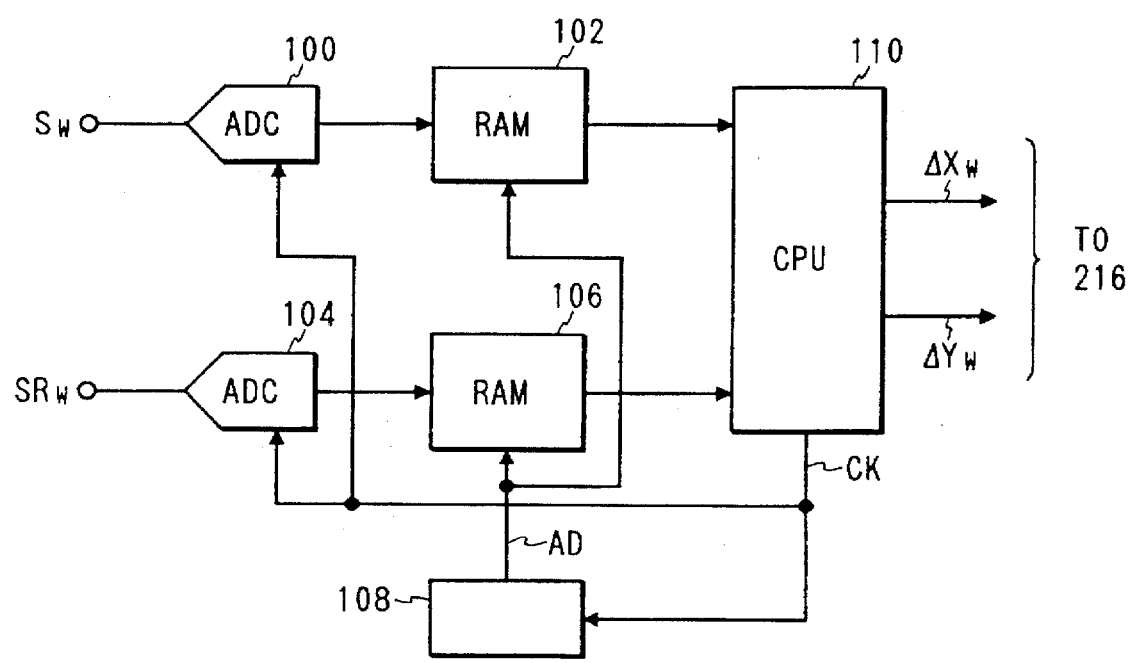
FIG. 16 is a diagram showing a circuit for sampling a signal waveform by a heterodyne method.

FIG. 16 shows a circuit arrangement for fetching the waveforms of the respective signals. FIG. 16 illustrates only a circuit for fetching the signals $S_w$ and $SR_w$, for the sake of simplicity. In FIG. 16, a high-speed analog-to-digital converter (ADC) 100 converts the magnitude of the signal $S_w$ into a digital value, and supplies the digital value to a memory (RAM) 102. The ADC 100 performs conversion in response to a clock pulse CK from an arithmetic processing circuit (CPU) 110. The frequency of the pulse CK is determined according to the conversion speed of the ADC 100, and is set to be twice or more the frequency Δfw of the signal $S_w$. In this case, as the ADC 100, a device capable of performing A/D conversion in response to the clock pulse CK of 200 kHz is used. A counter (CNT) 108 sequentially counts the clock pulses CK, and outputs the count value as an address value AD for the RAM 102.

Similarly, the magnitude of the reference signal $SR_w$ is digitally sampled by an ADC 104, and the digital value is stored in a RAM 106. The conversion timing of the ADC 104 and the addresses of the RAM 106 are determined in response to the clock pulses CK. The CPU 110 performs arithmetic processing of the signal waveforms stored in the RAMs 102 and 106 to calculate a phase difference $\Delta\phi_w$ between the two signals $S_w$ and $SR_w$, and outputs a position shift amount $\Delta X_w$ or $\Delta Y_w$ corresponding to this phase difference $\Delta\phi_w$ to the above-mentioned central control system 216 shown in FIG. 5.

When the CPU 110 processes waveform data in the RAMs 102 and 106, it fetches waveform data in correspondence with the number of sampling points on the waveforms to be used in arithmetic operations on the basis of the common multiple=100·N (μsec.) and the frequency Fck (e.g., 200 kHz) of the clock pulse CK. A period Tc of the frequency Fck is $10^6$/Fck (μsec.), and if Fck=200 kHz, Tc=5 (μsec.). Therefore, from the ratio (100/Tc) of a minimum value=100 of common multiples for N=1 to the period, waveform data corresponding to at least 20 points (for 20 clock pulses CK) need only be fetched. However, since data for 20 points corresponds to only two periods of each of the waveforms of the signals $S_w$ and $SR_w$, the averaging effect in the arithmetic operation is low. Thus, if data for 20 periods of the waveforms of the signals $S_w$ and $SR_w$ are used in consideration of the averaging effect, N=10. At this time, the common multiple is 1,000 (μsec.), and the number of points is 200 (1,000/Tc).

The CPU 110 begins to fetch data for 200 points from the same sampling points on waveform data in the RAMs 102 and 106 as a start point, and performs the following arithmetic operations. In this embodiment, a Fourier integration is performed since a phase difference between the fundamental frequencies (sine waves) in a predetermined interval is calculated. When the amplitude of the reference signal $SR_w$ is represented by $E_0$, the reference signal $SR_w$ is given by:

$$Signal\ SR_w: E_0 \sin(\omega t + \Delta\theta_0) \quad (1)$$

The angular velocity ω can be uniquely determined from Δfw. The phase component $\Delta\theta_0$ is a phase shift with reference to the start point of a waveform portion of the signal $SR_w$ to be fetched. The CPU 110 prepares waveform data tables (at the same sampling interval as the signal $SR_w$) of a sine wave Asinωt and a cosine wave Acosωt, which have the same angular velocity ω, a phase shift=0 at the start point, and an amplitude A, and executes the following arithmetic operations when the number k of sampling points of the waveform is 1 to n:

$$Dr = \sum_{k=1}^{n} [E_0\sin(\omega tk + \Delta\theta_0) \cdot A\cos\omega tk] \quad (2)$$

$$Di = \sum_{k=1}^{n} [E_0\sin(\omega tk + \Delta\theta_0) \cdot A\sin\omega tk] \quad (3)$$

The integration interval of these equations (2) and (3) corresponds to 200 points (n=200) from the start point address in the RAM 106 in this embodiment. The values Dr and Di calculated by equations (2) and (3) are components in the corresponding coordinate axis directions when the signal $SR_w$ is converted into a vector on the polar coordinate system with reference to the start point. Also, the values Dr and Di are respectively a real number part (Dr) and an imaginary number part (Di) on the complex plane.

The CPU 110 calculates the phase component $\Delta\theta_0$ with reference to the start point of the sampled signal $SR_w$ as follows:

$$\Delta\theta_0 = \tan^{-1}(Di/Dr) \quad (4)$$

Similarly, the CPU 110 calculates a phase component $\Delta\theta_w$ with reference to the start point of the sampled signal $S_w$ by the same scheme as in equations (2) to (4). Finally, the CPU 110 calculates the phase difference $\Delta\phi_w$ between the signal $SR_w$ and the signal $S_w$ on the basis of the two phase components $\Delta\theta_0$ and $\Delta\theta_w$.

$$\Delta\phi_w = \Delta\theta_0 - \Delta\theta_w \quad (5)$$

The phase difference $\Delta\phi_w$ can be immediately converted into a position shift amount ($\Delta X_w$, $\Delta Y_w$) on the basis of the grating pitch $P_{gw}$ of the wafer mark WM. When the reticle and the wafer are aligned relative to each other, the relationship between the phase difference $\Delta\phi_w$ on the wafer side and the phase difference $\Delta\phi_m$ on the reticle side need only be monitored. For this reason, the phase difference need not always be converted into the position shift amount ($\Delta X_w$, $\Delta Y_w$).

In the first to sixth embodiments described above, the two beams $LB_{r1}$ and $LB_{r2}$ for radiating the reticle marks $RM_a$ and $RM_b$ or the two beams $LB_{w1}$ and $LB_{w2}$ for radiating the wafer mark WM are beams coherent to each other, but may be beams in complementary polarization states having no coherence. In this case, no interference fringes are formed on the wafer mark WM, the reference grating plate 20, or the monitor grating plate 13 upon crossing of the two beams, and the interference beam BTW from the wafer mark does not have a beat frequency. Thus, two 1st-order diffracted light components in the complementary polarization states merely propagate coaxially. However, detectors (halfwave plates, polarization beam splitters, or the like) may be arranged immediately before the photoelectric detectors 14, 18, 21, and 22 to convert the complementary polarization states of the two diffracted light components into those including components which interfere with each other, thereby obtaining AC signals whose amplitudes change at beat frequencies.

In addition, different laser light sources for the reticle and wafer beams may be used like in FIGS. 11A and 11B in addition to a method of eliminating interference between the reticle and wafer beams by the frequency shift technique using the four AOMs shown in FIGS. 15A and 15B.

In each of the above embodiments, the description has been made premised on the alignment system described in Ser. No. 687,944 (Apr. 19, 1991). The beam output system of each of the above embodiments may be directly applied to an alignment system described in, e.g., Ser. No. 888,828

(May 27, 1991). In this alignment system, a glass plate (FIG. 19) having three deflection members (diffraction gratings) is arranged near the pupil plane FP of the projection optical system PL, so that two laser beams propagating toward the wafer are deflected by the two diffraction grating to cross on a wafer mark, and ±1st-order diffracted light components (interference light) generated from the mark are deflected by the remaining diffraction grating to pass through the transparent window of the reticle. Therefore, the two beams $LB_{r1}$ and $LB_{r2}$ for the reticle marks cross on the wafer mark, and the two beams $LB_{w1}$ and $LB_{w2}$ for the wafer mark also cross on the wafer mark.

Figure 17:
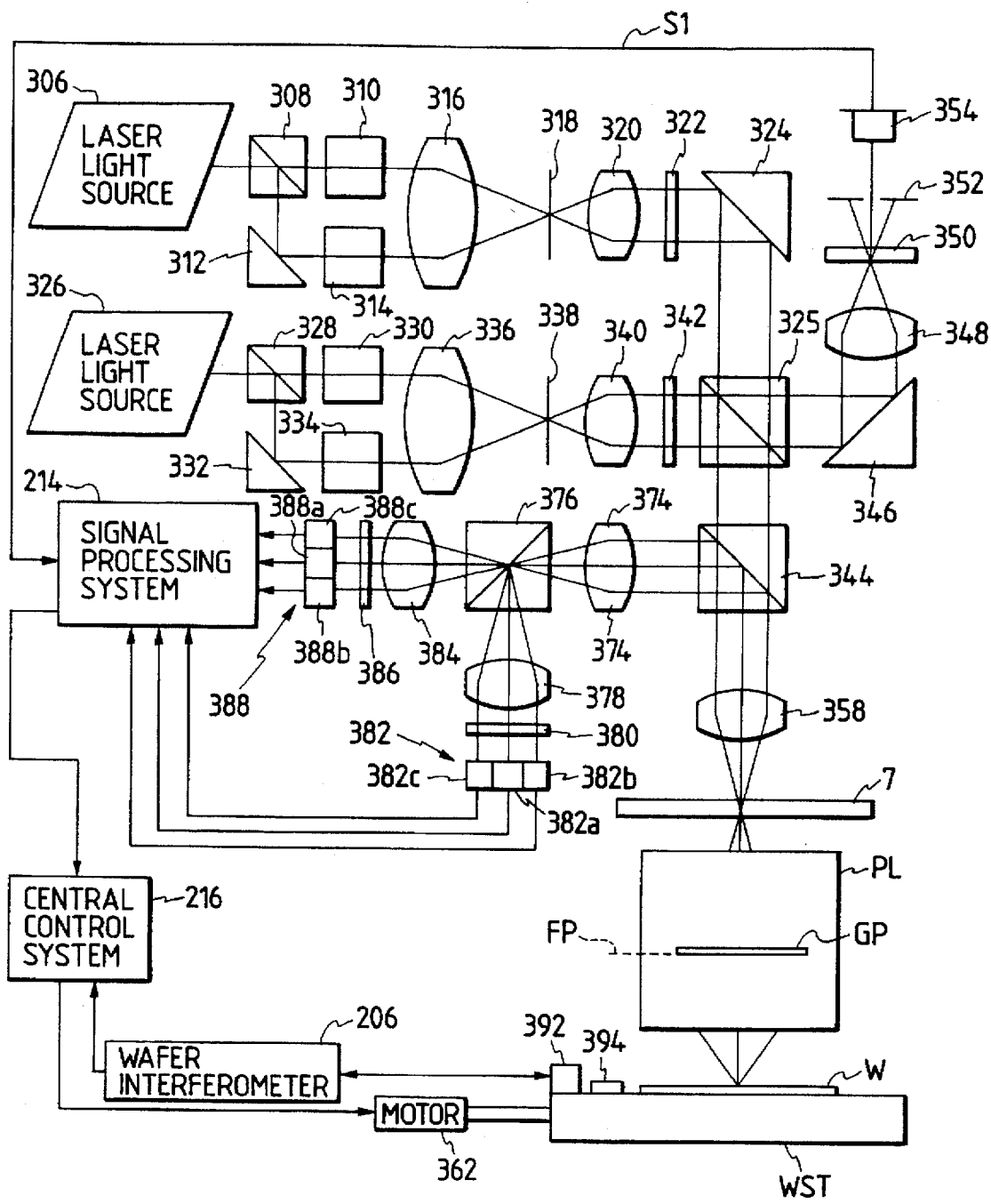
FIG. 17 is a diagram showing the arrangement of the overall projection exposure apparatus comprising an alignment system according to the seventh embodiment of the present invention.

The seventh embodiment of the present invention will be described below with reference to FIG. 17. FIG. 17 is a diagram showing the arrangement of the overall projection exposure apparatus comprising an alignment system of this embodiment, and the same reference numerals in FIG. 17 denote the same parts as in FIG. 5. In FIG. 17, a laser beam (linearly polarized light) emitted from a laser light source 306 is split by a beam splitter 308. A beam transmitted through the beam splitter 308 is incident on an acoustooptic element (AOM) 310, and a beam reflected by the beam splitter 308 is incident on an acoustooptic element (AOM) 314 via a mirror 312.

The two AOMs 310 and 314 are respectively driven at frequencies $F_{11}$ and $F_{12}$, and only 1st-order diffracted light components emerging from the AOMs 310 and 314 are incident on a lens 316. Therefore, frequencies $f_{11}$ and $f_{12}$ of two first beams emerging from the AOMs 310 and 314 are determined as follows with respect to a frequency $f_{10}$ of the laser beam emitted from the laser light source 306:

$$f_{11}=f_{10}+F_{11}$$

$$f_{12}=f_{10}+F_{12}$$

Furthermore, a frequency difference $\Delta f_1$ between the two first beams is given by:

$$\Delta f_1 = f_{11}-f_{12}=F_{11}-F_{12}$$

The two first beams (linearly polarized light) emerging from the lens 316 cross on a field stop 318, and thereafter, are incident on a polarization beam splitter 325 as circularly polarized light via a lens 320, a halfwave plate 322, and a mirror 324. The two first beams are split by the polarization beam splitter 325 into p-polarized beams and s-polarized beams. The two s-polarized beams are reflected by the polarization beam splitter 325, and are incident on an objective lens 348 via a mirror 346. On the other hand, the two p-polarized beams are transmitted through the polarization beam splitter 325, and are incident on a beam splitter 344.

A laser beam (linearly polarized light) emitted from a laser light source 326 is split by a beam splitter 328. A beam transmitted through the beam splitter 328 is incident on an acoustooptic element (AOM) 330, and a beam reflected by the beam splitter 328 is incident on an acoustooptic element (AOM) 334 via a mirror 332. The two AOMs 330 and 334 are respectively driven at frequencies $F_{21}$ and $F_{22}$, and only 1st-order diffracted light components emerging from the AOMs 330 and 334 are incident on a lens 336. Therefore, frequencies $f_{21}$ and $f_{22}$ of two second beams emerging from the AOMs 330 and 334 are determined as follows with respect to a frequency $f_{20}$ of the laser beam emitted from the laser light source 326:

$$f_{21}=f_{20}+F_{21}$$

$$f_{22}=f_{20}+F_{22}$$

Furthermore, a frequency difference $\Delta f_2$ between the two second beams is given by:

$$\Delta f_2 = f_{21}-f_{22}=F_{21}-F_{22}$$

In this embodiment, the frequency difference $\Delta f_1$ between the two first beams and the frequency difference $\Delta f_2$ between the two second beams are set to satisfy the following equation:

$$m\Delta f_1=n\Delta f_2 \text{ } (m\neq n, \text{ and } m \text{ and } n \text{ are integers})$$

The two second beams (linearly polarized light) emerging from the lens 336 cross on a field stop 338, and thereafter, are incident on the polarization beam splitter 325 as circularly polarized light via a lens 340 and a halfwave plate 342. The two second beams are split into p-polarized beams and s-polarized beams by the polarization beam splitter 325. The two p-polarized beams are transmitted through the polarization beam splitter 325, and are incident on the objective lens 348 via the mirror 346. On the other hand, the two s-polarized beams are reflected by the polarization beam splitter 325, and are incident on the beam splitter 344.

The two first beams (s-polarized beams) and the two second beams (p-polarized beams) reflected by the mirror 346 radiate a reference grating plate 350 at a predetermined crossing angle via the objective lens 348. On the reference grating plate 350, a transmission type diffraction grating is formed at a predetermined pitch in a direction (the right-and-left direction in the plane of drawing) perpendicular to the incident surface of the four laser beams. Of light components generated from the diffraction grating upon radiation of the two first beams, interference light between diffracted light components (±1st-order diffracted light components) generated in the same direction (a direction perpendicular to the reference grating plate 350 in FIG. 17) is transmitted through a slit 352, and is incident on a light-receiving element 354. Similarly, of light components generated from the diffraction grating upon radiation of the two second beams, interference light between diffracted light components (±1st-order diffracted light components) generated in the same direction as the interference light is transmitted through the slit 352, and is incident on the light-receiving element 354. Therefore, the light-receiving element 354 outputs a signal S1 obtained by synthesizing a sinusoidal photoelectric signal which periodically changes at the frequency $\Delta f_1$, and a sinusoidal photoelectric signal which periodically changes at the frequency $\Delta f_2$ to an alignment signal processing system 214.

Assume that the pitch of the diffraction grating on the reference grating plate 350 is set to be twice the pitch of interference fringes formed by the two beams. When the first and second beams have different frequencies, two diffraction gratings having different pitches are formed on the reference grating plate 350, or one diffraction grating is formed on the reference grating plate 350, and the two first beams incident on the diffraction grating are set to have a different crossing angle from that of the two second beams. As a result, two interference light components (±1st-order diffracted light components) are generated from the reference grating plate 350, and are incident on the light-receiving element 354 without being shielded by the slit 352. Note that the above-mentioned crossing angle can be adjusted by changing the interval between two beams emerging from the two AOMs 310 and 314, or 330 and 334.

Figure 18A:
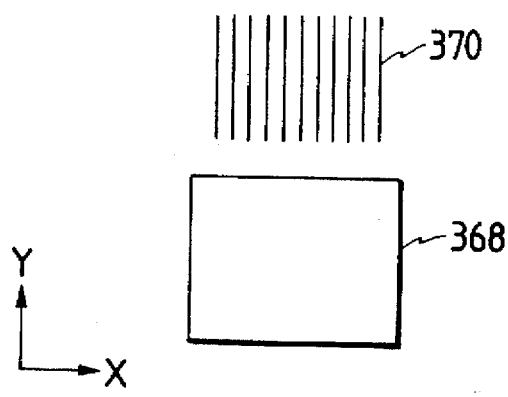
FIGS. 18A and 18B are plan views respectively showing a mark and window on a reticle and a mark on a wafer in FIG. 17.
Figure 18B:
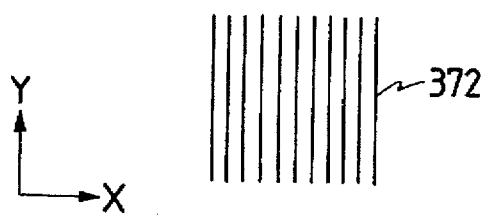

The two first beams (p-polarized beams) and the two second beams (s-polarized beams) emerging from the polarization beam splitter 325 are radiated on a reticle 7 via the beam splitter 344 and an objective optical system 358. The objective optical system 358 has a bi-focal element, so that the two first beams cross on a grating mark (FIG. 18A) of the reticle 7, and the two second beams are transmitted through a transparent window 368 (FIG. 18A) formed adjacent to a grating mark 370, and a projection optical system PL, and cross on a grating mark 372 (FIG. 18B) of the wafer W. When the first and second beams have different wavelengths, the above-mentioned beam output system may be constituted as an achromatic system (corrected for a chromatic aberration).

Therefore, interference fringes are formed by the two first beams on the grating mark 370 of the reticle 7, and move at a speed corresponding to the frequency difference $\Delta f_1$. The grating mark 370 is formed, so that its pitch $P_{Rg}$ and the pitch $P_{Rf}$ of the interference fringes satisfy a relationship $P_{Rg}=2P_{Rf}$. For this reason, diffracted light components generated from the grating mark 370 in the same direction (in a direction perpendicular to the reticle 7 in FIG. 17), i.e., ±1st-order diffracted light components (interference light) are incident on a beam splitter 376 via the objective optical system 358, the beam splitter 344, and a lens 374.

On the other hand, interference fringes are formed by the two second beams on the grating mark 372 of the wafer W, and move at a speed corresponding to the frequency difference $\Delta f_2$. The grating mark 372 is formed, so that its pitch $P_{Wg}$ and the pitch $P_{Wf}$ of the interference fringes satisfy a relationship $P_{Wg}=2P_{Wf}$. For this reason, ±1st-order diffracted light components (interference light) generated from the grating mark 372 in the same direction (the optical axis direction of the projection optical system PL) are incident on the beam splitter 376 via the projection optical system PL, the reticle 7 (transparent window 368), the objective optical system 358, the beam splitter 344, and the lens 374.

When the first and second beams have different wavelengths, the crossing angle of the two first beams is set to be different from that of the two second beams like in the reference grating plate 350, thereby generating two interference light components in substantially the same direction. In this case, the grating marks 370 and 372 can be set to have the same pitch, and more specifically, to satisfy a relationship $P_{Rg}=P_{Wg}/M$ in consideration of a magnification M of the projection optical system PL.

The reflection surface (junction surface) of the beam splitter 376 is arranged in a plane conjugate with the pattern surface of the reticle 7, and a reflection surface is formed by, e.g., a chromium film on a portion (a position conjugate with the reticle mark 370) of the junction surface. Therefore, the ±1st-order diffracted light components (interference light) from the reticle mark 370 are reflected by the beam splitter 376, and are incident on a light-receiving element 382, i.e., a light-receiving surface 382a via a lens 378 and a polarization plate 380. The polarization plate 380 prevents light (s-polarized light components) generated from the wafer mark 372, the transparent window 368, and the like from becoming incident on the light-receiving element 382. In this embodiment, only light generated from the reticle mark 370 is incident on the light-receiving element 382 by the beam splitter 376 and the polarization plate 380, and mixing of noise components can be remarkably eliminated.

The light-receiving element 382 has three light-receiving surfaces 382a to 382c, and the central light-receiving surface 382a receives the ±1st-order diffracted light components from the reticle mark 370. On the other hand, the light-receiving surface 382b receives interference light between +2nd-order diffracted light and 0th-order diffracted light generated from the reticle mark 370, and the light-receiving surface 382c receives interference light between 0th-order diffracted light and −2nd-order diffracted light. Each of the three light-receiving surfaces 382a to 382c outputs a sinusoidal photoelectric signal, which periodically changes at the frequency $\Delta f_1$, to the alignment signal processing system 214. The signal processing system 214 detects a phase difference on a waveform between the photoelectric signal from, e.g., the light-receiving surface 382a and the photoelectric signal S1 from the light-receiving element 354. At this time, in practice, the system extracts a signal component of the frequency $\Delta f_1$ from the photoelectric signal S1, and performs phase difference detection with reference to the extracted signal component.

On the other hand, the ±1st-order diffracted light components (interference light) from the wafer mark 372 are transmitted through the beam splitter 376, and are incident on a light-receiving element 388, i.e., a light-receiving surface 388a via a lens 384 and a polarization plate 386. The polarization plate 386 prevents light (p-polarized light components) generated from the reticle mark 370, and the like from becoming incident on the light-receiving element 388. In this manner, only light generated from the wafer mark 372 is incident on the light-receiving element 388 by the beam splitter 376 and the polarization plate 386, and mixing of noise components can be remarkably eliminated.

The light-receiving element 388 has three light-receiving surfaces 388a to 388c like in the light-receiving element 382, and the central light-receiving surface 388a receives ±1st-order diffracted light components generated from the wafer mark 372. On the other hand, the light-receiving surface 388b receives interference light between +2nd-order diffracted light and 0th-order diffracted light generated from the wafer mark 372, and the light-receiving surface 388c receives interference light between 0th-order diffracted light and −2nd-order diffracted light. Each of the three light-receiving surfaces 388a to 388c outputs a sinusoidal photoelectric signal, which periodically changes at the frequency $\Delta f_2$, to the alignment signal processing system 214. The signal processing system 214 detects a phase difference on a waveform between the photoelectric signal from, e.g., the light-receiving surface 388a and the photoelectric signal S1 from the light-receiving element 354. At this time, in practice, the system extracts a signal component of the frequency $\Delta f_2$ from the photoelectric signal S1, and performs phase difference detection with reference to the extracted signal component.

A central control system 216 calculates a relative position shift amount between the reticle 7 and the wafer W on the basis of the two phase differences calculated by the signal processing system 214, and moves the reticle 7 and the wafer W relative to each other so that the shift amount becomes zero. In this embodiment, the reflection surface is formed on a portion of the junction surface of the beam splitter 376, and light from the reticle mark 370 and light from the wafer mark 372 are split by the reflection surface. However, when the beam splitter 376 comprises a polarization beam splitter, the two light components can be split without forming the reflection surface. At this time, light (p-polarized beam) from the reticle mark 370 is transmitted through the polarization beam splitter and is incident on the light-receiving element 388, and light (s-polarized light) from the wafer mark 372 is reflected by the polarization beam splitter and is incident on the light-receiving element 382.

Meanwhile, it is difficult to perfectly split light from the reticle mark 370 and light from the wafer mark 372 even using the beam splitter 376 and the polarization plates 380 and 386. For this reason, signal components having the frequencies $\Delta f_2$ and $\Delta f_1$ are respectively mixed in the photoelectric signals output from the light-receiving elements 382 and 388, and detection precision is inevitably decreased in phase difference detection in this state.

However, in this embodiment, since the frequency differences $\Delta f_1$ and $\Delta f_2$ are set to satisfy the relationship $m\Delta f_1 = n\Delta f_2$ ($m \neq n$, and m and n are integers), periodic functions as the signal components of the frequencies $\Delta f_1$ and $\Delta f_2$ can have an orthogonal relationship therebetween, and phase information can be detected in units of signal components. More specifically, the signal processing system 214 detects a phase difference from the photoelectric signal from the light-receiving element 382 with reference to a reference signal of the frequency $\Delta f_1$, and integrates the detection result during only an interval of a common multiple (e.g., the least common multiple) of periods $1/\Delta f_1$ and $1/\Delta f_2$, thereby detecting the position shift. In this manner, the signal processing system 214 can reliably detect the phase difference even when the signal component of the frequency $\Delta f_2$ is mixed in the photoelectric signal output from the light-receiving element 382.

Similarly, the signal processing system 214 detects a phase difference from the photoelectric signal from the light-receiving element 388 with reference to a reference signal of the frequency $\Delta f_2$, and integrates the detection result during only an interval of the least common multiple of the periods $1/\Delta f_1$ and $1/\Delta f_2$, thereby detecting the position shift. In this manner, the signal processing system 214 can reliably detect the phase difference even when the signal component of the frequency $\Delta f_1$ is mixed in the photoelectric signal output from the light-receiving element 388.

The signal processing system 214 detects a phase difference $\Delta \phi$ using the following equation:

$$\Delta \phi = (\phi_W - \phi_{REF2}) - (\phi_R - \phi_{REF1})$$

where $\phi_R$ and $\phi_W$ are the phases of the photoelectric signals from the light-receiving elements 382 and 388, and $\phi_{REF1}$ and $\phi_{REF2}$ are the phases of the photoelectric signal S1 from the light-receiving element 354, i.e., signal components (reference signals) of the frequencies $\Delta f_1$ and $\Delta f_2$.

Furthermore, when the phase difference $\Delta \phi$ is obtained, the central control system 216 calculates a relative position shift amount $\Delta x$ in the X-direction between the reticle 7 and the wafer W using the following equation:

$$\Delta x = 4 \pi \Delta \phi P_{R_g}$$

Since this embodiment uses the two phases $\phi_{REF1}$ and $\phi_{REF2}$ of the photoelectric signal S1, even when the characteristics of the four AOMs 310, 314, 330, and 334, and the like are changed, and the beam positions and laser beam output angles vary, the position shift amount $\Delta x$ can be reliably detected. More specifically, when the output angle of, e.g., the laser light source 306 varies, this variation influences the phase $\phi_R$ of the photoelectric signal from the light-receiving element 382. However, since this influence appears in the phase $\phi_{REF1}$ of the reference signal S1, the influence can be canceled upon calculation of the phase difference $\Delta \phi$, and the position shift amount $\Delta x$ can always be calculated with high precision. For example, when the position of the reference grating plate 350 is changed, since the influence of the change similarly appears in the two phases $\phi_{REF1}$ and $\phi_{REF2}$ of the photoelectric signal S1, a decrease in detection precision of the position shift amount $\Delta x$ due to the above-mentioned change can be prevented.

Upon detection of the position shift amount $\Delta x$, the central control system 216 drives a motor 362 on the basis of the detection result to finely move a wafer stage WST, so that the relative position shift amount between the reticle 7 and the wafer W becomes almost zero. A movable mirror 392 for reflecting a laser beam emitted from a wafer interferometer 306 is arranged at an end portion of the wafer stage WST. In practice, movement between adjacent shot areas is preferably attained by the wafer stage WST, and alignment between the reticle 7 and each shot area is preferably attained by a reticle stage RST.

Since the measurement value of the interferometer may drift by the influence of, e.g., air fluctuation, the output from the interferometer is not used during alignment between the reticle 7 and the wafer W, an exposure operation, and the like, and the reticle 7 or the wafer W is preferably servo-controlled using the direct output from the alignment system (signal processing system 214). Therefore, even during the exposure operation, the relative position shift amount between the reticle 7 and the wafer W can always be suppressed to almost zero.

Furthermore, the signal processing system 214 performs phase difference detection using one of a signal obtained by adding photoelectric signals from the light-receiving surfaces 388b and 388c, and the photoelectric signal from the light-receiving surface 388a, e.g., a signal having a larger signal level (amplitude). The same applies to the photoelectric signals from the light-receiving element 382. Therefore, the detection precision of the position shift amount can be improved as compared to a case wherein only photoelectric signals from the light-receiving surfaces 382a and 388a are used.

Note that the laser light sources 306 and 326 may have either the same wavelength or different wavelengths. In particular, when the laser light sources have different wavelengths, the optical members constituting the alignment system must be subjected to chromatic aberration correction for the two wavelengths. Only one light-receiving element 354 for generating a reference signal is used. However, two light-receiving elements (or two light-receiving surfaces) may be arranged in correspondence with the first and second beams. In this case, a field stop is preferably arranged in a plane substantially conjugate with the reticle 7 or the wafer W.

Figure 19:
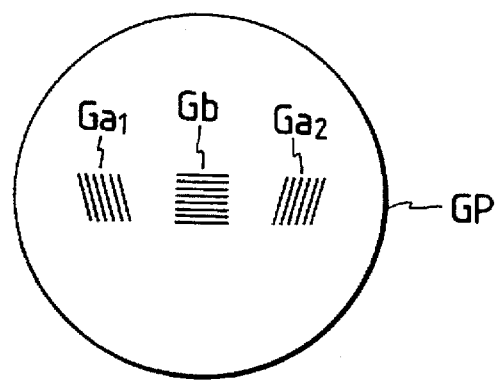
FIG. 19 is a plan view showing the details of a glass plate arranged near a pupil plane of a projection optical system.

With the above-mentioned arrangement, since the position shift amount is detected using the two pairs of laser beams held in a predetermined frequency relationship, mixing of noise components can be remarkably eliminated, and alignment precision can be improved. In this embodiment, the objective optical system 358 has a bi-focal element. However, as described in, e.g., Ser. No. 888,828 (May 27, 1992), if a glass plate GP comprising three diffraction gratings is arranged near the pupil plane FP of the projection optical system PL in FIG. 17, the bi-focal element need not be used. FIG. 19 shows an example of the glass plate GP.

As shown in FIG. 19, three diffraction gratings $G_{a1}$, $G_{a2}$, and $G_b$ are formed on the glass plate GP. The two second beams, which cross on the transparent window 368 of the reticle 7, and are incident on the projection optical system PL, are deflected by the diffraction gratings $G_{a1}$ and $G_{a2}$, and are radiated on the wafer mark 372 at a predetermined crossing angle. Furthermore, light components generated from the wafer mark 372, e.g., ±1st-order diffracted light components, are incident on the projection optical system PL, are deflected by the diffraction grating $G_b$, and are transmitted through the transparent window 368. When the above-mentioned glass plate GP is used, even when the two second beams have a different wavelength from that of exposure light IL, the two second beams can cross on both the transparent window 368 and the wafer mark 372.

Figure 20:
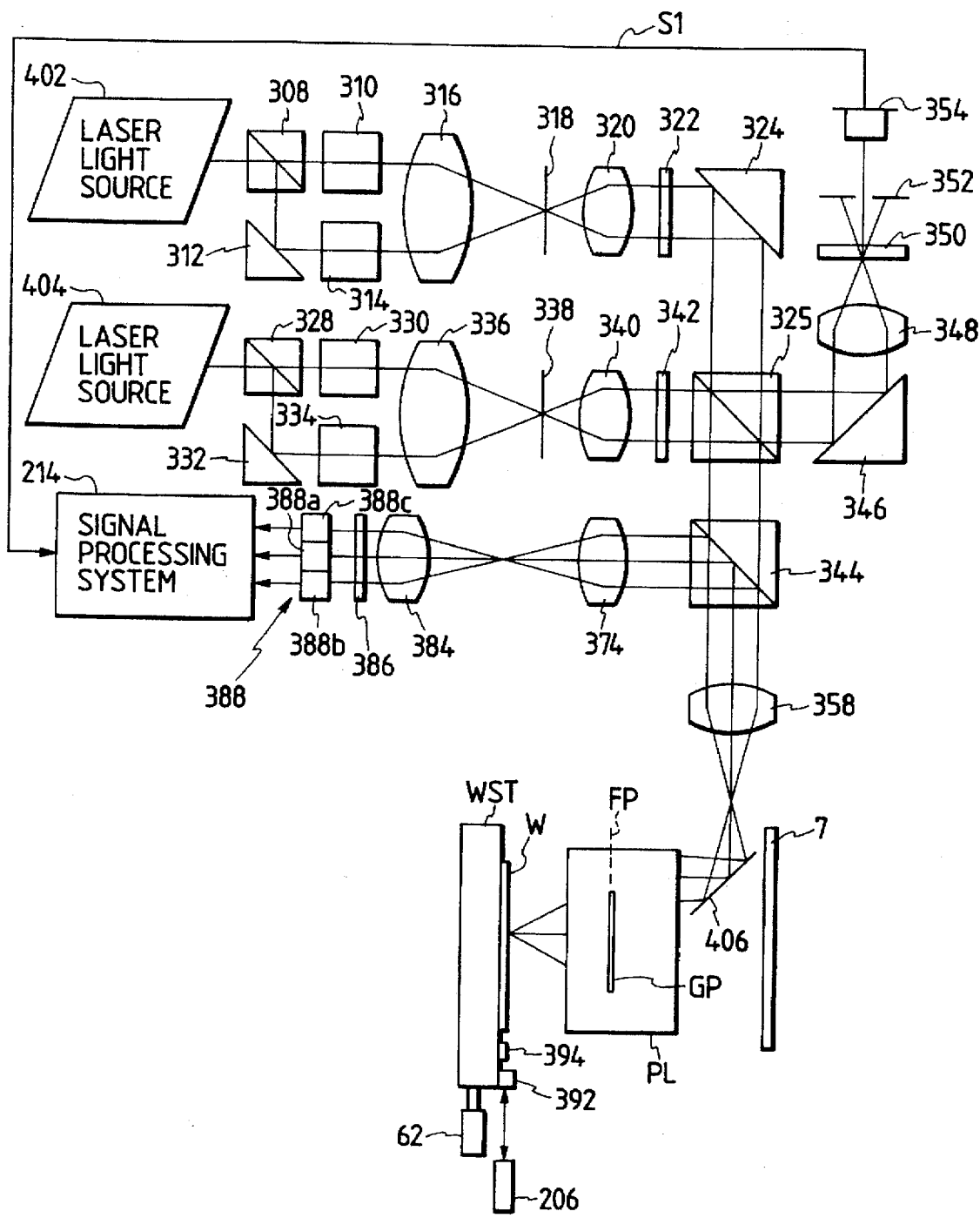
FIG. 20 is a diagram showing the arrangement of the overall projection exposure apparatus comprising an alignment system according to the eighth embodiment of the present invention.

The eighth embodiment of the present invention will be described below with reference to FIG. 20. FIG. 20 is a diagram showing the arrangement of the overall projection exposure apparatus comprising an alignment system of this embodiment. The same reference numerals in FIG. 20 denote the same parts as in FIG. 17, and a detailed description thereof will be omitted. Differences between this embodiment and the seventh embodiment are that the wavelengths of two laser light sources 402 and 404 are largely different from each other, and that a so-called TTL alignment system for radiating two first beams and two second beams onto only a wafer W via a mirror 406 and a projection optical system PL, is employed. The laser light source 402 comprises an He—Ne laser (wavelength=633 nm), and the laser light source 404 comprises a semiconductor laser (wavelength=670 nm).

With the above arrangement, two first beams (frequency difference $\Delta f_1$) are generated from the laser beam of the wavelength of 633 nm, two second beams (frequency difference $\Delta f_2$) are generated from the laser beam of the wavelength of 670 nm, and these laser beams are radiated onto the wafer W via the mirror 406 and the projection optical system PL. Therefore, even when a position shift amount cannot be detected by one pair of laser beams due to thin film interference of a resist film, the position shift amount can be detected by the other pair of laser beams.

A signal processing system 214 extracts a signal component of a frequency $\Delta f_1$ or $\Delta f_2$ from a photoelectric signal output from a light-receiving element 388, and detects a phase difference on a waveform between the extracted signal component and a photoelectric signal S1 output from a light-receiving element 354, i.e., a reference signal having a frequency $\Delta f_1$ or $\Delta f_2$. A central control system 216 calculates a position shift amount of the wafer W based on the phase difference. In FIG. 20, only one light-receiving element 388 is arranged. However, when a polarization beam splitter is arranged between lenses 374 and 384, light generated from a wafer mark 372 upon radiation of the two first beams, and light generated from the wafer mark 372 upon radiation of the two second beams may be photoelectrically detected by independent light-receiving elements. Since the first and second beams have different wavelength, their crossing angles on the wafer mark 372 are different from each other.

According to the above arrangement, since two pairs of laser beams having a considerably large wavelength difference therebetween are radiated onto an object to be measured, even when a resist layer, and the like are formed on the surface of the object to be measured, the position shift amount can be reliably detected. Note that this embodiment adopts the TTL system but may adopt an off-axis system. A glass plate GP (FIG. 19) may be arranged near a pupil plane FP of the projection optical system PL, and the two pairs of laser beams may be radiated onto the wafer mark using the diffraction grating on the glass plate GP. In this case, when the projection optical system PL is for an i-line, since the chromatic aberration amount is small, relatively large three diffraction gratings can be formed. However, when the projection optical system PL is for a KrF or ArF excimer laser, since the chromatic aberration amount is large, three diffraction gratings can be formed on each of two glass plates GP in correspondence with the two wavelengths (633 nm and 670 nm). Furthermore, this embodiment may be applied to the apparatus according to the seventh embodiment (FIG. 17), i.e., a plurality of pairs of beams having different wavelengths may be radiated onto the wafer mark 372.

Figure 21:
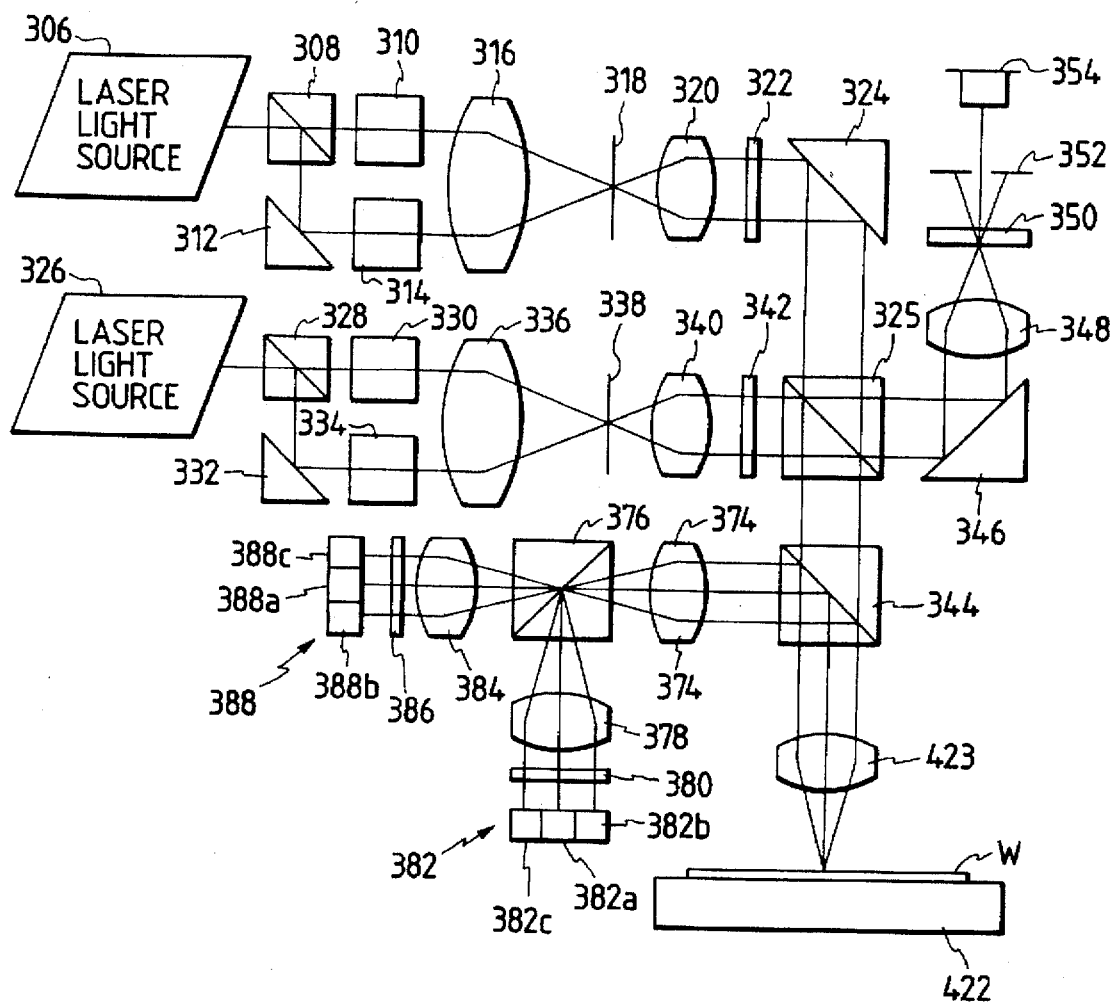
FIG. 21 is a diagram showing the arrangement of a registration measurement apparatus (alignment system) according to the ninth embodiment of the present invention.

The ninth embodiment of the present invention will be described below with reference to FIG. 21. In the ninth embodiment, the present invention is applied to a registration measurement apparatus. FIG. 21 shows the arrangement of the overall registration measurement apparatus of this embodiment. The same reference numerals in FIG. 21 denote the same parts as in FIG. 17, and a detailed description thereof will be omitted. The registration measurement apparatus is used in measurement of, e.g., stepping precision of a wafer stage WST. In this embodiment, the measurement operation of stepping precision will be briefly described below. Note that a measurement operation of this type is disclosed in, e.g., U.S. Pat. No. 4,803,524.

Figure 22:
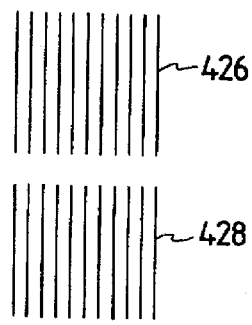
FIG. 22 is a plan view showing marks on a wafer in FIG. 21.

In a projection exposure apparatus shown in FIG. 5, a measurement mark (e.g., a grating mark 372) on a reticle 7 is exposed onto a wafer W. Furthermore, after the wafer stage WST is moved by a predetermined distance, the measurement mark described above is re-exposed onto the wafer W. As a result, two measurement mark images are formed on a resist film on the wafer, and the two measurement mark resist images are formed on the wafer W by development. After the wafer W formed with two resist images 426 and 428 (FIG. 22) is placed on a stage 422, the positions of the resist images are measured by the registration measurement apparatus. More specifically, in this embodiment, two first beams are radiated onto the resist image 426, and two second beams are radiated onto the resist image 428. ±1st-order diffracted light components generated from the resist images 426 and 428 are photoelectrically detected by light-receiving elements 382 and 388, and phase differences on waveforms between photoelectric signals from the light-receiving elements 382 and 388, and a photoelectric signal from a light-receiving element 354 are detected.

A relative position shift amount between the resist images 426 and 428 is detected from the two phase differences, and the calculated position shift amount is compared with a design moving distance, thus obtaining stepping precision of the wafer stage WST. In this embodiment, the resist images are detected. However, latent images formed on the resist film before development may be detected. In this embodiment, the first and second beams are radiated onto different positions on the wafer. However, these beams may be radiated onto the same position, and the resist images may be detected using the first and second beams. In this case, in order to measure the positions of the two resist images 426 and 428, the stage 422 must be moved, and a laser interferometer, or the like must be provided to the stage 422. As is apparent from FIG. 21, the registration measurement apparatus of this embodiment is an off-axis alignment system itself.

Figure 23:
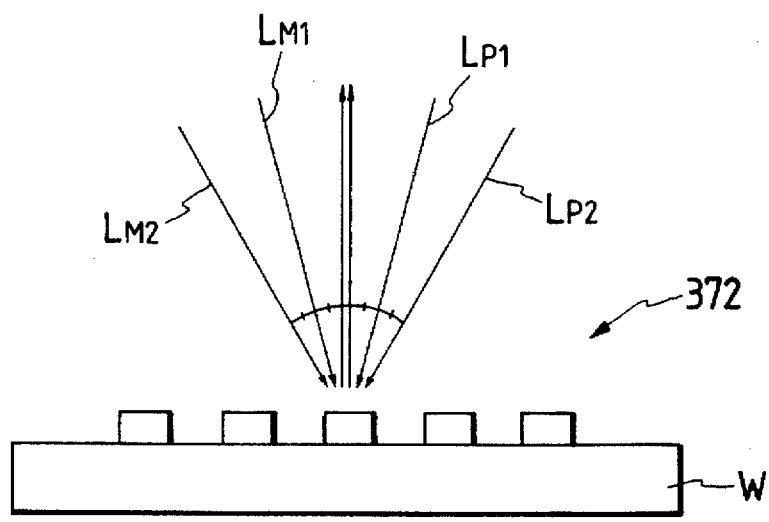
FIG. 23 is a side view showing a state wherein two pairs of beams become incident on the marks on the wafer.

In each of the seventh to ninth embodiments, two laser beams are radiated onto diffraction gratings from directions to generate ±1st-order diffracted light components when the laser beams are radiated onto the diffraction gratings from a position immediately thereabove (in the vertical direction). However, as shown in FIG. 23, the two laser beams may be incident from directions to generate ±2nd-order diffracted light components $L_{P1}$ and $L_{M1}$, or ±3rd-order diffracted light components $L_{P2}$ and $L_{M2}$. Furthermore, three pairs of laser beams may be simultaneously radiated from directions to respectively generate ±1st- to ±3rd-order diffracted light components, and interference light components corresponding to these pairs may be independently photoelectrically detected. Moreover, two laser beams may be incident from directions to generate diffracted light components of ±4th order or higher.

Figure 24:
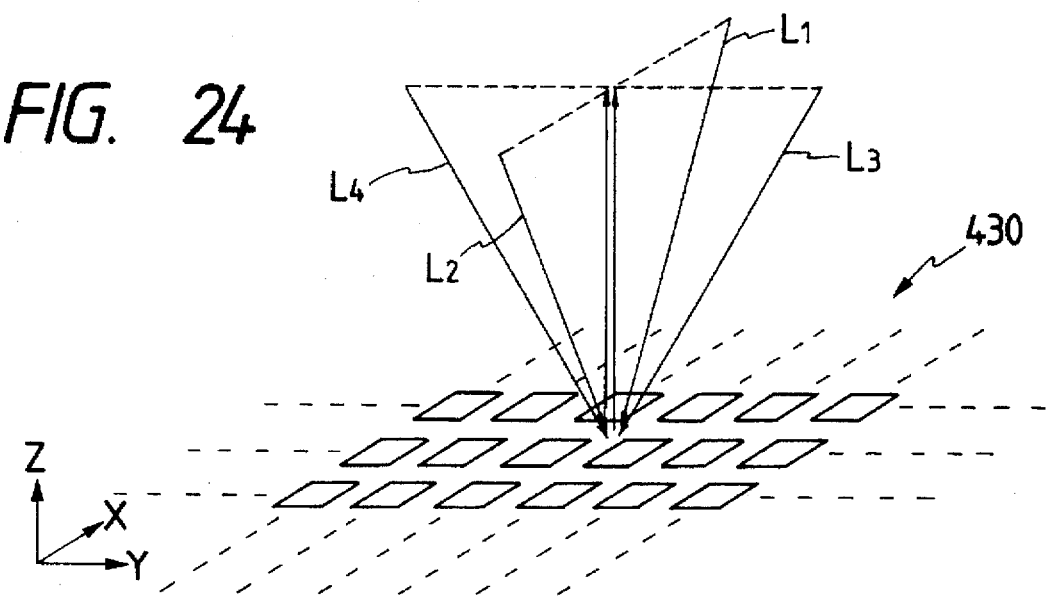
FIG. 24 is a perspective view showing a two-dimensional grating mark.

In each of the above embodiments, a diffraction grating mark defined by arranging a plurality of bar marks at a predetermined pitch is used as the reticle marks and the wafer mark. Alternatively, a checkerboard-like grating mark (two-dimensional diffraction grating mark) 430, as shown in, e.g., FIG. 24, may be used. In this case, when two laser beams L1 and L2, and another two laser beams L3 and L4 are respectively incident from the X- and Y-directions, the position shift amounts in the X- and Y-directions can be simultaneously detected.

In each of the above embodiments, the pitch of the grating mark is set to be twice that of the interference fringes. However, the present invention is not limited to this. For example, the grating pitch may be set to be equal to that of the interference fringes. In this case, interference light between 0th-order diffracted light and +1st-order diffracted light, and interference light between −1st-order diffracted light and 0th-order diffracted light are respectively incident on the light-receiving surfaces 382b and 382c of the light-receiving element 382, and the light-receiving surfaces 388b and 388c of the light-receiving element 388, and the position shift amount is detected based on the two interference light components.

In each of the seventh to ninth embodiments, two laser light sources are used. However, three or more light sources may be used. The present invention may be applied to a method other than the heterodyne method, e.g., a homodyne method, or a method wherein two beams having different polarization directions are radiated onto grating marks, and diffracted light components generated from the marks are detected through a detector. Furthermore, the present invention may be applied to an apparatus other than a projection exposure apparatus, e.g., a proximity or contact exposure apparatus (X-ray exposure apparatus), and also to a step-and-scan exposure apparatus. Note that the projection optical system may be a refraction optical system, a reflection optical system, or a combination of these systems.

Figure 25:
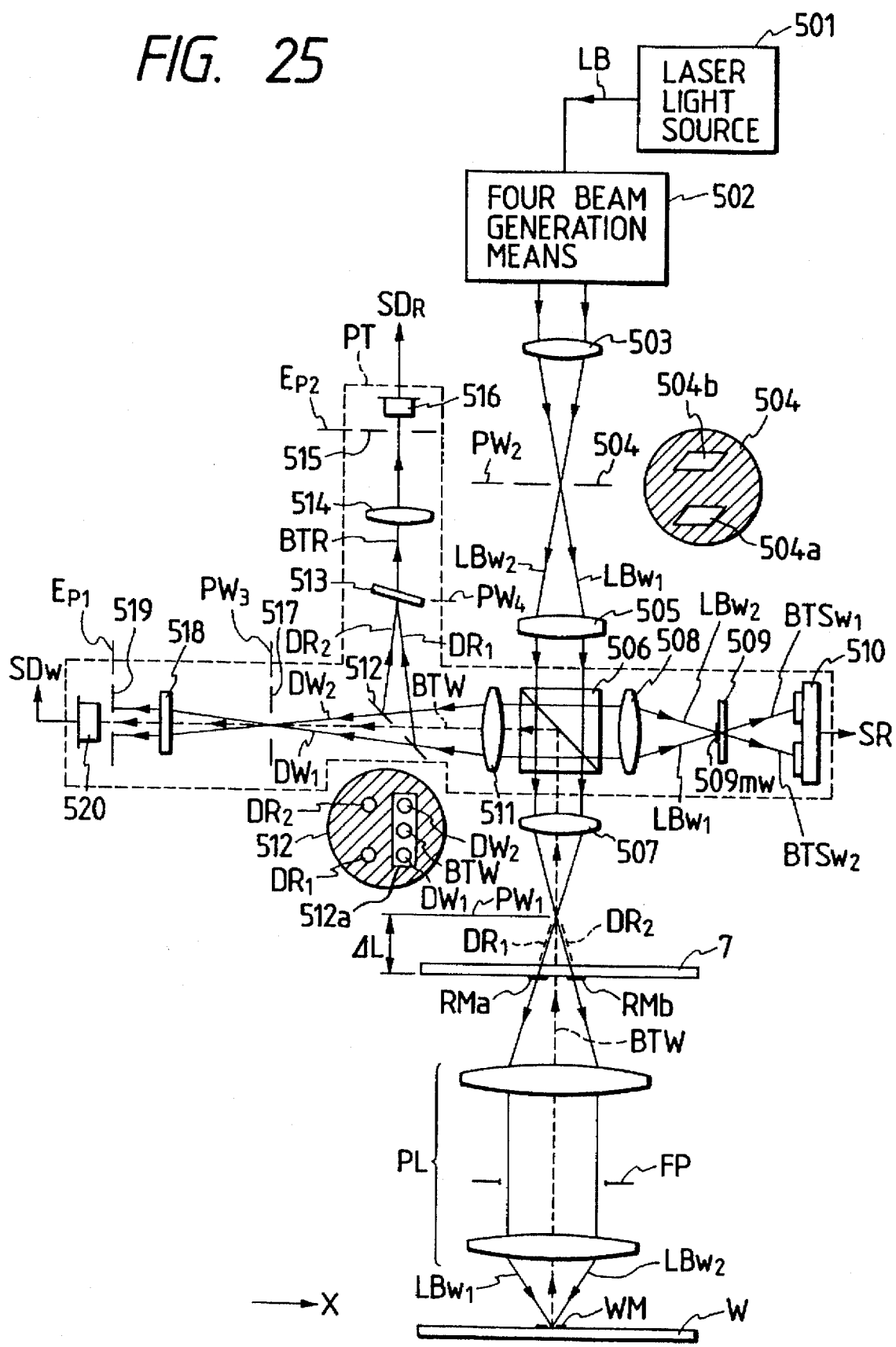
FIG. 25 is a chart showing the arrangement of the overall alignment system according to the tenth embodiment of the present invention.

The tenth embodiment of the present invention will be described below with reference to FIG. 25. FIG. 25 is a schematic view showing the arrangement of an alignment system of this embodiment. Since a projection exposure apparatus which adopts the alignment system of the tenth embodiment has the same arrangement as that shown in FIG. 5, a detailed description thereof will be omitted. The alignment system of this embodiment is a TTR system adopting a heterodyne method, and its basic arrangement is the same as that described in Ser. No. 687,944 (Apr. 19, 1991). The alignment system of this embodiment is movable above a dichroic mirror 6 in correspondence with a change in chip size of a semiconductor element (or a change in illumination field on a reticle 7), or a change in position of reticle marks upon re-formation of a wafer mark.

Figure 26:
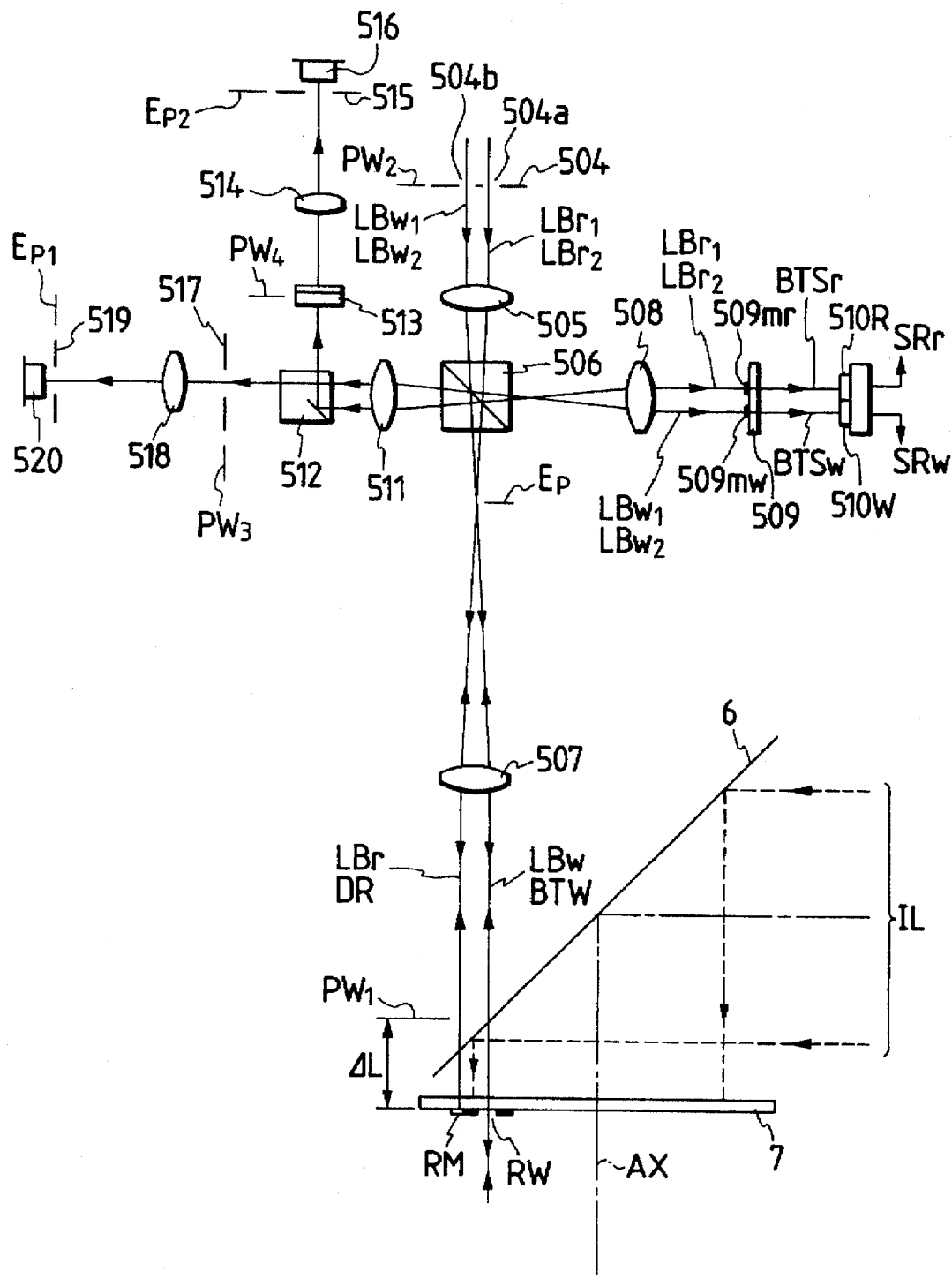
FIG. 26 is a chart showing the details of the alignment system in FIG. 25.

In FIG. 25, since two beams $LB_{r1}$ and $LB_{r2}$ for reticle marks and two beams $LB_{w1}$ and $LB_{w2}$ for a wafer mark overlap each other in a direction perpendicular to the plane of drawing, only the two beams $LB_{w1}$ and $LB_{w2}$ are illustrated. In FIG. 25, a laser light source 501, a four-beam generation means 502, a lens system 503, a field stop 504, and a second objective lens 505 constitute an alignment beam output system 210 shown in FIG. 5, a lens system 508, a reference grating plate 509, and a photoelectric detector 510 constitute a reference signal generator (not shown in FIG. 5). Components from a lens system 511 to a photoelectric detector 520 in the order named constitute an alignment light-receiving system 212. In particular, components from the lens system 511 to a photoelectric detector 516 in the order named constitute a reticle detection system, and components from the lens system 511, a prism 512, and a field stop 517 to the photoelectric detector 520 in the order named constitute a wafer detection system. FIG. 26 is a view when the alignment optical system shown in FIG. 25 is viewed from a direction parallel to the plane of the drawing. In practice, although the reference signal generator and the alignment light-receiving system 212 should be arranged to extend in a direction perpendicular to the plane of drawing in FIG. 26 with reference to FIG. 25, they are illustrated in the same plane of drawing as the alignment beam output system 210 for the sake of simplicity.

As shown in FIG. 25, the laser light source 501 generates alignment illumination light LB, and the four-beam generation means 502 emerges the two beams $LB_{r1}$ and $LB_{r2}$ for the reticle marks, and the two beams $LB_{w1}$ and $LB_{w2}$ for the wafer mark. The illumination light LB is assumed to be a laser beam in a wavelength band different from that of exposure illumination light IL, e.g., an He—Ne laser of a wavelength of 633 nm having substantially no sensitivity with respect to a resist layer. Note that the arrangement of the four-beam generation means 502 is the same as that in the fourth embodiment (FIGS. 13A and 13B), and a detailed description thereof will be omitted.

As shown in FIGS. 25 and 26, the two pairs of laser beams ($LB_{r1}$ and $LB_{r2}$) and ($LB_{w1}$ and $LB_{w2}$) emerging from the four-beam generation means 502 cross on the field stop 504 arranged in a plane (conjugate with a wafer W) $PW_2$ in a state of collimated beams via the lens system 503, pass through parallelogrammic (or rectangular or rhombic) opening portions 504a and 504b, and then reach the second objective lens 505. The two beams $LB_{r1}$ and $LB_{r2}$ cross on a plane (conjugate with the wafer W) $PW_1$ via an output/reception light splitting prism 506 and a first objective lens 507, and are then radiated onto marks $RM_a$ and $RM_b$ on a reticle 7. As shown in FIG. 26, the two beams $LB_{r1}$ and $LB_{r2}$ are set to propagate along inclined optical paths at the position of a front-side focal plane (a plane conjugate with a pupil plane FP of a projection optical system PL) Ep of the first objective lens 507, and to have central lines (equally two dividing lines of the two beams $LB_{r1}$ and $LB_{r2}$) parallel to the optical axis of the first objective lens 507 at positions decentered from the optical axis when they emerge from the first objective lens 507.

The two beams $LB_{w1}$ and $LB_{w2}$ for the wafer mark similarly cross on the plane (conjugate with the wafer) $PW_1$ via the output/reception light splitting prism 506 and the first objective lens 507, pass through a window RW on the reticle 7, and are then incident on the projection optical system PL to be focused into spots on the pupil plane FP of the projection optical system PL. Thereafter, the beams $LB_{w1}$ and $LB_{w2}$ are converted into collimated beams inclined at symmetrical angles to sandwich an optical axis AX therebetween in the pitch direction (X-direction) of a wafer mark WM on the wafer W, and are incident on the wafer mark WM at a predetermined crossing angle from two different directions to be focused (cross) thereon. As shown in FIG. 26, the two beams $LB_{w1}$ and $LB_{w2}$ obliquely pass through the focal plane Ep, and propagate parallel to each other to be separated from the two beams $LB_{r1}$ and $LB_{r2}$ at a predetermined interval when they emerge from the first objective lens 507.

Since this embodiment adopts the heterodyne method, a reference signal is required to detect the position shift amount of the reticle 7 or the wafer W. Thus, as shown in FIGS. 25 and 26, the four beams are partially split at the position of the output/reception light splitting prism 506 in the optical path of the alignment optical system, and the split light components are incident on the reference signal generator, i.e., the lens system (inverse Fourier transform lens) 508. Thus, as shown in FIG. 26, the two beams $LB_{r1}$ and $LB_{r2}$ are converted into collimated beams, and cross on a reference diffraction grating $509_{mr}$ formed on the upper half portion of the reference grating plate 509 arranged at a rear-side focal plane of the lens system 508. On the other hand, the two beams $LB_{w1}$ and $LB_{w2}$ are also converted into collimated beams, and cross on a reference diffraction grating $509_{mw}$ formed on the lower half portion of the reference grating plate 509. As shown in FIG. 26, an interference beam $BTS_r$ formed from the two output beams $LB_{r1}$ and $LB_{r2}$ for the reticle and an interference beam BTSw formed from the two output beams $LB_{w1}$ and $LB_{w2}$ for the wafer are separately generated from the reference grating plate 509, i.e., the reference diffraction gratings $509_{mr}$ and $509_{mw}$, and are independently received by photoelectric detectors 510R and 510W.

As shown in FIG. 25, the photoelectric detector 510W has two light-receiving elements (or a two-split light-receiving element), and is arranged to independently receive (photoelectrically convert) an interference beam $BTS_{w1}$ between 0th-order diffracted light of the beams $LB_{w1}$ passing through the diffraction grating $509_{mw}$ and +1st-order diffracted light of the beam $LB_{w2}$ propagating coaxially therewith, and an interference beam $BTS_{w2}$ between −1st-order diffracted light of the beam $LB_{w1}$ and 0th-order diffracted light of the beam $LB_{w2}$ propagating coaxially therewith. Sinusoidal photoelectric signals according to the intensities of these two interference beams $BTS_{w1}$ and $BTS_{w2}$ are added to each other by an amplifier (not shown), and a photoelectric signal $SR_m$ obtained as a result of the addition becomes a beat signal (AC signal) having a frequency proportional to a frequency difference $\Delta f$ between the beams $LB_{w1}$ and $LB_{w2}$. The grating pitch of the diffraction grating $509_{mw}$ is set to be equal to the pitch of interference fringes formed by the beams $LB_{w1}$ and $LB_{w2}$.

Note that the photoelectric detector 510W may receive the two interference beams $BTS_{w1}$ and $BTS_{w2}$ on a single light-receiving surface, and may output a photoelectric signal according to the intensities of the interference beams added to each other on the light-receiving surface. With this arrangement, the distance between the reference grating plate 509 and the photoelectric detector 510W can be shortened. The two wafer beams $LB_{w1}$ and $LB_{w2}$, the diffraction grating $509_{mw}$, and the photoelectric detector 510W have been described. However, the same applies to the two reticle beams $LB_{r1}$ and $LB_{r2}$, the diffraction grating $509_{mr}$, and the photoelectric detector 510R (FIG. 26), and a detailed description thereof will be omitted. As described above, the reference signals $SR_m$ and $SR_w$ obtained from the photoelectric detectors 510R and 510W are output to an alignment signal processing system 214 (FIG. 5).

The four beams emerging from the first objective lens 507 via the output/reception light splitting prism 506 cross on the plane $PW_1$ (a plane conjugate with the wafer W) in a state of collimated beams, and are radiated onto the reticle 7 while being symmetrically inclined with respect to an optical axis $AX_a$ of the alignment optical system. The two reticle beams $LB_{r1}$ and $LB_{r2}$ are radiated as collimated beams each having a section (parallelogrammic, rectangular, or rhombic section) large enough to cover only the reticle mark $RM_a$ or $RM_b$, and the two wafer beams $LB_{w1}$ and $LB_{w2}$ are radiated as collimated beams each having a section (parallelogrammic, rectangular, or rhombic section) large enough to pass through only the interior of the window RW.

The two wafer beams $LB_{w1}$ and $LB_{w2}$ are set so as not to be radiated onto the edge of the window RW as much as possible. The two wafer beams $LB_{w1}$ and $LB_{w2}$ are incident on the projection optical system PL via the window RW, are focused into spots to be symmetrical about the center of pupil (optical axis AX) on the pupil plane FP of the projection optical system PL, and thereafter, cross on the wafer mark WM, thereby generating interference fringes. From the wafer mark WM, ±1st-order diffracted light components as a beat wave front which repeats a periodic change between bright and dark levels upon movement of the interference fringes are generated. An interference beam (interference light between the ±1st-order diffracted light components) BTW substantially vertically generated from the mark WM is incident on the projection optical system PL, propagates along the optical axis AX in the opposite direction to pass through the center of the pupil plane FP, and passes as collimated light through the central portion of the window RW on the reticle 7.

The interference beam BTW from the wafer mark WM and passing through the window WM is focused into a spot at the central point (a point along the optical axis $AX_a$) in the focal plane Ep via the first objective lens 507, as shown in FIG. 26. Furthermore, the interference beam BTW is reflected by the output/reception light splitting prism 506, and is guided toward the alignment light-receiving system 212 (wafer detection system), i.e., the lens system 511. The interference beam BTW then passes through the prism 512 and the field stop 517 as collimated light.

The prism 512 is arranged in a plane substantially conjugate with the pattern surface of the reticle 7, and separates optical information from the wafer mark WM and optical information from the reticle marks $RM_a$ and $RM_b$. More specifically, the prism 512 comprises a mirror formed with a rectangular opening 512a having substantially the same shape and size as those of the window RW (when the magnification of a composite system of the first objective lens 507 and the lens system 511 is ×1) at the position conjugate with the window RW of the reticle 7. Therefore, the prism 512 allows only optical information (in particular, the interference beam BTW (and 0th-order diffracted light components $DW_1$ and $DW_2$ to be described later) in this embodiment) from the wafer mark WM to pass therethrough, and reflects optical information (1st-order diffracted light components $DR_1$ and $DR_2$ to be described later) from the reticle marks $RM_a$ and $RM_b$ and guides it to the reticle detection system (monitor grating plate 13) to be described later. When the magnification of the composite system is other than ×1, the size of the rectangular opening 512a must be determined according to the magnification. The rectangular opening 512a may be formed to allow only the interference beam BTW to pass therethrough.

The field stop 517 is arranged in a plane $PW_3$, and this plane $PW_3$ is located at a position substantially conjugate with the plane (conjugate with the wafer) $PW_1$ in association with the composite system of the first objective lens 507 and the lens system 511. The field stop 517 is formed with an opening (not shown) having substantially the same shape and size (area) as those of the wafer mark WM at a position (conjugate with the wafer mark WM) decentered from the optical axis $AX_a$ of the alignment optical system in the plane $PW_3$, and cuts noise components (diffracted light components from portions other than the mark WM) by the opening to allow only diffracted light components from the mark WM to pass therethrough. The size of the opening of the field stop 517 is determined according to the size of the wafer mark WM (i.e., of its mark formation area), and the magnifications of the composite system of the first objective lens 507 and the lens system 511 and the projection optical system.

In the above description, the prism 512 has the rectangular window 512a at only the position conjugate with the window RW. However, in order to guide optical information from the reticle marks $RM_a$ and $RM_b$, in particular, only the 1st-order diffracted light components $DR_1$ and $DR_2$, to the reticle detection system, i.e., to prevent noise components (diffracted light components from the reticle pattern and the wafer mark, and the like) from being mixed in the reticle detection system, a light-shielding layer formed of, e.g., chromium may be formed on only partial regions conjugate with the radiation regions of the 1st-order diffracted light components $DR_1$ and $DR_2$, i.e., the reticle marks $RM_a$ and $RM_b$. At this time, the noise components can be incident on the wafer detection system, i.e., a photoelectric detector 520 together with the interference beam BTW from the wafer mark WM, and the like. However, in this embodiment, the noise components can be removed by the field stop 517 (and a spatial filter 519 to be described later).

Since the two wafer beams $LB_{w1}$ and $LB_{w2}$ are radiated onto the wafer mark WM at symmetrical incident angles $\theta_w$, the 0th-order diffracted light components $DW_1$ and $DW_2$ generated by these beams propagate along the optical paths of the two beams $LB_{w1}$ and $LB_{w2}$ in the opposite direction. The two 0th-order diffracted light components $DW_1$ and $DW_2$ also become collimated beams which pass through the prism 512 (opening 512a), and cross on the field stop 517 (plane $PW_3$). Since the interference beam BTW and the 0th-order diffracted light components $DW_1$ and $DW_2$ interfere with each other in the plane $PW_3$, the sectional shape of the crossing portion in the plane $PW_3$ is similar to the sectional shapes of the output beams $LB_{w1}$ and $LB_{w2}$ (i.e., the shape of the opening 504b of the field stop 504).

Furthermore, the interference beam BTW and the 0th-order diffracted light components $DW_1$ and $DW_2$ passing through the field stop 517 are incident on a lens system (Fourier transform lens) 518, and are focused into spots on the spatial filter 519 arranged in a rear-side focal plane (a Fourier transform plane conjugate with the focal plane Ep) $Ep_1$ of the lens system 518. The 0th-order diffracted light components $DW_1$ and $DW_2$ and noise components (diffracted light components from the reticle mark, which cannot be removed by the prism 512) are cut by the spatial filter 519, and only the interference beam BTW is received by the photoelectric detector 520. The photoelectric detector 520 generates a photoelectric signal corresponding to the interference beam BTW, and the photoelectric signal is output to the alignment signal processing system 214 (FIG. 5) as a sinusoidal AC signal according to a change period between bright and dark levels of the interference fringes, i.e., a beat signal $SD_w$ having a beat frequency equal to the frequency difference $\Delta f$.

The grating pitch $P_R$ of the reticle marks $RM_a$ and $RM_b$ irradiated with the beams $LB_{r1}$ and $LB_{r2}$ is determined as follows according to a crossing angle $2\theta_R$ of the beams $LB_{r1}$ and $LB_{r2}$ on the plane $PW_1$:

$$P_R = \frac{\lambda}{2 \cdot \sin\theta_R} = \frac{\lambda}{2M_{AL} \cdot \sin\theta_W} = \frac{P_W}{2M}$$

where $M_{AL}$ is the projection magnification of the projection optical system PL at an alignment wavelength $\lambda_1$.

Therefore, the 1st-order diffracted light components $DR_1$ and $DR_2$ respectively generated from the reticle marks $RM_a$ and $RM_b$ propagate along the optical paths of the output beams $LB_{r1}$ and $LB_{r2}$ in the opposite direction, and cross as collimated beams on a plane $PW_4$ via the first objective lens 507, the output/reception light splitting prism 506, the lens system 511, and the prism 512. The plane $PW_4$ is a plane conjugate with the rear-side focal plane of the lens system 511, i.e., the plane $PW_1$, and a transmission type monitor grating plate 513 is arranged in the plane $PW_4$. The sectional shape of the crossing portion of the 1st-order diffracted light components $DR_1$ and $DR_2$ in the plane $PW_4$ is substantially similar to the outer shape of the reticle marks $RM_a$ and $RM_b$.

The 1st-order diffracted light components $DR_1$ and $DR_2$ from the reticle marks $RM_a$ and $RM_b$ cross on the monitor grating plate 513, and form linear interference fringes thereon, which move in the pitch direction in correspondence with the frequency difference $\Delta f$ between the light components. In this embodiment, for the sake of simplicity, the magnification between the plane $PW_1$ and the monitor grating plate 513 is set to be an equal magnification (×1), and a grating pitch $P_{GR}$ of the monitor grating plate 513 is set to be $P_{GR}=2\times P_R$. The interference beam BTW and the 0th-order diffracted light components $DW_1$ and $DW_2$ from the wafer mark WM and the 1st-order diffracted light components $DR_1$ and $DR_2$ from the reticle marks $RM_a$ and $RM_b$ are separated by the prism 512, and are also spatially separated from each other in an image plane (e.g., the plane $PW_4$). For this reason, in this embodiment, the monitor grating plate 513 is arranged in the plane $PW_4$ according to the size and position of the interference fringes formed by the 1st-order diffracted light components $DR_1$ and $DR_2$.

As a result, when the 1st-order diffracted light components $DR_1$ and $DR_2$ are incident on the monitor grating plate 513, re-diffracted ±1st-order diffracted light components coaxially propagate from the monitor grating plate 513, and an interference beam BTR (collimated beam) of these diffracted light components is received by the photoelectric detector 516 via a lens system (Fourier transform lens) 514, and a spatial filter 515 arranged in a rear-side focal plane (conjugate with the focal plane Ep) $Ep_2$ of the lens system 514. The spatial filter 515 allows only the interference beam BTR to pass therethrough, and cuts other diffracted light components. A photoelectric signal (beat signal) $SD_R$, corresponding to the interference beam BTR, from the photoelectric detector 516 is output to the alignment signal processing system 214 as a sinusoidal AC signal according to a change period between bright and dark levels of the interference fringes.

As described above, the 1st-order diffracted light components $DR_1$ and $DR_2$ are radiated onto the monitor grating plate 513 via the prism 512. At this time, noise components, e.g., diffracted light components excluding those from the reticle pattern and the wafer mark WM, and those from the reticle marks $RM_a$ and $RM_b$, are also radiated onto the monitor grating plate 513. Thus, a diffraction grating having substantially the same shape and size as those of the outer shape of the reticle marks $RM_a$ and $RM_b$ is formed on the monitor grating plate 513 at a position almost conjugate with a crossing region of the 1st-order diffracted light components $DR_1$ and $DR_2$ in the plane $PW_1$. More specifically, the diffraction grating is preferably formed in only a region where the 1st-order diffracted light components $DR_1$ and $DR_2$ cross in the plane $PW_4$. In addition, it is also preferable to assure a wide interval between the reticle marks $RM_a$ and $RM_b$ and the window RW in the Y-direction (non-measurement direction), so that the interference beam BTW and the 0th-order diffracted light components $DW_1$ and $DW_2$ from the wafer mark WM and the 1st-order diffracted light components $DR_1$ and $DR_2$ from the reticle marks $RM_a$ and $RM_b$ are sufficiently separated from each other in the Y-direction on the prism 512. Thus, the optical information from the wafer mark WM and the optical information from the reticle marks $RM_a$ and $RM_b$ can be easily separated by the prism 512, and mixing of noise components to the reticle and wafer detection systems can be eliminated.

The signal processing system 214 shown in FIG. 5 detects a phase difference $\Phi_R$ between the reference signal $SR_r$ obtained from the reference signal generator (photoelectric detector 510R) and the beat signal $SD_R$ obtained from the reticle detection system (photoelectric detector 516), and a phase difference $\Phi_W$ between the reference signal $SR_w$ obtained from the photoelectric detector 510W and the beat signal $SD_W$ obtained from the wafer detection system (photoelectric detector 520), and outputs the two pieces of phase difference information to a central control system 216. These four signals $SR_r$, $SR_w$, $SD_R$, and $SD_W$ are beat frequencies corresponding to the frequency $\Delta f$. The phase difference $\Phi_R$ changes by $2\pi$ (one period) with respect to a position shift ½ the pitch $P_R$ of the reticle marks $RM_a$ and $RM_b$, and the phase difference $\Phi_W$ also changes by $2\pi$ with respect to a position shift ½ the pitch $P_W$ of the wafer mark WM. The central control system 216 detects the relative position shift between the reticle marks $RM_a$ and $RM_b$ and the wafer mark WM on the basis of the two pieces of phase difference information from the signal processing system 214 within a range of $\pm P_W/4$ of the grating pitch $P_W$, and one or both of a reticle stage RST and a wafer stage WST is controlled so that the position shift amount becomes almost zero.

In this embodiment, the monitor grating plate 513 is obliquely arranged, as shown in FIGS. 25 and 26. The reticle marks $RM_a$ and $RM_b$ must be set at arbitrary positions on the reticle 7 according to a change in pattern size and re-formation of a wafer mark, and the first objective lens 507 is moved above a dichroic mirror 6 in correspondence with the positions of the reticle marks $RM_a$ and $RM_b$. For this reason, the magnification of the alignment beam also changes in the composite system of the first objective lens 507 and the lens system 511 in correspondence with the change in position of the reticle marks $RM_a$ and $RM_b$. Therefore, the relationship (e.g., $P_{Gf}=P_{GR}/2$) between the grating pitch $P_{GR}$ of the monitor grating plate 513 and a pitch $P_{Gf}$ of interference fringes formed by the 1st-order diffracted light components $DR_1$ and $DR_2$ from the reticle marks $RM_a$ and $RM_b$ may be changed. Thus, the monitor grating plate 513 is arranged to be rotatable about a rotation axis perpendicular to the pitch direction in the plane of drawing of FIG. 25. When the monitor grating plate 513 is obliquely set, the grating pitch is apparently changed, so that the grating pitch of the monitor grating plate 513 and the pitch of the interference fringes can always have a predetermined relationship. With this arrangement, the pitch adjustment can be attained easier than a case wherein the first objective lens 507 and the lens system 511 are arranged as a zoom lens system, so that its focal length can be arbitrarily adjusted.

Furthermore, in this embodiment, the output/reception light splitting prism (beam splitter) 506 is arranged between the first and second objective lenses 507 and 505 to partially split the two pairs of output beams ($LB_{r1}$ and $LB_{r2}$) and ($LB_{w1}$ and $LB_{w2}$), and to guide the split light components to the reference signal generator (lens system 508). Furthermore, the 1st-order diffracted light components $DR_1$ and $DR_2$ from the reticle marks $RM_a$ and $RM_b$ are guided to the reticle detection system (monitor grating plate 513), and the interference beam BTW from the wafer mark WM is guided to the wafer detection system (photoelectric detector 520). As a result, the reference signal generator, the reticle detection system, and the wafer detection system can be arranged adjacent to each other, and can be integrally fixed on a single metal plate PT (indicated by a dotted line in FIG. 25; preferably formed of, e.g., invar) having a low thermal expansion coefficient. With this arrangement, in particular, since the monitor grating plate 513 and the reference grating plate 509 can operate in substantially the same manner even when they suffer from a thermal variation, the influence of the position shift due to the thermal variation can be canceled, and a decrease in alignment precision can be prevented.

In the above description, the reference signal generator, the reticle detection system, and the wafer detection system are integrally fixed on the metal plate PT. However, at least the monitor grating plate 513 and the reference grating plate 509 need only be fixed on the metal plate PT to obtain the same effect as in the above embodiment. In the reticle detection system, in place of detection of the interference beam BTR of the ±1st-diffracted light components re-diffracted by the monitor grating plate 513, the same arrangement as the reference signal generator may be employed, i.e., the grating pitch may be set to be equal to that of the interference fringes, and an interference beam between 0th-order diffracted light and 1st-order diffracted light may be photoelectrically detected. Then, the lens system 514 and the spatial filter 515 can be omitted, the distance between the monitor grating plate 513 and the photoelectric detector 516 can be shortened, and this system can be rendered compact. In addition, the three detection systems can be arranged more adjacent to each other, and the size of the metal plate PT can be reduced. The detection systems may also be rendered more compact by adjusting the magnification of the composite system of the first objective lens 507 and the lens system 508 or 511. When the optical paths of the two pairs of output beams ($LB_{r1}$ and $LB_{r2}$) and ($LB_{w1}$ and $LB_{w2}$) radiated onto the reference grating plate 509 and the two 1st-order diffracted light components $DR_1$ and $DR_2$ radiated onto the monitor grating plate 513 may be optically relayed using optical members such as mirrors, the reference grating plate 509 and the monitor grating plate 513 may be arranged very close to each other.

In the above arrangement, when the monitor grating plate 513 and the reference grating plate 509 are respectively shifted by $\Delta_{RMG}$ and $\Delta_{RG}$ in the pitch direction, a phase shift amount $\Delta\Phi_R$ of the beat signal $SD_R$ and a phase shift amount $\Delta\Phi_W$ of the beat signal $SD_W$ are expressed by the following equations on the basis of a position shift amount $\Delta_R$ of the reticle 7 and a position shift amount $\Delta_W$ of the wafer W:

$$\Delta\Phi_R = \frac{4\pi}{P_R} \times (\Delta_R - \Delta_{RMG} - \Delta_{RG})$$

$$\Delta\Phi_R = \frac{4\pi}{P_R} \times (\Delta_R - \Delta_{RG})$$

Therefore, the relative shift amount $\Delta$ between the reticle 7 and the wafer W is given by:

$$\Delta = \frac{\lambda \cdot M_{AL}}{4\pi\theta_R} \times \left(\Phi_W - \frac{\Phi_R}{2}\right) = \Delta_W - \frac{\Delta_R}{2} + \frac{\Delta_{RMG} - \Delta_{RG}}{2}$$

That is, an amount ½ the difference ($\Delta_{RMG}-\Delta_{RG}$) between the shift amounts of the monitor grating plate 513 and the reference grating plate 509 is undesirably included in the measurement result as a detection error component in the alignment system. In this embodiment, however, since the relative shift between the monitor grating plate 513 and the reference grating plate 509 is suppressed to a negligible level, the relative shift Mount between the reticle 7 and the wafer W can be detected with high stability and precision.

Figure 27:
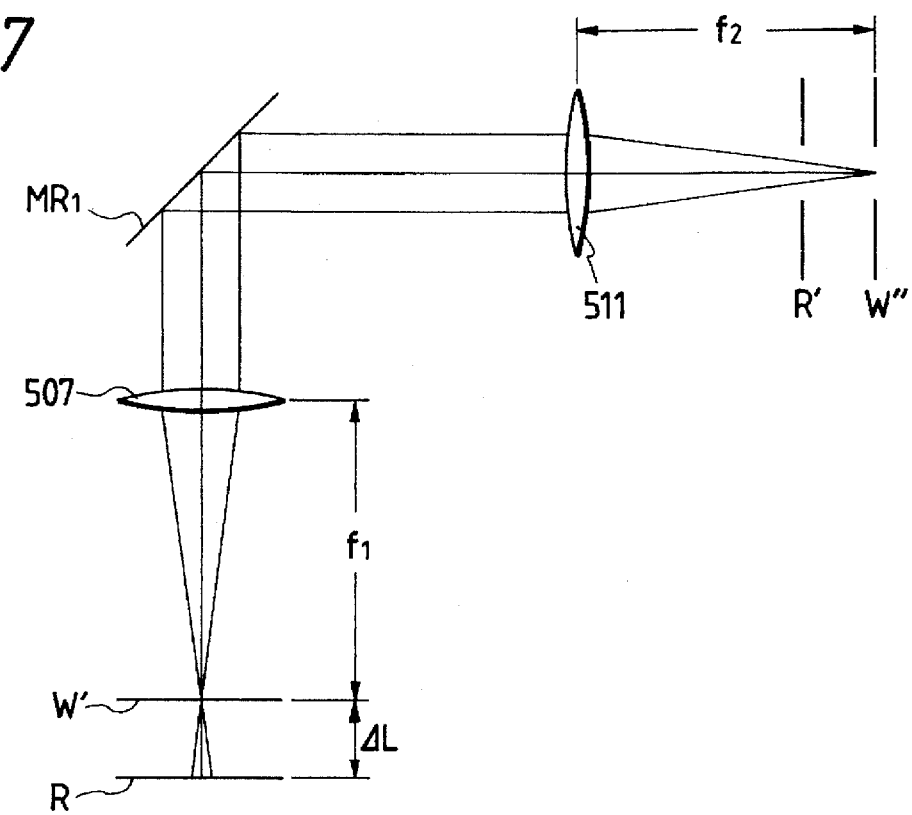
FIG. 27 is a chart for explaining a moving mechanism of the alignment system shown in FIG. 25.

Since the positions of the reticle marks are changed according to, e.g., the size of the reticle pattern, the observation position of the first objective lens 507 need be moved in correspondence with the mark positions. In FIGS. 25 and 26, for the sake of easy understanding, the alignment system is illustrated to extend above the reticle 7. However, in practice, as shown in FIG. 27, a return mirror $MR_1$ is arranged above the first objective lens 507, and a holding metal member (not shown), which is integrally fixed with the mirror $MR_1$ and the first objective lens 507, is movably arranged. Therefore, the observation position of the first objective lens 507 can be desirably changed along the radial line passing through the center of the reticle 7 at least on the reticle 7. Although the output/reception light splitting prism 506 is omitted from FIG. 27, the prism 506 is arranged in an optical path between the first objective lens 507 (mirror $MR_1$ in FIG. 27) and the second objective lens 511.

When the first objective lens 507 is moved, conjugate points (points conjugate with the wafer and reticle marks) are also moved. In this embodiment, the first objective lens 507 and the second objective lens (505 or 511) are arranged so that the detection-side focal point position (front-side focal point position) of the first objective lens 507 almost coincides with the reticle-side focal point position (rear-side focal point position) of the second objective lens 511. In addition, the focal lengths of the objective lenses 507 and 511, and the moving amount of the first objective lens 507 are limited. Thus, the observation position of the first objective lens 507 can be moved with a simple arrangement without using an optical system (e.g., a trombone optical system) for correcting the optical path length. In this case, no problem is posed in a practical use. The above-mentioned arrangement will be described in more detail below with reference to FIGS. 27 to 29.

In general, when the focal lengths of the first and second objective lenses are represented by $f_1$ and $f_2$, when the distance between the principal planes of the first and second objective lenses is given by $(f_1+f_2+e)$, and an object is located at a position farther by $\Delta$ than the focal point position of the first objective lens, the position of an image becomes closer to the focal point position of the second lens by a distance $\delta$ given by:

$$\delta = f_2^2 \cdot \Delta/(e \cdot \Delta - f_1^2) \quad (4)$$

In this embodiment, the prism 512 and the field stop 517 are respectively arranged at a position conjugate with the reticle 7 and a position conjugate with the wafer W, as shown in FIG. 25. In this case, if the moving amounts of the reticle and wafer conjugate positions upon movement of the first objective lens 507 (i.e., upon a change in e in equation (4)) fall within the focal depth of the second objective lens, no special optical path length correction optical system (e.g., a trombone optical system) is required.

In the alignment system shown in FIGS. 25 and 26, the first objective lens 507 causes the two pairs of output beams ($LB_{r1}$ and $LB_{r2}$) and ($LB_{w1}$ and $LB_{w2}$) to cross at the wafer conjugate position (the plane $PW_1$ in FIG. 25). For this reason, at the object side of the first objective lens 507, the position of the reticle 7 (pattern surface R) and the wafer conjugate position are separated by a distance $\Delta L$ corresponding to an axial chromatic aberration amount of the projection optical system PL between exposure light and alignment light. Thus, a method of relaying a reticle image and a wafer conjugate image using the movable first objective lens 507 and the stationary second objective lens 511 without using a special optical path length correction optical system will be described below.

As a first example (FIG. 27), the distance between the first and second objective lenses 507 and 511 is changed while maintaining a state wherein a wafer conjugate plane W' coincides with the rear-side focal point position of the first objective lens 507, thus allowing movement of the first objective lens 507. In FIG. 27, the first objective lens 507 is moved almost parallel to the reticle surface R in a state wherein the first objective lens 507 and the mirror $MR_1$ are integrally fixed in position.

In this arrangement, when the distance between the principal planes of the first and second objective lenses 507 and 511 is expressed as the sum $(f_1+f_2+e)$ of the focal lengths $f_1$ and $f_2$ of the first and second objective lenses 507 and 511 and the change e in distance between the lenses, the wafer conjugate position corresponds to a focal point position W" of the second objective lens 511. Furthermore, the reticle conjugate position is located at a position R' closer to the reticle side by $f_2^2 \cdot \Delta L/(f_1^2 - e \cdot \Delta L)$ than the focal point position of the second objective lens 511. More specifically, upon movement of the first objective lens 507, the wafer conjugate position W" is left unchanged, and the reticle conjugate position R' is moved.

Thus, when the focal depth of an image by the second objective lens 511 is represented by $D_2$, the movable range of the first objective lens 507 is expressed by the following inequality of the change e in distance between the lenses:

$$-\frac{(f_1^4/f_2^2)D_2}{\Delta L(\Delta L - (f_1^2/f_2^2)D_2)} \leq e \leq \frac{(f_1^4/f_2^2)D_2}{\Delta L(\Delta L - (f_1^2/f_2^2)D_2)} \quad (5)$$

If the focal lengths $f_1$ and $f_2$ of the first and second objective lenses 507 and 511 are respectively 200 mm and 240 mm, the axial chromatic aberration amount $\Delta L$ of the projection optical system PL is 40 mm, and the focal depth $D_2$ is set within a range capable of resolving the grating at a pitch of 6 μm, e.g., about 1 mm, the movable range (change e) of the first objective lens 507 can be set to be a relatively wide range between −17.67 mm and +17.06 mm.

Figure 28:
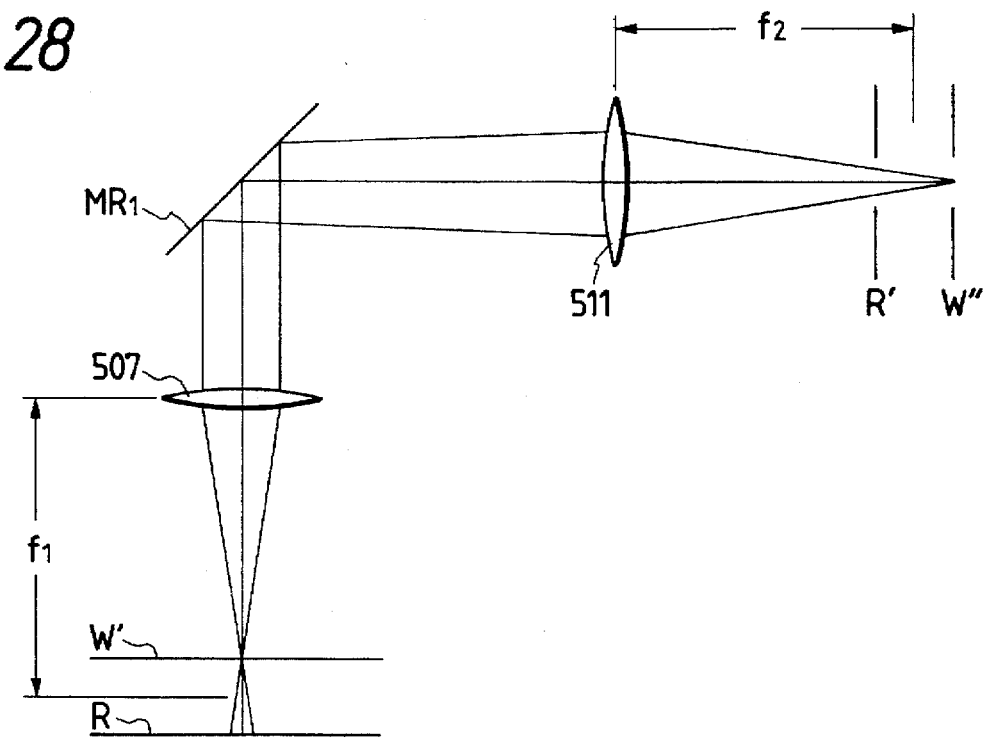
FIG. 28 is a chart for explaining another moving mechanism of the alignment system shown in FIG. 25.

In order to further widen the movable range of the first objective lens 507, as shown in FIG. 28, the focal plane of the first objective lens 507 is set between the reticle (pattern surface R) and the wafer conjugate surface W'. With this arrangement, the reticle conjugate position R' and the wafer conjugate position W" relayed by the first and second objective lenses 507 and 511 are shifted upon movement of the first objective lens 507. More specifically, the reticle conjugate position R' and the wafer conjugate position W" can be set at positions given by the following formulas with respect to the rear-side focal point position of the second objective lens 511:

$$R': -f_2^2(\Delta L/2)/[f_1^2 - e(\Delta L/2)]$$

$$W": f_2^2(\Delta L/2)/[f_1^2 - e(\Delta L/2)]$$

When the reticle conjugate position R' and the wafer conjugate position W" are set to fall within the range of the focal depth $D_2$ of an image by the second objective lens 511 upon movement of the first objective lens 507, the movable range (moving amount) e of the first objective lens 507 is limited like the following inequality:

$$-\frac{(f_1^4/f_2^2)D_2}{\frac{\Delta L}{2}\left[\frac{\Delta L}{2} + \frac{f_1^2}{f_2^2}D_2\right]} \leq e \leq \frac{(f_1^4/f_2^2)D_2}{\frac{\Delta L}{2}\left[\frac{\Delta L}{2} + \frac{f_1^2}{f_2^2}D_2\right]}$$

Like in the system shown in FIG. 27, if the focal lengths $f_1$ and $f_2$ of the first and second objective lenses 507 and 511 are respectively 200 mm and 240 mm, the axial chromatic aberration amount ΔL of the projection optical system PL is 40 mm, and the focal depth $D_2$ is 1 mm, the movable range (change e) of the first objective lens 507 can be set to be a relatively wide range between −67.11 mm and +67.11 mm.

Figure 29:
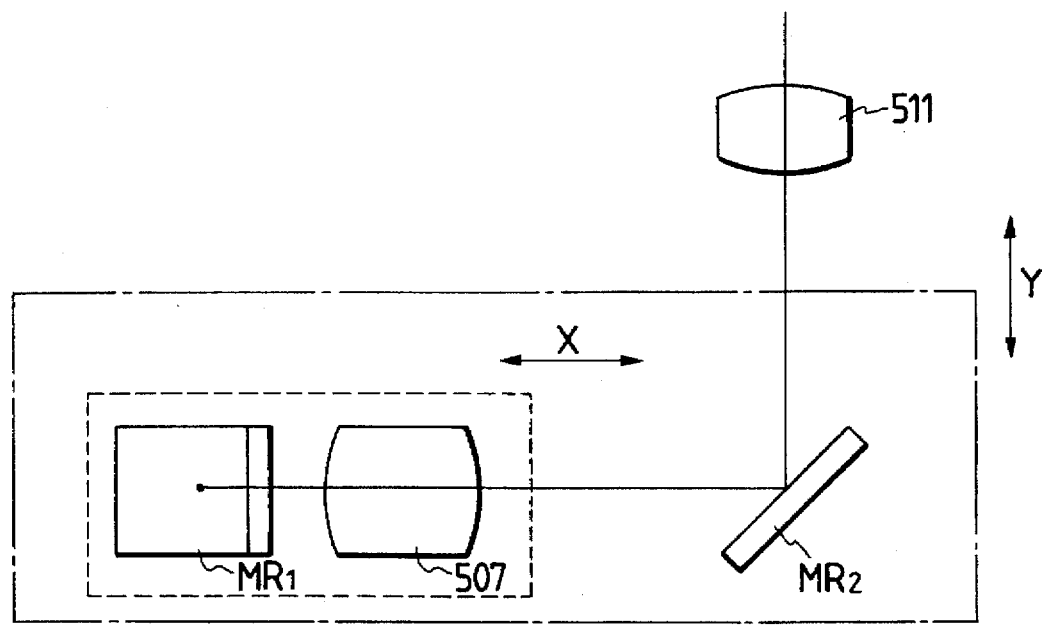
FIG. 29 is a chart for explaining still another moving mechanism of the alignment system shown in FIG. 25.
Figure 29:
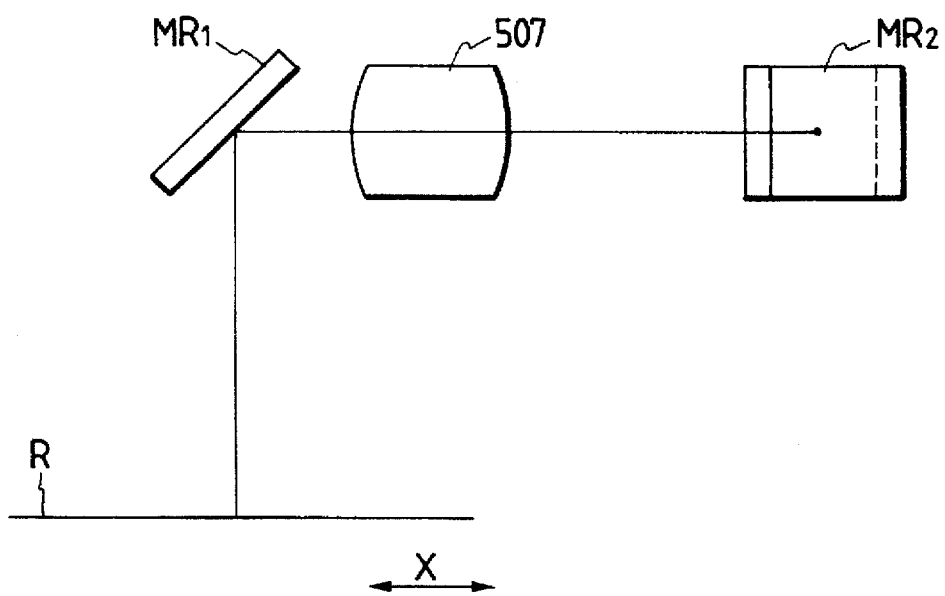
Figure 30:
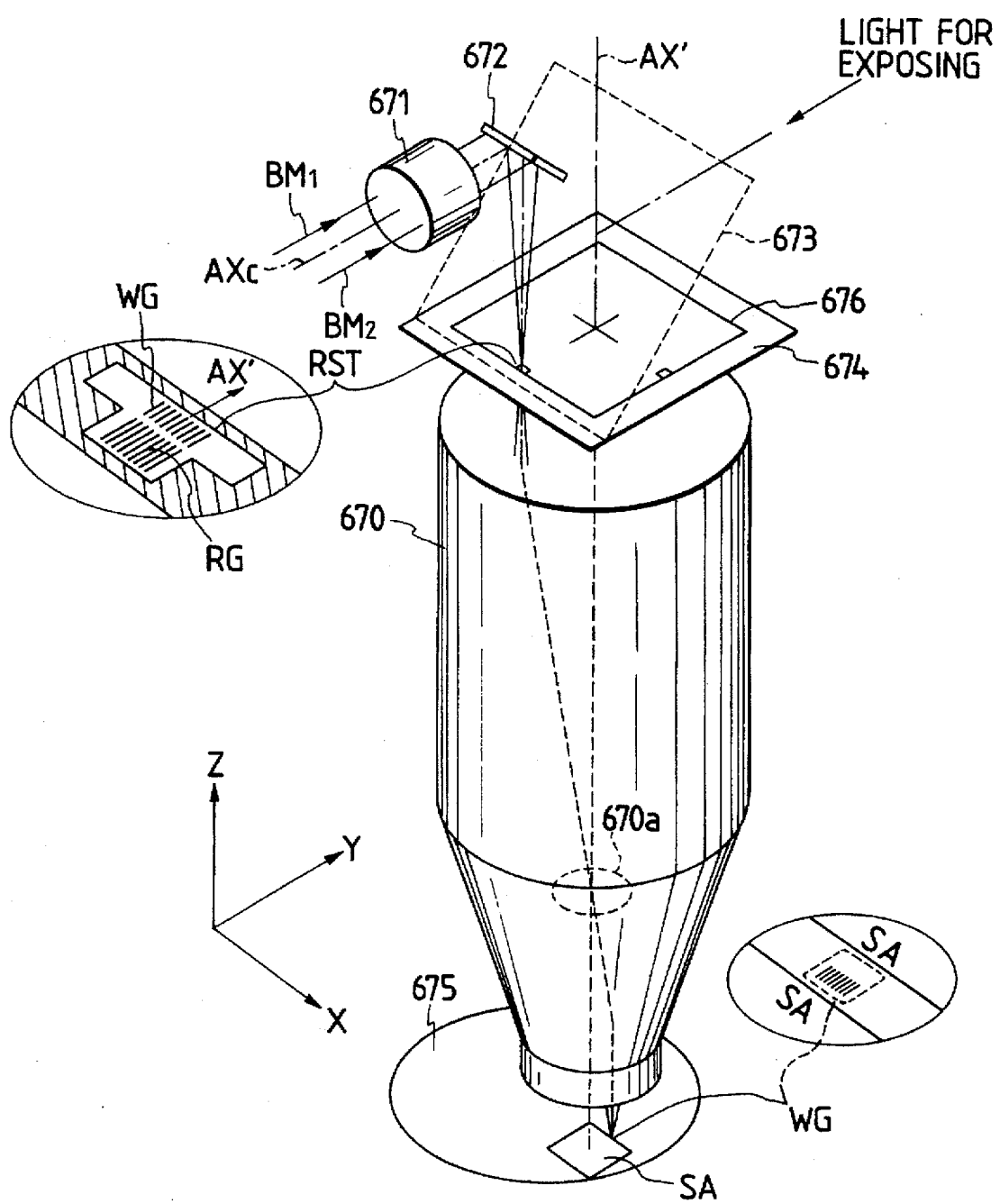
FIG. 30 is a perspective view showing the arrangement of a conventional projection exposure apparatus.
Figure 32:
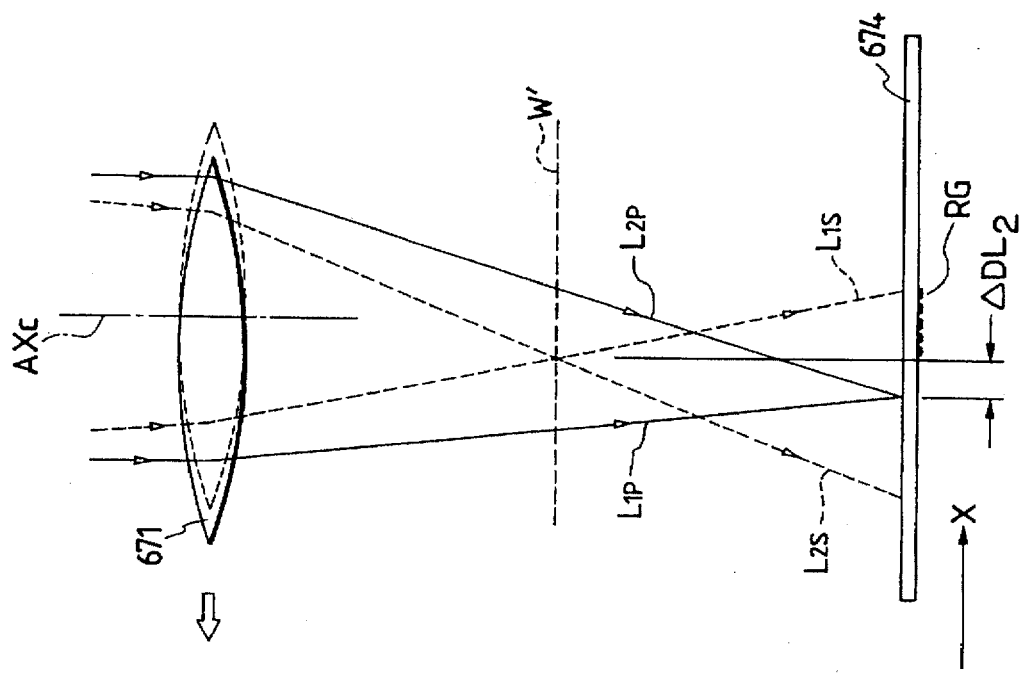
FIG. 32 is a chart for explaining the problems of the conventional apparatus.
Figure 31:
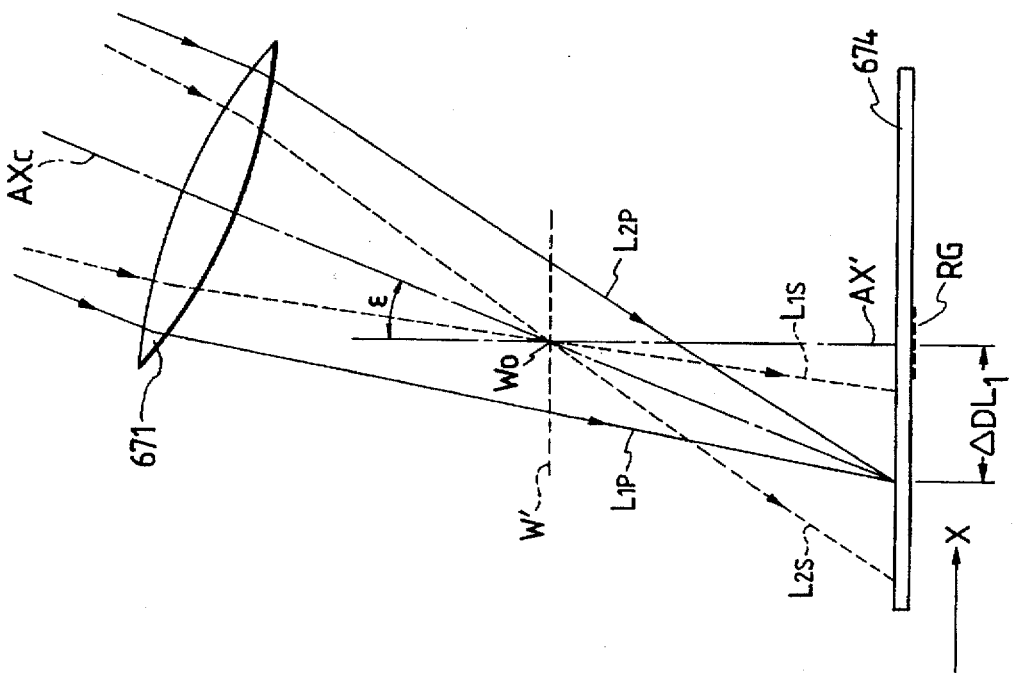
FIG. 31 is a chart for explaining the problems of the conventional apparatus.

Furthermore, when a mirror $MR_2$ is added in a relay system between the first and second objective lenses 507 and 511, as shown in FIG. 29, the alignment system (first objective lens 507) is two-dimensionally movable on the reticle 7. In FIG. 29, upon movement in the X-direction (a direction to move the first objective lens 507 according to, e.g., a change in size of the reticle pattern, and in a direction toward the center of the reticle), the mirror $MR_1$ and the first objective lens 507 are moved while being integrally fixed to a holding metal member (corresponding to a portion surrounded by a dotted line in FIG. 29). Upon movement in the Y-direction (a direction to move the first objective lens 507 according to, e.g., re-formation of a wafer mark, and in a direction along the pattern region of the reticle), the mirror $MR_2$ can be moved while being integrally fixed to the holding metal member (corresponding to a portion surrounded by a dotted line in FIG. 29) in addition to the mirror $MR_1$ and the first objective lens 507. The moving amounts of the first objective lens 507 in the X- and Y-directions are determined by the same method as described above. In FIG. 29, the first objective lens 507 may be arranged between the mirror $MR_1$ and the reticle 7.

The moving mechanism of the alignment system (first objective lens 507) has been described with reference to FIGS. 27 to 29. When the first objective lens 507 (movable) and the second objective lens 505 (stationary) shown in FIG. 25 are arranged in the same manner as the above-mentioned relay system, and its movable range is determined, the conjugate relationship will not be disturbed even when the first objective lens 507 is moved on the reticle 7. Note that the movable range (moving amount) of the first objective lens 507 is determined by ranges defined by the beam receiving system (lens system 511) and a beam output system (second objective lens 505).

The operation (alignment sequence) of the apparatus according to this embodiment will be briefly described below. In the stepper shown in FIG. 25, alignment of the reticle 7 is performed using a reticle alignment system (not shown) to align the reticle 7 with respect to the apparatus with predetermined precision. Thereafter, the reticle 7 is chucked on the reticle stage RST by vacuum suction. Thereafter, the first objective lens 507 is moved until the optical axis $AX_a$ of the first objective lens 507 is located at substantially the center between the reticle marks $RM_a$ and $RM_b$ and the window RW in the Y-direction, and is located at substantially the center between the reticle marks $RM_a$ and $RM_b$ in the X-direction, thereby adjusting the observation position of the alignment system. Then, the wafer stage WST is stepped, so that the center of one shot area on the wafer W substantially coincides with the center of the reticle 7. At this time, if global alignment of the wafer W is correctly attained by an off-axis alignment system (not shown), a position shift between the reticle and the wafer is about ±1 μm on the wafer W. Therefore, the wafer mark WM on the wafer W reaches a position where it can be observed through the window RW of the reticle 7. More specifically, the wafer mark WM (pitch $P_W$=2 μm) can always be aligned with the beams $LB_{w1}$ and $LB_{w2}$ within a range of $±P_W/4$.

Then, alignment between the reticle 7 and the wafer W is executed by the alignment system. When the beams $LB_{r1}$ and $LB_{r2}$ are radiated onto the reticle 7, the 1st-order diffracted light components $DR_1$ and $DR_2$ generated from the reticle marks $RM_a$ and $RM_b$ are incident on the monitor grating plate 513, and the photoelectric detector 516 receives the interference beam BTR re-diffracted by the monitor grating plate 513 and outputs the beat signal $SD_R$ to the signal processing system 214. The signal processing system 214 calculates and stores the phase difference $\Phi_R$ from the reference signal $SR_r$ from the photoelectric detector 510R. At this time, the shift amount $\Delta X_R$ of the reticle 7 is calculated from the following equation:

$$\Delta X_R = \frac{P_R}{2} \cdot \frac{\Phi_R}{2\pi}$$

On the other hand, when the beams $LB_{w1}$ and $LB_{w2}$ are radiated onto the wafer mark WM, the photoelectric detector 520 extracts and receives only the interference beam BTW, and outputs the photoelectric signal $SD_W$ to the signal processing system 214. The signal processing system 214 calculates and stores the phase difference $\Phi_W$ from the reference signal $SR_W$. At this time, the shift amount $\Delta X_W$ of the wafer W is calculated from the following equation:

$$\Delta X_W = \frac{P_W}{2} \cdot \frac{\Phi_W}{2\pi}$$

Thereafter, the central control system 216 calculates the relative position shift amount ΔX between the reticle 7 and the wafer W from the following equation on the basis of the phase differences $\Phi_R$ and $\Phi_W$ calculated in advance:

$$\Delta X = \Delta X_W - M_{AL} \cdot \Delta X_R = \frac{\lambda \cdot M_{AL}}{4\pi\theta_R} (\Phi_W - \Phi_R/2)$$

Furthermore, the central control system 216 finely moves the reticle stage RST or the wafer stage WST using a stage control system 200 or 204, so that the shift amount ΔX becomes a constant value or zero, thereby precisely causing the projection image of the reticle pattern on a shot area. As a result, in this embodiment, even when the entire alignment system is inclined upon movement of the first objective lens 507, no alignment error occurs, and very high-precision alignment can be attained. At this time, when the shift amount ΔX falls within a predetermined allowable range (e.g., ±0.10 μm), exposure light IL from an exposure illumination system 208 is radiated onto the reticle 7.

In this embodiment, since the dichroic mirror 6 is arranged, the shift amount ΔX between the reticle 7 and the wafer W (shot area) can always be detected even during an exposure operation. Therefore, the reticle stage RST or the wafer stage WST can be feedback-controlled, so that the shift amount ΔX falls within an allowable range, thereby preventing an image blur caused by an unnecessary vibration, which may occur during the exposure operation. In the reticle detection system, the pitch of the interference fringes formed by the 1st-order diffracted light components $DR_1$ and $DR_2$ may be set to be equal to the grating pitch of the monitor grating plate 513 to obtain the beat signal $SD_R$ by the same method as in the reference signal generator.

As described above, according to this embodiment, the two pairs of output beams ($LB_{r1}$ and $LB_{r2}$) and ($LB_{w1}$ and $LB_{w2}$) are respectively radiated onto the reticle marks $RM_a$ and $RM_b$ and the wafer mark WM. However, when two output beams enlarged in the Y-direction (non-measurement direction) on the reticle 7 are radiated, diffracted light components ($DR_1$ and $DR_2$, and the interference beam BTW) from the reticle marks $RM_a$ and $RM_b$ and the wafer mark WM can be obtained by only the two output beams like in the above embodiment. In this embodiment, the two output beams $LB_{w1}$ and $LB_{w2}$ cross on the wafer W. However, the beams may be radiated, so that the two output beams $LB_{r1}$ and $LB_{r2}$ for the reticle cross on the reticle 7, and the two output beams $LB_{w1}$ and $LB_{w2}$ for the wafer are separated on the wafer W.

Furthermore, in this embodiment, the grating pitch $P_R$ of the reticle marks $RM_a$ and $RM_b$ is determined, so that the 1st-order diffracted light components $DR_1$ and $DR_2$ return coaxially with the principal rays of the two output beams $LB_{r1}$ and $LB_{r2}$. However, diffracted light components other than the 1st-order diffracted light components may be used as long as they return coaxially with the principal rays of the two output beams $LB_{r1}$ and $LB_{r2}$. For example, when the grating pitch $P_R$ is set to be $P_R=\lambda/\sin\theta_R$, and the duty ratio of the reticle marks $RM_a$ and $RM_b$ is changed, 2nd-order diffracted light components are generated coaxially with the principal rays of the two output beams $LB_{r1}$ and $LB_{r2}$. Thus, the beat signal $SD_R$ may be obtained using these 2nd-order diffracted light components. That is, diffracted light components of a predetermined order need only cross in the plane $PW_1$ (wafer conjugate plane).

In the above embodiment, the diffraction gratings are formed on the reference grating plate 509 and the monitor grating plate 513. However, Wollaston prisms may be arranged in place of the reference grating plate 509 and the monitor grating plate 513, and the polarization state of two beams incident on each Wollaston prism may be converted into an orthogonal state using, e.g., a halfwave plate. In addition, two diffracted light components emerging from each Wollaston prism in the same direction may be caused to interfere with each other using a detector, and the interference light may be received by a photoelectric detector. In this case, the radiation amount can be advantageously increased.

Furthermore, in the above embodiment, the prism 512 allows optical information from the wafer mark WM to be transmitted therethrough, and reflects optical information from the reticle marks $RM_a$ and $RM_b$. However, the prism 512 may perform operations opposite to those described above. In this case, only a portion of the prism 512 corresponding to the rectangular opening 512a may be replaced with a light-shielding portion. Alternatively, the right half portion (in the plane of drawing in FIG. 25) of the prism 512 may be formed as a transmission portion, and the left half portion thereof may be formed as a light-shielding portion.

Since the surface (reflection surface), formed with the rectangular opening 512a, of the prism 512 is inclined with respect to the optical axis of the alignment system, the reflection surface is not perfectly conjugate with the pattern surface of the reticle 7 in a strict sense. However, since diffracted light components (collimated light components) from the reticle marks $RM_a$ and $RM_b$ and the wafer mark WM have large focal depths (beam waists), this fact does not adversely influence the alignment precision in practice. When mixing of noise components to the reticle detection system is completely removed, the size (area) of the diffraction grating on, e.g., the monitor grating plate 513 may be set to be smaller than a crossing region (interference fringe formation region) of the 1st-order diffracted light components $DR_1$ and $DR_2$ in the plane $PW_4$. In this case, a field stop may be arranged very close to the monitor grating plate 513.

In the above embodiment, optical information from the wafer mark WM or the reticle marks $RM_a$ and $RM_b$ is guided to the wafer detection system or the reticle detection system via the output/reception light splitting prism 506. However, two beam splitters (half mirrors) may be arranged in the optical paths of the alignment beams, so that optical information from the corresponding marks is independently guided to the wafer detection system or the reticle detection system. In this case, field stops may be arranged at positions respectively conjugate with the reticle and the wafer.

Furthermore, the crossing angles of each of the two pairs of output beams ($LB_{r1}$ and $LB_{r2}$) and ($LB_{w1}$ and $LB_{w2}$) may be independently set using parallel plates (halving). For example, when the observation position of the first objective lens 507 is changed, in particular, the magnification of the two wafer beams $LB_{w1}$ and $LB_{w2}$ by the projection optical system changes depending on the observation position. However, with the above arrangement, only the crossing angle $2\theta_w$ of the two beams $LB_{w1}$ and $LB_{w2}$ can be finely adjusted according to a change in magnification.

In the above embodiment, the output/reception light splitting prism 506 is preferably arranged very close to the first objective lens, and in this case, a decrease in alignment precision caused by air fluctuation can be completely removed. Furthermore, in the above embodiment, an alignment apparatus (alignment system) is applied to an exposure apparatus comprising a projection optical system (a refraction optical system, a reflection optical system, or a combination thereof). The present invention may be applied to a proximity exposure apparatus, and the same effects as described above may be expected in this case.

Furthermore, in the above embodiment, since alignment beams in a wavelength range different from that of exposure light IL are used, an axial chromatic aberration (aberration amount $\Delta L$) and a chromatic aberration of magnification are generated in the projection optical system at the alignment wavelength. In particular, when the first objective lens 507 is moved, these chromatic aberrations change depending on the position of the lens 507. For this reason, the glass plate GP (FIG. 19) for controlling the two chromatic aberration amounts is preferably arranged near the pupil plane FP of the projection optical system PL, so that the two chromatic aberration amounts always fall within a predetermined range.

Note that this embodiment is not limited to a heterodyne alignment system but may be applied to a homodyne system, and also to a system wherein no interference fringes are formed on grating marks using two beams having different polarization components, p-and s-polarized beams returned from the grating marks are converted into interference light using a detector (birefringence plate), and the interference light is photoelectrically detected. In this case, the same effects as in this embodiment can be expected.

What is claimed is:

1. An alignment apparatus for an exposure apparatus which includes a projection optical system for focusing and projecting a pattern image on a mask onto a photosensitive substrate under exposure light, comprising:

a beam radiation system for radiating two first beams onto a diffraction grating-like mask mark formed on said mask, and radiating two second beams which are discrete from the first beams on an incident side of said mask, onto a diffraction grating-like substrate mark formed on said photosensitive substrate;

said mask having a region transparent to the two second beams at an adjacent position in a direction perpendicular to a grating period direction of said mask mark or a position neighboring said mask mark;

said beam radiation system including:

a first beam output system for forming the two first beams, which cross at a predetermined angle, so as to radiate said mask mark, a second beam output system for forming the two second beams, which cross at a predetermined angle, so as to radiate said substrate mark through the transparent region of said mask, and an objective optical system for receiving the two first beams and the two second beams, and outputting the two first beams and the two second beams, so that radiation regions of the first and second beams are separated from each other on said mask;

a photoelectric detecting device for receiving diffracted light components of the first beams from said mask mark and receiving diffracted light components of the second beams from said substrate mark and transmitted through said projection optical system, and for outputting photoelectric signals according to intensities of the diffracted light components; and means for detecting a relative position shift between said mask and said photosensitive substrate on the basis of the photoelectric signals.

2. An apparatus according to claim 1, wherein said beam radiation system includes a laser light source for outputting a beam, a first splitter for splitting the beam output from said laser light source into two intermediate beams, and a second splitter for splitting each of the two intermediate beams while maintaining a beam output condition to form said two first beams and said two second beams.

3. An apparatus according to claim 2, wherein said beam radiation system includes a frequency shifter, arranged in an optical path between said first and second splitters, for giving a predetermined frequency difference to the two intermediate beams, and amplitude-modulates an interference light intensity by the diffracted light components from said substrate mark and an interference light intensity by the diffracted light components from the mask mark received by said photoelectric detecting device at a frequency corresponding to the predetermined frequency difference.

4. An apparatus according to claim 1, wherein said beam radiation system includes a laser light source for outputting a beam, a beam splitter for splitting the beam from said laser light source into two intermediate beams to be output to said first and second beam output systems, and a frequency shifter, provided to at least one of said first and second beam output systems, for giving a frequency difference to the two intermediate beams, and gives the frequency difference between the diffracted light components from said mask mark and the diffracted light components from said substrate mark.

5. An apparatus according to claim 1, wherein said beam radiation system includes a laser light source for outputting a beam, and a first splitter for splitting the beam from said laser light source into beams to be output to said first and second beam output systems, said first beam output system includes a second splitter for obtaining the two first beams, and a first frequency shifter for giving a frequency difference Δfr between the two first beams, said second beam output system includes a third splitter for obtaining the two second beams, and a second frequency shifter for giving a frequency difference Δfw different from the frequency difference Δfr between the two second beams, and said beam radiation system also includes a driving circuit for driving said first and second frequency shifters so as to give a frequency difference ΔFc different from the frequency differences Δfr and Δfw between an average frequency of the two first beams and an average frequency of the two second beams.

6. An apparatus according to claim 1, wherein said beam radiation system includes a light source of the two first beams and the two second beams in a wavelength range different from that of the exposure light, and also includes a deflector, arranged in or near a Fourier transform plane in said projection optical system with respect to the pattern on said mask, for deflecting the two second beams propagating toward said substrate mark by a predetermined amount.

7. An apparatus according to claim 6, wherein said deflector includes a first diffraction grating for diffracting the two second beams propagating toward said substrate mark by the predetermined amount, and a second diffraction grating for diffracting the diffracted light components generated from said substrate mark by the predetermined amount.

8. An alignment apparatus for an exposure apparatus for transferring a pattern on a mask onto a photosensitive substrate, comprising:

a beam radiation system for radiating two first beams unto a diffraction grating-like mask mark formed on said mask, and radiating two second beams, which are discrete from the first beams on an incident side of said mask, onto a diffraction grating-like substrate mark formed on said photosensitive substrate;

said mask having a region transparent to the two second beams at an adjacent position in a direction perpendicular to a grating period direction of said mask mark or a position neighboring said mask mark;

said beam radiation system including:
  a first beam output system for forming the two first beams, which cross at a predetermined angle, so as to radiate said mask mark,
  a second beam output system for forming the two second beams, which cross at a predetermined angle, so as to radiate said substrate mark through the transparent region of said mask, and
  an objective optical system for receiving the two first beams and the two second beams, and outputting the two first beams and the two second beams, so that radiation regions of the first and second beams are separated from each other on said mask; and
  a photoelectric detecting device for receiving diffracted light components of the first beams from said mask mark and receiving diffracted light components of the second beams from said substrate mark and transmitted through said projection optical system, and for outputting photoelectric signals according to intensities of the diffracted light components.

9. An apparatus according to claim 8, wherein said beam radiation system includes a first divider which divides a beam from a first light source into two beams and guides said divided two beams to said first beam output system, and a second divider which divides a light beam from a second light source, which is different from said first light source, into two additional beams and guides said divided two additional beams to said second beam outputting system.

10. An apparatus according to claim 9, wherein said first and second light sources emit light beams having central wavelengths that differ from each other.

11. An apparatus according to claim 9, wherein said beam radiation system includes a first frequency shifter which produces a predetermined frequency difference between said two first beams and a second frequency shifter which produces a frequency difference between said two second beams that differs from said predetermined frequency difference.

12. An alignment apparatus for an exposure apparatus which includes a projection optical system for focusing and projecting a pattern image on a mask onto a photosensitive substrate under exposure light, comprising:

- a beam radiation system for radiating two beams in a wavelength range different from that of the exposure light onto a diffraction grating-like mask mark formed on said mask, and a diffraction grating-like substrate mark formed on said photosensitive substrate at symmetrical angles;
- said beam radiation system including an objective optical system for receiving the two beams, and outputting the two beams so that the two beams cross on said substrate mark;
- a first photoelectric detector disposed for receiving diffracted light components generated from said substrate mark in substantially the same direction;
- a diffraction grating-like first mark arranged in or adjacent to a plane conjugate with said substrate mark such that diffracted light components generated from said mask mark are radiated onto said first mark through said objective optical system;
- a second photoelectric detector disposed for receiving diffracted light components generated from said first mark in substantially the same direction;
- a holding member for holding, integrally with said first mark, a diffraction grating-like second mark arranged to have a predetermined positional relationship with said first mark;
- an optical member for dividing a part of the two beams and guiding it to said second mark;
- a third photoelectric detector disposed for receiving diffracted light components generated from said second mark in substantially the same direction; and
- a detection device connected to said first, second, and third photoelectric detectors for outputting a detection signal corresponding to a relative displacement between said mask and said photosensitive substrate based on signals from said first, second, and third photoelectric detectors.

13. An alignment apparatus comprising:

- a beam radiation system for radiating two first beams onto a diffraction grating-like first mark formed on a first substrate and two second beams, which are discrete from the first beams on an incident side of said first substrate, onto a diffraction grating-like second mark formed on a second substrate;
- said first substrate having a region transparent to the second beams at an adjacent position in a direction perpendicular to a grating period direction of said first mark or a position neighboring said first mark;
- said beam radiation system including:
  - a first beam output system for forming the two first beams, which cross at a predetermined angle, so as to radiate said first mark,
  - a second beam output system for forming the two second beams, which cross at a predetermined angle, so as to radiate said second mark through the transparent region of said first substrate, and
  - an objective optical system for receiving the two first beams and the two second beams, and outputting the two first beams and the two second beams, so that radiation regions of the first and second beams are separated from each other on said first substrate; and
- a photoelectric detecting device for receiving diffracted light components from said first mark and diffracted light components from said second mark, and outputting photoelectric signals according to intensities of the diffracted light components.

14. An alignment apparatus for an exposure apparatus which transfers a pattern of a mask onto a photosensitive substrate, comprising:

- a beam radiation system for radiating two first beams onto a mask mark formed on said mask, and radiating two second beams, which are discrete from the first beams on an incident side of said mask, onto a substrate mark formed on said photosensitive substrate;
- said beam radiation system including:
  - a beam output system for forming said two first beams, which radiate said mask mark at separate positions, and for forming said two second beams, which pass through a transparent region of said mask and cross on said substrate mark, and
  - an objective optical system for receiving said two first beams and said two second beams, and outputting the two first beams and the two second beams so that radiation regions of the first and second beams are separated from each other on said mask;
- a first photoelectric detector disposed for receiving diffracted light generated from said substrate mark;
- a member for holding integrally a first grating and a second grating, the first grating being disposed in a plane substantially conjugate with said photosensitive substrate to be irradiated by diffracted light generated from said mask mark and passing through said objective optical system, the second grating being disposed to be irradiated by light split from said two first beams and said two second beams by a beam splitter within said beam radiation system;
- a second photoelectric detector disposed for receiving diffracted light generated from said first grating; and
- a third photoelectric detector for receiving diffracted light generated from said second grating.

15. An alignment apparatus for an exposure apparatus which exposes a photosensitive substrate with a pattern of a mask comprising:

- a beam radiation system for radiating plural sets of two crossing light beams onto a grating mark formed on said photosensitive substrate, a crossing angle of the respective light beams differing from set to set, and generating diffracted light components from said grating mark in substantially the same direction by each set of light beams;
- a photoelectric detecting device for receiving said diffracted light components of each set of light beams; and
- a device which moves said photosensitive substrate based on an output from said photoelectric detecting device so that said photosensitive substrate and said mask are aligned.

16. An apparatus according to claim 15, wherein said beam radiation system includes a light source for making a frequency difference of the two light beams of each set different from set to set.

17. An apparatus according to claim 15, wherein said beam radiation system includes, for each set of light beams, a frequency shifter which gives a predetermined frequency difference between the two light beams of that set.

18. An apparatus according to claim 15, wherein said exposure apparatus includes a projection optical system for projecting an image of the pattern of said mask onto said photosensitive substrate, and said beam radiation system radiates the respective light beams of each set onto said grating mark through said projection optical system.

* * * * *